US012568703B2

(12) United States Patent　　　(10) Patent No.:　US 12,568,703 B2

Ito et al.　　　　　　　　　　　　(45) Date of Patent:　　Mar. 3, 2026

(54) SOLID-STATE IMAGING DEVICE AND ELECTRONIC DEVICE FOR ENHANCED COLOR REPRODUCIBILITY OF IMAGES

(71) Applicant: SONY SEMICONDUCTOR SOLUTIONS CORPORATION, Kanagawa (JP)

(72) Inventors: Mikinori Ito, Kanagawa (JP); Yuta Nakamoto, Kanagawa (JP); Tomomi Okano, Tokyo (JP); Yuya Kitabayashi, Kanagawa (JP); Takashi Tanaka, Kanagawa (JP); Tomoyuki Arai, Kanagawa (JP); Natsuko Ootani, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/958,854

(22) Filed: Oct. 3, 2022

(65) Prior Publication Data

US 2023/0034691 A1　　Feb. 2, 2023

Related U.S. Application Data

(63) Continuation of application No. 16/763,927, filed as application No. PCT/JP2018/047397 on Dec. 21, 2018, now Pat. No. 11,508,767.

(Continued)

(51) Int. Cl.
　　 *H10F 39/00*　　　(2025.01)
　　 *H10F 39/18*　　　(2025.01)
(52) U.S. Cl.
　　 CPC ....... *H10F 39/8053* (2025.01); *H10F 39/182* (2025.01); *H10F 39/802* (2025.01); *H10F 39/8057* (2025.01); *H10F 39/8063* (2025.01)

(58) Field of Classification Search
　　 CPC ......... H01L 27/14621; H01L 27/14603; H01L 27/14627; H01L 27/14645;

(Continued)

(56) References Cited

U.S. PATENT DOCUMENTS 11,508,767 B2 * 11/2022 Ito ..................... H01L 27/14627
2005/0040440 A1　2/2005 Murakami (Continued)

FOREIGN PATENT DOCUMENTS

CN　　1585134 A　　2/2005
CN　　1881604 A　　12/2006

(Continued)

OTHER PUBLICATIONS

International Search Report and Written Opinion of PCT Application No. PCT/JP2018/047397, issued on Mar. 26, 2019, 14 pages of English Translation and 13 pages of ISRWO.

(Continued)

*Primary Examiner* — Jennifer D Bennett

(74) *Attorney, Agent, or Firm* — CHIP LAW GROUP

(57) ABSTRACT

A solid-state imaging device according to an embodiment includes: a semiconductor substrate including a photoelectric conversion element; a lens disposed above a first light incident surface of the photoelectric conversion element; and a plurality of columnar structures disposed on a surface parallel to the first light incident surface that is located between a second light incident surface of the lens and the first light incident surface of the photoelectric conversion element. The columnar structure includes at least one of silicon, germanium, gallium phosphide, aluminum oxide, cerium oxide, hafnium oxide, indium oxide, tin oxide, niobium pentoxide, magnesium oxide, tantalum pentoxide, titanium pentoxide, titanium oxide, tungsten oxide, yttrium (Continued)

oxide, zinc oxide, zirconia, cerium fluoride, gadolinium fluoride, lanthanum fluoride, and neodymium fluoride.

8 Claims, 40 Drawing Sheets

Related U.S. Application Data

(60) Provisional application No. 62/609,839, filed on Dec. 22, 2017.

(58) Field of Classification Search
 CPC ......... H01L 27/14629; H01L 27/14685; H01L 27/146; G02B 5/201; G02B 5/22; H04N 23/12; H04N 25/70; H10F 39/8053; H10F 39/182; H10F 39/802; H10F 39/8057; H10F 39/8063; H10F 39/024; H10F 39/8067; H10F 39/12
 See application file for complete search history.

(56) References Cited

U.S. PATENT DOCUMENTS

| | | | |
|---|---|---|---|
| 2005/0263675 A1 | 12/2005 | Mouli | |
| 2006/0105251 A1* | 5/2006 | Hwang | G02B 5/285 |
| | | | 430/7 |
| 2008/0170143 A1 | 7/2008 | Yoshida | |
| 2010/0046077 A1* | 2/2010 | Lee | G01J 3/02 |
| | | | 359/585 |
| 2010/0244168 A1 | 9/2010 | Shiozawa et al. | |
| 2011/0128423 A1* | 6/2011 | Lee | H04N 23/11 |
| | | | 348/294 |
| 2012/0008024 A1 | 1/2012 | Takimoto | |
| 2012/0061553 A1* | 3/2012 | Yokogawa | H01L 27/14621 |
| | | | 250/208.1 |
| 2012/0267694 A1 | 10/2012 | Kaiser et al. | |
| 2013/0057738 A1 | 3/2013 | Konno et al. | |
| 2014/0146207 A1 | 5/2014 | Yokogawa | |

| | | | |
|---|---|---|---|
| 2015/0123230 A1 | 5/2015 | Jin et al. | |
| 2015/0301236 A1* | 10/2015 | Nakano | G02B 5/285 |
| | | | 359/589 |
| 2015/0311243 A1 | 10/2015 | Jin et al. | |
| 2017/0141151 A1 | 5/2017 | Sato | |
| 2018/0315791 A1 | 11/2018 | Hsieh et al. | |

FOREIGN PATENT DOCUMENTS

| | | | |
|---|---|---|---|
| CN | 102446936 A | 5/2012 | |
| CN | 102751298 A | 10/2012 | |
| CN | 102983142 A | 3/2013 | |
| CN | 106463517 A | 2/2017 | |
| DE | 102012103431 A1 | 10/2012 | |
| JP | 2004077503 A | * 3/2004 | |
| JP | 2005-072097 A | 3/2005 | |
| JP | 2009-238942 A | 10/2009 | |
| JP | 2010-225944 A | 10/2010 | |
| JP | 2013-033864 A | 2/2013 | |
| JP | 2013-055202 A | 3/2013 | |
| JP | 2014007427 A | 1/2014 | |
| KR | 10-2005-0020633 A | 3/2005 | |
| KR | 10-2013-0025823 A | 3/2013 | |
| KR | 10-2015-0052695 A | 5/2015 | |
| KR | 10-2015-0124640 A | 11/2015 | |
| TW | 200524147 A | 7/2005 | |
| WO | 2016/198619 A1 | 12/2016 | |
| WO | 2018/230186 A1 | 12/2018 | |

OTHER PUBLICATIONS

International Preliminary Report on Patentability of PCT Application No. PCT/JP2018/047397, issued on Jul. 2, 2020, 14 pages of English Translation and 09 pages of IPRP.
Non-Final Office Action for U.S. Appl. No. 16/763,927, issued on Nov. 22, 2021, 15 pages.
Final Office Action for U.S. Appl. No. 16/763,927, issued on Apr. 18, 2022, 18 pages.
Notice of Allowance for U.S. Appl. No. 16/763,927, issued on Jun. 29, 2022, 09 pages.

* cited by examiner

LOW ◄———— IMAGE HEIGHT ————► HIGH

LOW ◄——————— IMAGE HEIGHT ———————► HIGH

FIG. 59
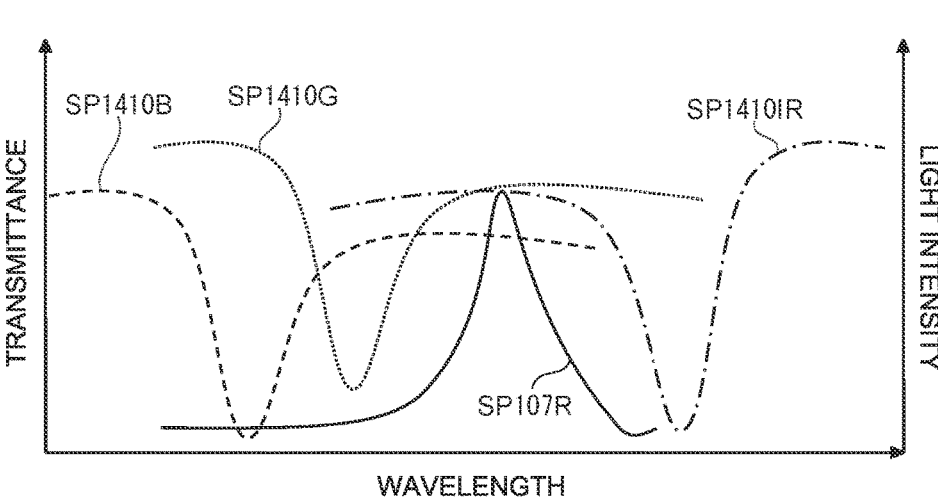
FIG. 60A
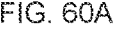
FIG. 60B
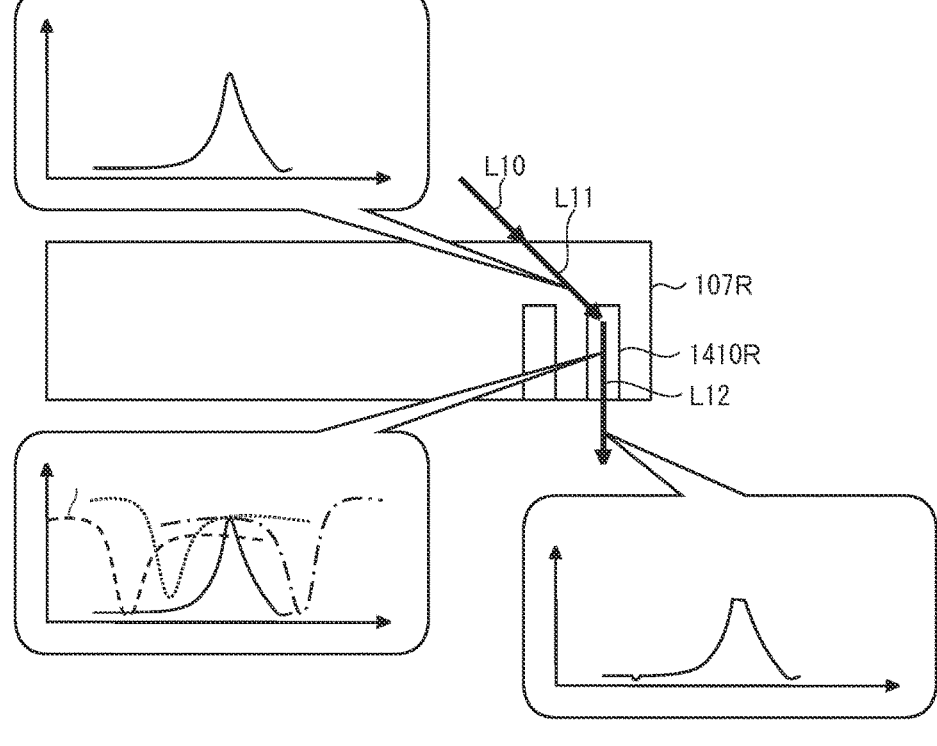
FIG. 60C

SOLID-STATE IMAGING DEVICE AND ELECTRONIC DEVICE FOR ENHANCED COLOR REPRODUCIBILITY OF IMAGES

CROSS REFERENCE TO RELATED APPLICATIONS

The present application is a continuation application of U.S. patent application Ser. No. 16/763,927, filed on May 13, 2020, which is a National stage entry of International Patent Application No. PCT/JP2018/047397 filed on Dec. 21, 2018, which claims the benefit of priority from Provisional Patent Application No. 62/609,839 filed in the US Patent Office on Dec. 22, 2017. Each of the above-referenced applications is hereby incorporated herein by reference in its entirety.

FIELD

The present disclosure relates to a solid-state imaging device and an electronic device.

BACKGROUND

Conventionally, in electronic devices having an imaging function such as digital still cameras and digital video cameras, for example, solid-state imaging elements such as charge coupled device (CCD) and complementary metal oxide semiconductor (CMOS) image sensors are used.

For example, light entering a CMOS image sensor is photoelectrically converted by a photodiode as a photoelectric conversion element in a pixel. Charges generated by the photodiode are transferred to a floating diffusion layer through a transfer transistor, and converted into a voltage. The voltage is applied to the gate of an amplifier transistor. As a result, a pixel signal of voltage level corresponding to the charges accumulated in the floating diffusion layer appears at the drain of the amplifier transistor.

CITATION LIST

Patent Literature

Patent Literature 1: Japanese Laid-open Patent Publication No. 2009-238942

SUMMARY

Technical Problem

In conventional solid-state imaging elements, a color filter that selectively transmits light having a particular wavelength is disposed on each pixel in order to acquire color images and infrared images (hereinafter referred to as "IR images"). However, for example, in a region where the image height is high, light obliquely enters pixels, and hence there is a possibility that light that has been transmitted through a color filter in a pixel enters an adjacent pixel (leaks). There is another possibility that light that has been transmitted through the color filter is reflected by wiring inside the element to enter an adjacent pixel. When the entering (leakage) of light to an adjacent pixel as described above occurs, colors are mixed among pixels, and as a result, there is a problem in that color reproducibility of images acquired by the image sensor decreases.

In view of the above, the present disclosure proposes a solid-state imaging device and an electronic device capable of improving color reproducibility.

Solution to Problem

For solving the problem described above, a solid-state imaging device according to one aspect of the present disclosure has a semiconductor substrate including a photoelectric conversion element, a lens disposed above a first light incident surface of the photoelectric conversion element, and a plurality of columnar structures disposed on a surface parallel to the first light incident surface that is located between a second light incident surface of the lens and the first light incident surface of the photoelectric conversion element, wherein the columnar structure includes at least one of silicon, germanium, gallium phosphide, aluminum oxide, cerium oxide, hafnium oxide, indium oxide, tin oxide, niobium pentoxide, magnesium oxide, tantalum pentoxide, titanium pentoxide, titanium oxide, tungsten oxide, yttrium oxide, zinc oxide, zirconia, cerium fluoride, gadolinium fluoride, lanthanum fluoride, and neodymium fluoride.

BRIEF DESCRIPTION OF DRAWINGS

FIG. 59 is a diagram illustrating an example of spectroscopic characteristics of a pillar array provided in a unit pixel according to the fourteenth embodiment.

FIGS. 60A, 60B, and 60C are diagrams for explaining propagation of light that has obliquely entered a peripheral part of a color filter according to the fourteenth embodiment.

DESCRIPTION OF EMBODIMENTS

Figure 1:
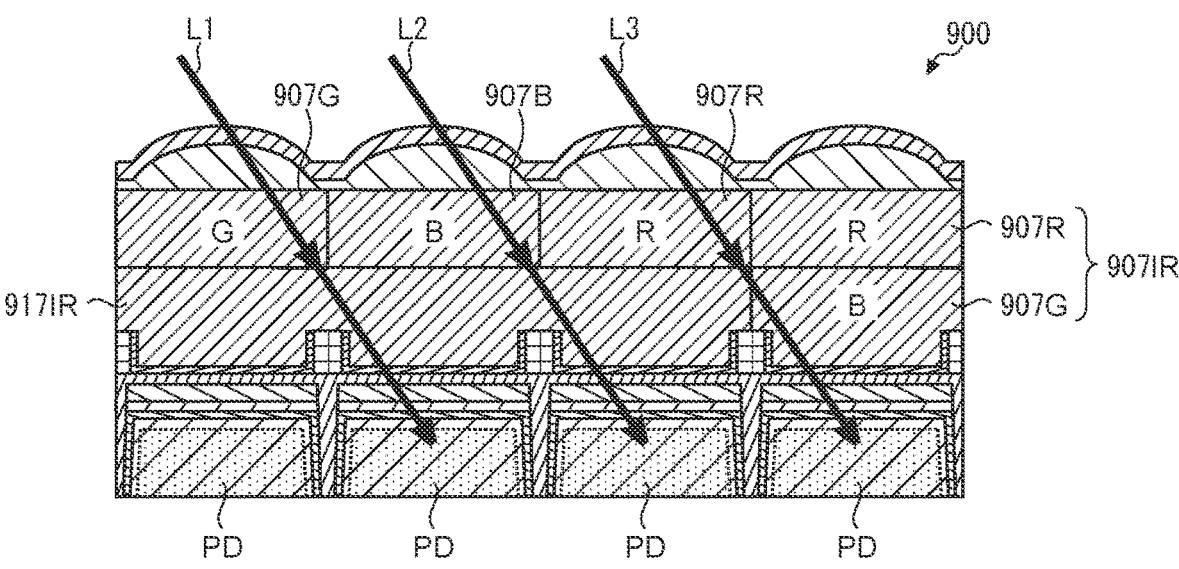
FIG. 1 is a cross-sectional diagram illustrating a cross-sectional structure example of an image sensor employed for a structured light system.

Referring to the drawings, embodiments of the present disclosure are described in detail below. In the following embodiments, the same portions are denoted by the same reference symbols to omit overlapping descriptions.

The present disclosure is described in the order of the following items:

1. First embodiment
1.1 Configuration example of electronic device
1.2 Configuration example of solid-state imaging device
1.3 Configuration example of unit pixel
1.4 Basic function example of unit pixel
1.5 Layout example of color filters
1.6 Stacked structure example of solid-state imaging device
1.7 Cross-sectional structure example of unit pixel
1.8 Shape of pillars
1.9 Arrangement of pillars
1.10 Wavelength selection function by pillars
1.11 Pillar array in first embodiment
1.12 Position of pillar array
1.13 Material of pillars
1.14 Diameter and pitch of pillars
1.15 Manufacturing method for pillars
1.16 Actions and effects
2. Second embodiment
3. Third embodiment
4. Fourth embodiment
5. Fifth embodiment
6. Sixth embodiment
7. Seventh embodiment
8. Eighth embodiment
8.1 Layout example of color filters
8.2 Cross-sectional structure example of unit pixel
8.3 Spectroscopic characteristics of combined filters
8.4 Actions and effects
9. Ninth embodiment
9.1 Spectroscopic characteristics of combined filters
9.2 Cross-sectional structure example of unit pixel
9.3 Plan layout example of pillars
9.4 Diameter and pitch of pillars
9.5 Actions and effects
10. Tenth embodiment
11. Eleventh embodiment
12. Twelfth embodiment
12.1 Layout of pixel array
12.2 Center region
12.2.1 Layout of unit pattern
12.2.2 Cross-sectional structure of unit pixel
12.3 Peripheral region
12.3.1 Layout of unit pattern
12.3.2 Cross-sectional structure of unit pixel
12.4 Spectroscopic characteristics of pillar array
12.5 Actions and effects
13. Thirteenth embodiment
13.1 Intermediate region
13.1.1 Layout of unit pattern 13.1.2 Cross-sectional structure of unit pixel 13.2 Spectroscopic characteristics of pillar array 13.3 Actions and effects 14. Fourteenth embodiment 14.1 Cross-sectional structure example of unit pixel 14.2 Plan layout example of pillars 14.3 Spectroscopic characteristics of pillar array 14.4 Function of pillar as optical waveguide 14.5 Actions and effects 15. Fifteenth embodiment 16. Sixteenth embodiment 17. Seventeenth embodiment 18. Eighteenth embodiment 19. Nineteenth embodiment 19.1 Plan layout of photoreceiver chip 19.2 Cross-sectional structure example of shielding region 19.3 Diameter, pitch, and height of pillars 19.4 Actions and effects 20. Twentieth embodiment 21. Twenty-first embodiment 21.1 Cross-sectional structure example of shielding region 21.2 Actions and effects 22. Twenty-second embodiment 23. Twenty-third embodiment 24. Twenty-fourth embodiment 25. Twenty-fifth embodiment 25.1 Cross-sectional structure example of unit pixel 25.2 Manufacturing method for on-chip lens 25.3 Actions and effects 26. Twenty-sixth embodiment 27. Twenty-seventh embodiment 28. Twenty-eighth embodiment 29. Applications to mobile body

1. First Embodiment

First, a first embodiment is described in detail with reference to the drawings.

For example, one cause of leakage of light transmitted through a color filter in a region where the image height is high to an adjacent pixel is a long distance from a light incident surface of the color filter to a light incident surface of a photoelectric conversion element.

For example, in image sensors that acquire images of light having a particular wavelength outside a visible light region, such as infrared images, in addition to color images, as exemplified by image sensors employed for a structured light system, a structure in which a plurality of color filters are vertically stacked may be provided in order to suppress the entering of light having a particular wavelength to pixels that acquire color images. In such a structure, however, the distance from a light incident surface of a color filter at the top to a light incident surface of a photoelectric conversion element becomes redundant. As a result, there is a high possibility that light that has obliquely entered leaks into an adjacent pixel.

As a specific example, an image sensor 900 that acquires an infrared image (hereinafter referred to as "IR image") by infrared light (hereinafter referred to as "IR light") in addition to a color image of three primary colors of RGB as illustrated in FIG. 1 includes, as pixels that acquire a color image of three primary colors of RGB: a photodiode PD having a color filter 907R that transmits light having a wavelength component of red (R), the color filter 907R being disposed on the light incident surface side; a photodiode PD having a color filter 907G that transmits light having a wavelength component of green (G), the color filter 907G being disposed on the light incident surface side; and a photodiode PD having a color filter 907B that transmits light having a wavelength component of blue (B), the color filter 907B being disposed on the light incident surface side.

An IR filter 917IR that blocks IR light is provided between the color filters 907R, 907G, and 907B and the photodiodes PD. In other words, a color filter in each of the pixels that acquire a color image of three primary colors of RGB has a structure in which the color filter 907R, 907G, or 907B and the IR filter 917IR are stacked. In this manner, the incidence of IR light to the photodiodes PD in the pixels that acquire a color image of three primary colors of RGB is reduced.

The image sensor 900 includes, as a pixel that acquires an IR image, a photodiode PD having a color filter that selectively transmits IR light, the color filter being disposed on a light incident surface of the photodiode PD. As illustrated in FIG. 1, for example, this color filter 907IR that transmits IR light may have a structure in which a color filter 907R that transmits light having a wavelength component of red (R) and a color filter 907B that transmits light having a wavelength component of blue (B) are stacked.

As described above, when the color filter has the stacked structure, a distance from a light incident surface of a color filter located at the top to the light incident surface of the photodiode PD increases (increase in height). Thus, the leakage of light L1 to L3 transmitted through the color filters to adjacent pixels becomes redundant. As a result, there is a problem in that color reproducibility in acquired images decreases. The color reproducibility may be such that colors in reality are truly reproduced.

In view of the above, in the present embodiment, a solid-state imaging device and an electronic device in which columnar structures (hereinafter referred to as "pillar") are used as an IR filter that blocks IR light, so that the leakage of light to an adjacent pixel due to the increased height can be suppressed while suppressing the incidence of IR light to pixels that acquire color images, are described in detail by way of examples.

1.1 Configuration Example of Electronic Device

Figure 2:
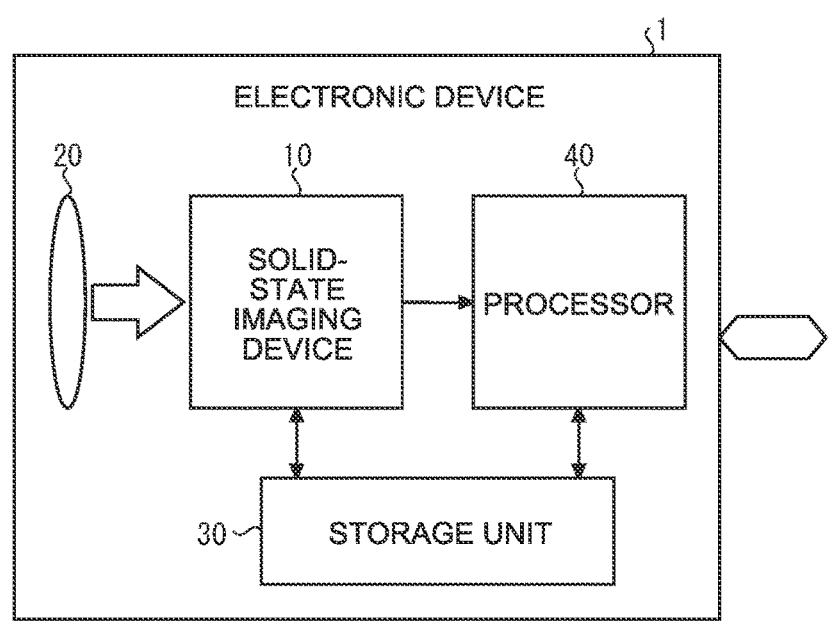
FIG. 2 is a block diagram illustrating a schematic configuration example of an electronic device having a solid-state imaging device according to a first embodiment mounted thereon.

FIG. 2 is a block diagram illustrating a schematic configuration example of an electronic device having a solid-state imaging device according to the first embodiment mounted thereon. As illustrated in FIG. 2, an electronic device 1 includes, for example, an imaging lens 20, a solid-state imaging device 10, a storage 30, and a processor 40.

The imaging lens 20 is an example of an optical system that condenses incident light and forms an image of the light onto a light receiving surface of the solid-state imaging device 10. The light receiving surface may be a surface of the solid-state imaging device 10 on which photoelectric conversion elements are arranged. The solid-state imaging device 10 photoelectrically converts the incident light to generate image data. The solid-state imaging device 10 executes predetermined signal processing, such as noise reduction and white balance adjustment, on the generated image data.

For example, the storage 30 is configured by a flash memory, a dynamic random access memory (DRAM), or a static random access memory (SRAM), and stores therein image data input from the solid-state imaging device 10.

For example, the processor 40 is configured by using a central processing unit (CPU), and may include an application processor that executes an operating system and various kinds of application software, a graphics processing unit (GPU), and a baseband processor. The processor 40 executes various kinds of processing as needed on image data input from the solid-state imaging device 10 and image data read from the storage 30, executes displaying of the image data to users, and transmits the image data to the outside through a predetermined network.

1.2 Configuration Example of Solid-State Imaging Device

Figure 3:
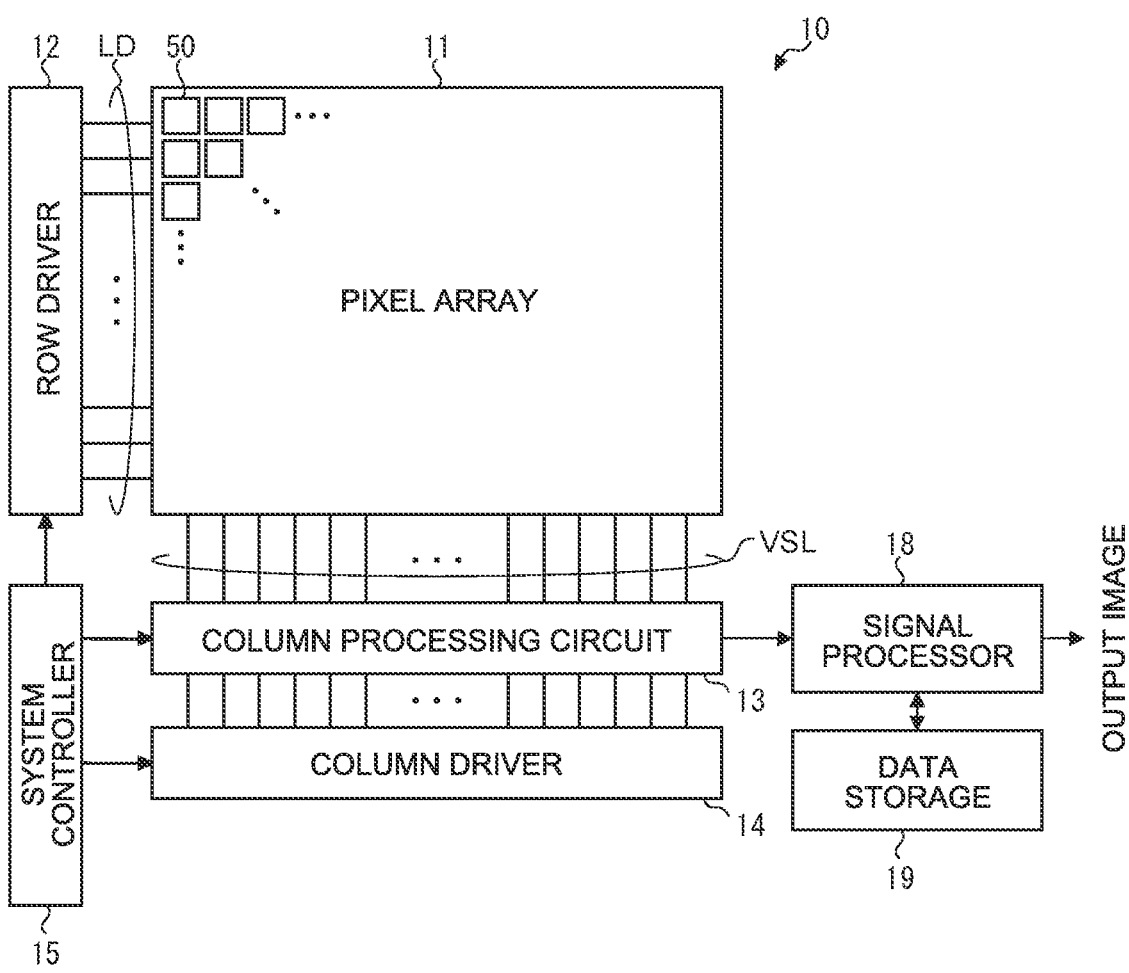
FIG. 3 is a block diagram illustrating a schematic configuration example of a CMOS image sensor according to the first embodiment.

FIG. 3 is a block diagram illustrating a schematic configuration example of a complementary metal-oxide-semiconductor (CMOS) solid-state imaging device (hereinafter simply referred to as "CMOS image sensor") according to the first embodiment. The CMOS image sensor is an image sensor produced by applying or partially using a CMOS process. For example, a CMOS image sensor 10 according to the first embodiment is configured by a back-illuminated CMOS image sensor.

For example, the CMOS image sensor 10 according to the first embodiment has a stacked structure in which a semiconductor chip in which a pixel array 11 is formed and a semiconductor chip in which peripheral circuits are formed are stacked. Examples of the peripheral circuits may include a row driver 12, a column processing circuit 13, a column driver 14, and a system controller 15.

The CMOS image sensor 10 further includes a signal processor 18 and a data storage 19. The signal processor 18 and the data storage 19 may be provided in the same semiconductor chip as that of the peripheral circuits, or may be provided in another semiconductor chip.

The pixel array 11 has a configuration in which unit pixels (hereinafter sometimes simply referred to as "pixels") 50 having photoelectric conversion elements that generate and accumulate charges corresponding to the amount of received light are disposed in a two-dimensional grid pattern in a row direction and a column direction, that is, in a matrix pattern. The row direction is an arrangement direction of pixels in a pixel row (horizontal direction in the figures), and the column direction is an arrangement direction of pixels in a pixel column (vertical direction in the figures). The specific circuit configuration and details of the pixel structure of the unit pixel are described later.

In the pixel array 11, in the pixel arrangement of the matrix pattern, a pixel driving line LD is wired along the row direction for each pixel row, and a vertical signal line VSL is wired along the column direction for each pixel column. The pixel driving line LD transmits a driving signal for driving pixels to read signals from the pixels. In FIG. 3, the pixel driving lines LD are illustrated as wiring one by one, but are not limited to the one-by-one basis. One end of the pixel driving line LD is connected to an output end of the row driver 12 corresponding to each row.

The row driver 12 is configured by a shift register or an address decoder, and drives all the pixels in the pixel array 11 simultaneously or drives the pixels in units of rows. In other words, the row driver 12 constitutes a driving unit that controls the operation of each pixel in the pixel array 11 together with the system controller 15 that controls the row driver 12. The illustration of a specific configuration of the row driver 12 is omitted. In general, the row driver 12 includes two scanning systems, that is, a reading scanning system and a sweep scanning system.

The reading scanning system sequentially and selectively scans unit pixels in the pixel array 11 in units of rows in order to read signals from the unit pixels. The signal read from the unit pixel is an analog signal. The sweep scanning system performs sweep scanning on a reading row for which the reading scanning is to be performed by the reading scanning system, prior to the reading scanning by an exposure time.

Through the sweep scanning by the sweep scanning system, unnecessary charges are swept from photoelectric conversion elements in unit pixels in a reading row, and the photoelectric conversion elements are reset. By sweeping the unnecessary charges by the sweep scanning system (reset), what is called electronic shutter operation is performed. The electronic shutter operation refers to an operation for discarding charges in a photoelectric conversion element and starting new exposure (starting accumulation of charges).

A signal read by the reading operation of the reading scanning system corresponds to the amount of light received after the previous reading operation or electronic shutter operation. A period from a reading timing by the previous reading operation or a sweep timing by the electronic shutter operation to a reading timing by the current reading operation is an accumulation period (also referred to as "exposure period") of charges in a unit pixel.

Signals output from unit pixels in a pixel row selected and scanned by the row driver 12 are input to the column processing circuit 13 through the vertical signal lines VSL for each pixel column. The column processing circuit 13 performs, for each pixel column in the pixel array 11, predetermined signal processing on signals output from pixels in a selected row through the vertical signal lines VSL, and temporarily stores therein pixel signals after the signal processing.

Specifically, the column processing circuit 13 performs, as the signal processing, at least noise reduction processing such as correlated double sampling (CDS) and double data sampling (DDS). For example, fixed pattern noise intrinsic to pixels, such as reset noise and threshold fluctuation in amplifier transistors in pixels, is removed by the CDS. In addition, for example, the column processing circuit 13 has an analog-digital (AD) conversion function, and converts an analog pixel signal read from a photoelectric conversion element into a digital signal and outputs the digital signal.

The column driver 14 is configured by a shift register or an address decoder, and sequentially selects reading circuits (hereinafter referred to as "pixel circuits") corresponding to a pixel column in the column processing circuit 13. Through the selection scanning by the column driver 14, pixel signals that have been subjected to signal processing for each pixel circuit by the column processing circuit 13 are sequentially output.

The system controller 15 includes a timing generator that generates various kinds of timing signals and other components. The system controller 15 controls the driving of the row driver 12, the column processing circuit 13, and the column driver 14 based on various kinds of timings generated by the timing generator.

The signal processor 18 has at least an arithmetic processing function, and performs various kinds of signal processing such as arithmetic processing on pixel signals output from the column processing circuit 13. The data storage 19 temporarily stores therein data necessary for the signal processing in the signal processor 18.

For example, image data output from the signal processor 18 may be subjected to predetermined processing by the processor 40 in the electronic device 1 having the CMOS image sensor 10 mounted thereon, or transmitted to the outside through a predetermined network.

1.3 Configuration Example of Unit Pixel

Figure 4:
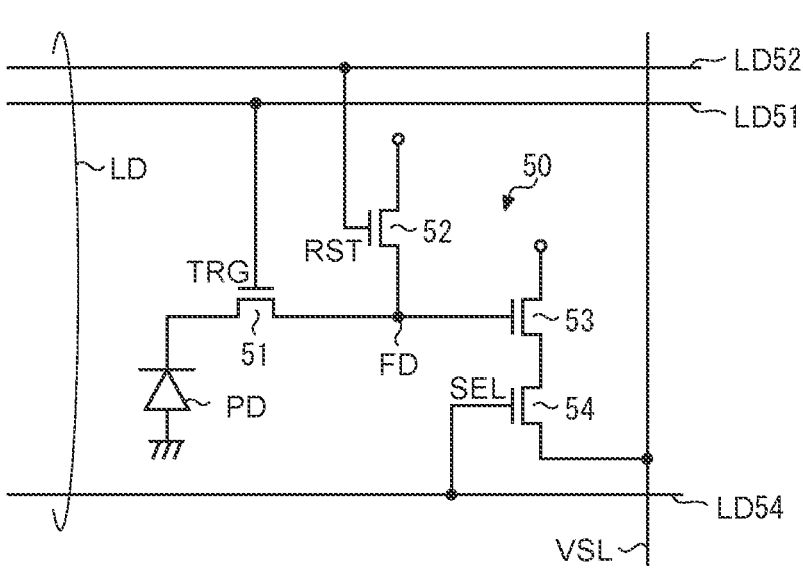
FIG. 4 is a circuit diagram illustrating a schematic configuration example of a unit pixel according to the first embodiment.

FIG. 4 is a circuit diagram illustrating a schematic configuration example of a unit pixel according to the first embodiment. As illustrated in FIG. 4, a unit pixel 50 includes a photodiode PD, a transfer transistor 51, a reset transistor 52, an amplifier transistor 53, a selection transistor 54, and a floating diffusion layer FD.

The selection transistor 54 has the gate connected to a selection transistor driving line LD54 included in the pixel driving lines LD. The reset transistor 52 has the gate connected to a reset transistor driving line LD52 included in the pixel driving lines LD. The transfer transistor 51 has the gate connected to a transfer transistor driving line LD51 included in the pixel driving lines LD. The amplifier transistor 53 has the drain connected to, through the selection transistor 54, a vertical signal line VSL the one end of which is connected to the column processing circuit 13.

In the following description, the reset transistor 52, the amplifier transistor 53, and the selection transistor 54 are sometimes collectively referred to as "pixel circuit". The pixel circuits may include the floating diffusion layer FD and/or the transfer transistor 51.

The photodiode PD photoelectrically converts incident light. The transfer transistor 51 transfers charges generated in the photodiode PD. The floating diffusion layer FD accumulates therein the charges transferred by the transfer transistor 51. The amplifier transistor 53 causes a pixel signal having a voltage value corresponding to the charges accumulated in the floating diffusion layer FD to appear in the vertical signal line VSL. The reset transistor 52 discharges the charges accumulated in the floating diffusion layer FD. The selection transistor 54 selects a unit pixel 50 that is a target to be read.

The photodiode PD has an anode grounded and a cathode connected to the source of the transfer transistor 51. The transfer transistor 51 has the drain connected to the source of the reset transistor 52 and the gate of the amplifier transistor 53. A node as a connection point thereof constitutes the floating diffusion layer FD. The drain of the reset transistor 52 is connected to a vertical reset input line (not shown).

The source of the amplifier transistor 53 is connected to a vertical current supply line (not shown). The drain of the amplifier transistor 53 is connected to the source of the selection transistor 54. The drain of the selection transistor 54 is connected to the vertical signal line VSL.

The floating diffusion layer FD converts the accumulated charges into a voltage having a voltage value corresponding to the amount of the charges. For example, the floating diffusion layer FD may be the capacitance to the ground. The floating diffusion layer FD is not limited thereto, and may be a capacitance added by intentionally connecting a capacitor to a node at which the drain of the transfer transistor 51, the source of the reset transistor 52, and the gate of the amplifier transistor 53 are connected.

1.4 Basic Function Example of Unit Pixel

Next, the basic function of the unit pixel 50 is described with reference to FIG. 4. The reset transistor 52 controls discharging (resetting) the charges accumulated in the floating diffusion layer FD in accordance with a reset signal RST supplied from the row driver 12 through the reset transistor driving line LD52. By turning on the transfer transistor 51 when the reset transistor 52 is on, charges accumulated in the photodiode PD in addition to the charges accumulated in the floating diffusion layer FD can be discharged (reset).

When a reset signal RST of High level is input to the gate of the reset transistor 52, the floating diffusion layer FD is clamped to a voltage applied through the vertical reset input line. In this manner, the charges accumulated in the floating diffusion layer FD are discharged (reset).

When a reset signal RST of Low level is input to the gate of the reset transistor 52, the floating diffusion layer FD is electrically disconnected from the vertical reset input line, and becomes a floating state.

The photodiode PD photoelectrically converts incident light, and generates charges corresponding to the amount of the light. The generated charges are accumulated on the cathode side of the photodiode PD. The transfer transistor 51 controls the transfer of charges from the photodiode PD to the floating diffusion layer FD in accordance with a transfer control signal TRG supplied from the row driver 12 through the transfer transistor driving line LD51.

For example, when a transfer control signal TRG of High level is input to the gate of the transfer transistor 51, charges accumulated in the photodiode PD are transferred to the floating diffusion layer FD. On the other hand, when a transfer control signal TRG of Low level is supplied to the gate of the transfer transistor 51, the transfer of charges from the photodiode PD is stopped.

As described above, the floating diffusion layer FD has the function for converting charges transferred from the photodiode PD through the transfer transistor 51 into a voltage having a voltage value corresponding to the amount of the charges. Thus, in the floating state in which the reset transistor 52 is turned off, the potential of the floating diffusion layer FD is modulated depending on the amount of the accumulated charges.

The amplifier transistor 53 functions as an amplifier an input signal for which is a potential fluctuation in the floating diffusion layer FD connected to the gate thereof. An output voltage signal thereof appears in the vertical signal line VSL through the selection transistor 54 as a pixel signal.

The selection transistor 54 controls the appearance of the pixel signal in the vertical signal line VSL performed by the amplifier transistor 53 in accordance with a selection control signal SEL supplied from the row driver 12 through the selection transistor driving line LD54. For example, when a selection control signal SEL of High level is input to the gate of the selection transistor 54, a pixel signal caused by the amplifier transistor 53 appears in the vertical signal line VSL. On the other hand, when a selection control signal SEL of Low level is input to the gate of the selection transistor 54, the appearance of the pixel signal in the vertical signal line VSL is stopped. In this manner, only the output of a selected unit pixel 50 can be extracted from the vertical signal line VSL to which a plurality of the unit pixels 50 are connected.

1.5 Layout Example of Color Filter

Figure 5:
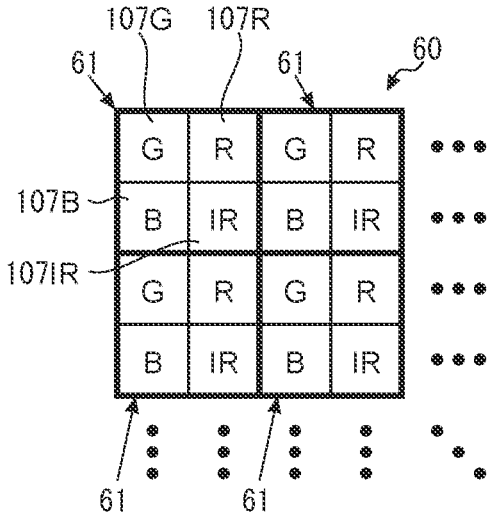
FIG. 5 is a diagram illustrating a layout example of color filters according to the first embodiment.

As described above, a color filter that selectively transmits light having a particular wavelength is disposed on the photodiode PD in each unit pixel 50. FIG. 5 is a diagram illustrating a layout example of the color filter according to the first embodiment. FIG. 5 illustrates a layout example of a color filter array that acquires an IR image in addition to a color image of three primary colors of RGB.

As illustrated in FIG. 5, for example, a color filter array 60 has a configuration in which patterns of 2×2 pixels as units of repetition in color filter arrangement (hereinafter referred to as "unit patterns") 61 are arranged in a two-dimensional grid pattern.

For example, each unit pattern 61 includes four color filters in total, that is, a color filter 107R that selectively transmits light having a wavelength component of red (R), a color filter 107G that selectively transmits light having a wavelength component of green (G), a color filter 107B that selectively transmits light having a wavelength component of blue (B), and a color filter 107IR that selectively transmits light having a wavelength component of IR light.

FIG. 5 exemplifies a layout of the unit pattern 61 in which the color filter 107G is disposed on the upper left, the color filter 107R is disposed on the upper right, the color filter 107B is disposed on the lower left, and the color filter 107IR is disposed on the lower right, but the layout is not limited to such arrangement.

In FIG. 5 and in the following description, the color filter array 60 including the color filter 107IR based on Bayer arrangement is exemplified, but the basic color filter arrangement is not limited to Bayer arrangement. For example, the color filter arrangement can be based on various kinds of color filter arrangement, such as X-Trans (registered trademark) color filter arrangement having a unit pattern of 3×3 pixels, quad Bayer arrangement having a unit pattern of 4×4 pixels, and white RGB color filter arrangement in which a unit pattern is 4×4 pixels including a color filter having broad light transmission characteristics for a visible light region (hereinafter also referred to as "clear" or "white") in addition to color filters for three primary colors of RGB. The same applies to other embodiments described later.

1.6 Stacked Structure Example of Solid-State Imaging Device

Figure 6:
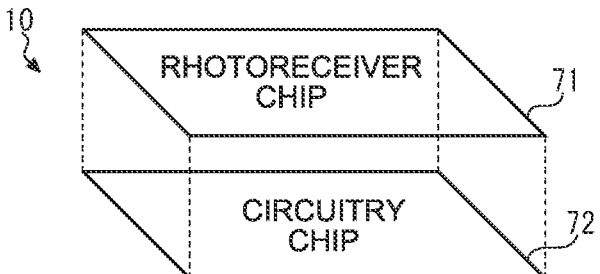
FIG. 6 is a diagram illustrating a stacked structure example of the CMOS image sensor according to the first embodiment.

FIG. 6 is a diagram illustrating a stacked structure example of a CMOS image sensor according to the first embodiment. As illustrated in FIG. 6, a CMOS image sensor 10 has a structure in which a photoreceiver chip 71 and a circuitry chip 72 are vertically stacked. The photoreceiver chip 201 is, for example, a semiconductor chip including the pixel array 11 in which the photodiodes PD are arranged. The circuitry chip 72 is, for example, a semiconductor chip in which the pixel circuits illustrated in FIG. 5 are arranged.

For bonding of the photoreceiver chip 71 and the circuitry chip 72, for example, what is called "direct bonding", in which bonding surfaces of the chips are planarized and the chips are bonded by interelectronic force, can be used. However, the bonding method is not limited thereto, and, for example, what is called Cu—Cu bonding, where electrode pads made of copper (Cu) formed on bonding surfaces are bonded, and other types of bonding, such as bump bonding, can be used.

For example, the photoreceiver chip 71 and the circuitry chip 72 are electrically connected to each other through a connection portion such as a through-silicon via (TSV) passing through the semiconductor substrate. Examples of methods that can be employed for connection using the TSV include what is called a twin TSV method in which two TSVs of a TSV provided in the photoreceiver chip 71 and a TSV provided in a region from the photoreceiver chip 71 to the circuitry chip 72 are connected on the outer surface of the chip, and what is called a shared TSV method in which the photoreceiver chip 71 and the circuitry chip 72 are connected by a TSV passing through the photoreceiver chip 71 and the circuitry chip 72.

When Cu—Cu bonding or bump bonding is used for the bonding of the photoreceiver chip 71 and the circuitry chip 72, the photoreceiver chip 71 and the circuitry chip 72 are electrically connected to each other through a Cu—Cu bonding portion or a bump bonding portion.

1.7 Cross-Sectional Structure Example of Unit Pixel

Figure 7:
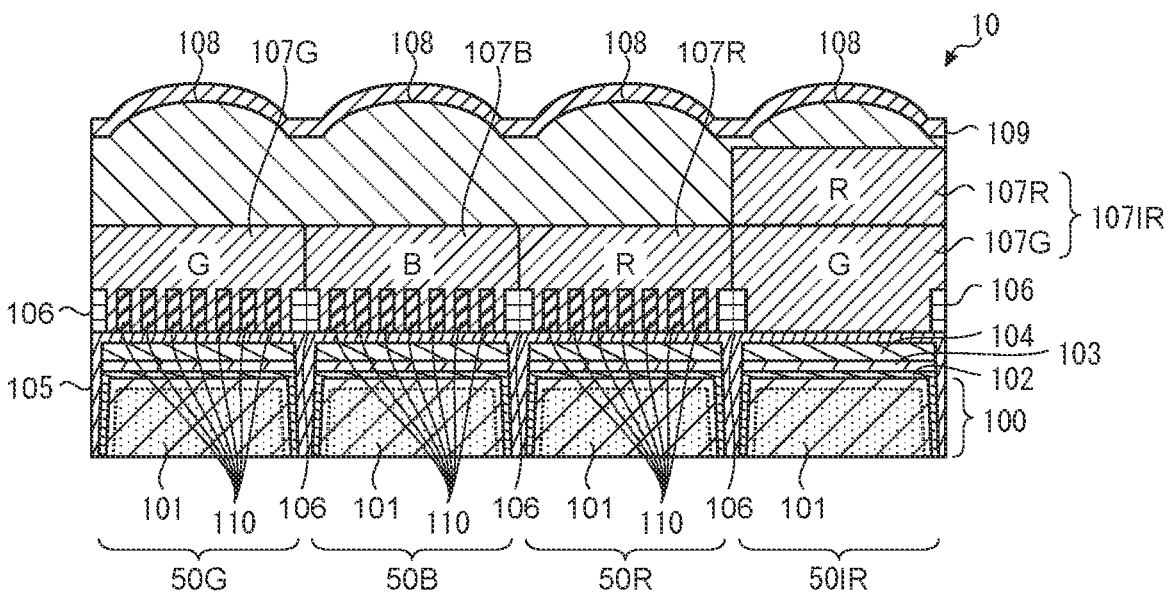
FIG. 7 is a cross-sectional diagram illustrating a cross-sectional structure example of the CMOS image sensor according to the first embodiment.

Next, a cross-sectional structure example of the unit pixel according to the first embodiment is described in detail with reference to the drawings. FIG. 7 is a cross-sectional diagram illustrating a cross-sectional structure example of a CMOS image sensor according to the first embodiment. For simple description, FIG. 7 illustrates a cross-sectional structure example of the photoreceiver chip 71 in FIG. 6, and omits a cross-sectional structure example of the circuitry chip 72. In FIG. 7, wiring layers constituting electrical connection from the transfer transistor 51 and the photoreceiver chip 71 to the circuitry chip 72 are also omitted. For the sake of description, FIG. 7 exemplifies a case where four unit pixels 50G, 50B, 50R, and 50IR constituting the unit pattern 61 are arranged in a row along the cross section.

In the following description, latter indexes (alphabets or alphabets and numerals) such as 'R', 'G', 'G1', 'G2', 'B', or 'IR' added to the first numeral in reference symbols are omitted and only the numerals in the first half are used, unless the configurations are distinguished. For example, when the unit pixels 50G, 50B, 50R, and 50IR are not distinguished, the reference symbols thereof are '50'. Similarly, when the color filters 107G, 107B, 107R, and 107IR are not distinguished, the reference symbols thereof are '107'.

FIG. 7 illustrates a cross-sectional structure example of the unit pixel 50 in the back-illuminated CMOS image sensor 10. As illustrated in FIG. 7, each unit pixel 50 includes a semiconductor substrate 100, an insulator film 103 provided on the back surface (top surface in FIG. 7) of the semiconductor substrate 100, an anti-reflection film 104 provided on the insulator film 103, an insulator film 105 provided on the anti-reflection film 104, a color filter 107 provided on the insulator film 105, an on-chip lens 108 provided on the color filter 107, and a passivation film 109 that protects the surface of the on-chip lens 108.

For the insulator film 103, for example, insulating material such as aluminum oxide ($Al_2O_3$) can be used. For the anti-reflection film 104, for example, high refractive index material such as tantalum pentoxide ($Ta_2O_5$) can be used. For the insulator film 105, for example, insulating material such as silicon oxide ($SiO_2$) can be used.

In the semiconductor substrate 100, for example, N-type semiconductor regions 101 formed by diffusing N-type dopants in rectangular regions arranged in the back surface in a two-dimensional grid pattern, and a P-type semiconductor region 102 surrounding the N-type semiconductor regions 101 are provided. The N-type semiconductor regions 101 and the P-type semiconductor region 102 constitute a photodiode PD as a photoelectric conversion element.

On the insulator film 105 between the unit pixels 50, a shielding film 106 that reduces leakage of light, having obliquely entered a unit pixel 50, into a photodiode PD in another unit pixel (hereinafter also referred to as "adjacent pixel") 50 adjacent to the unit pixel 50 is provided. For the shielding film 106, for example, tungsten (W) can be used.

Furthermore, a trench is formed between the unit pixels 50 in the semiconductor substrate 100 so as to separate adjacent photodiodes PD. For example, the inside of the trench may be filled with the insulator film 105. In this case, a gap may remain in a center part of the insulator film 105 in the trench. In the following description, the insulator film 105 in the trench is referred to as "pixel separation portion".

The trench may reach the front surface of the semiconductor substrate 100 from the back surface thereof, and may be formed to the middle from the back surface of the semiconductor substrate 100. In the following description, the configuration in which the trench reaches the front surface of the semiconductor substrate 100 from the back surface thereof is referred to as "front full trench isolation (FFTI)", and the configuration in which the trench is formed in the middle from the back surface of the semiconductor substrate 100 is referred to as "reverse deep trench isolation (RDTI)".

On the top surface of the insulator film 105, a color filter 107 is provided for each unit pixel 50. Specifically, a unit pixel 50R that generates a pixel signal related to a wavelength component of red (R) is provided with a color filter 107R that selectively transmits light having the wavelength component of red. A unit pixel 50G that generates a pixel signal related to a wavelength component of green is provided with a color filter 107G that selectively transmits light having the wavelength component of green (G). A unit pixel 50B that generates a pixel signal related to a wavelength component of blue is provided with a color filter 107G that selectively transmits light having the wavelength component of blue (B). A unit pixel 50IR that generates a pixel signal related to IR light is provided with a color filter 107IR that selectively transmits light having a wavelength component of IR light.

On the color filter 107, an on-chip lens 108 is provided for each unit pixel 50. For example, the radius of curvature of each on-chip lens 108 is set such that incident light is concentrated at substantially the center of a light incident surface of the photodiode PD. For example, the surface of the on-chip lens 108 is covered with the passivation film 109 such as a TEOS film.

Figure 8:
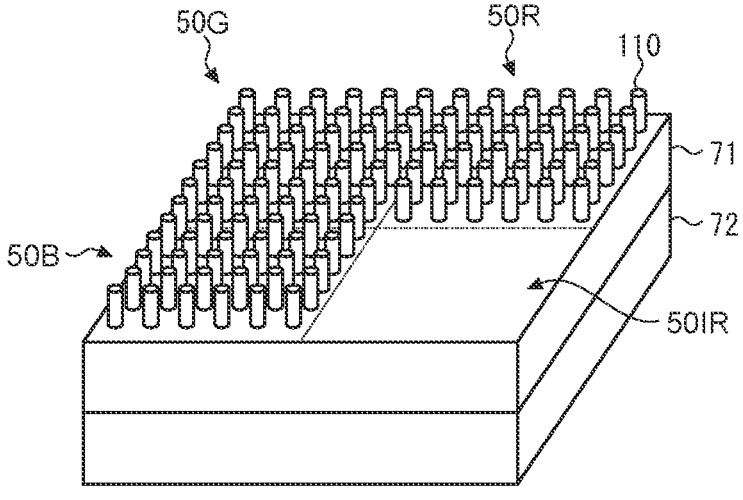
FIG. 8 is a schematic diagram illustrating positions at which pillars according to the first embodiment are formed.

In the configuration described above, a plurality of pillar-shaped structures (hereinafter simply referred to as "pillars") 110 are provided on the top surface of the insulator film 105 so as to protrude to the inside of the color filter 107. For example, as exemplified in FIG. 8, the pillars 110 are provided on the insulator film 105 of the unit pixels 50R, 50G, and 50B that generate a color image of three primary colors of RGB. In FIG. 8, the illustration of structures of layers upper than the color filter 107 is omitted.

1.8 Shape of Pillar

For example, each pillar 110 may be a columnar structure. The pillar 110 is not limited to a column, and may be variously modified to, for example, an elliptic column, polygonal columns of a triangular prism or higher (including rectangular parallelepiped), circular truncated cones (including elliptic truncated cone), polygonal truncated cones of a triangular truncated cone or higher, cones (including elliptic cone), and polygonal cones of a triangular cone or higher.

1.9 Arrangement of Pillars

Figure 9:
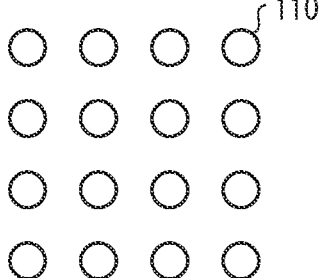
FIG. 9 is a layout diagram illustrating an arrangement example of the pillars according to the first embodiment.
Figure 10:
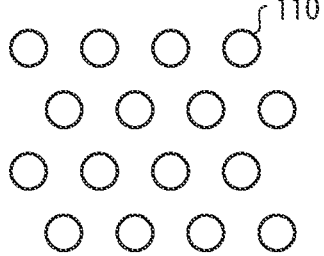
FIG. 10 is a layout diagram illustrating another arrangement example of the pillars according to the first embodiment.

The pillars 110 may be arranged in square arrangement on the surface of the insulator film 105 as exemplified in FIG. 9, for example, and, for example, may be arranged in hexagonal close-packed arrangement as exemplified in FIG. 10. The arrangement is not limited to square arrangement and hexagonal close-packed arrangement, and can be variously modified to, for example, random arrangement in which the distances (pitches) between the pillars 110 are irregular.

1.10 Wavelength Selection Function by Pillars

By appropriately selecting the diameter, the pitch, and the material of the pillars 110 having the configuration and the arrangement described above, the pillars 110 can function as a wavelength selection element (wavelength filter) that allows light in a particular wavelength band to be absorbed or transmitted. The diameter may be the diameter of the top surface or the bottom surface of a columnar or conical structure. The pitch may be a distance between center axes of adjacent pillars 110. In the following description, the pillars functioning as a wavelength filter are referred to as "pillar array".

Figure 11:
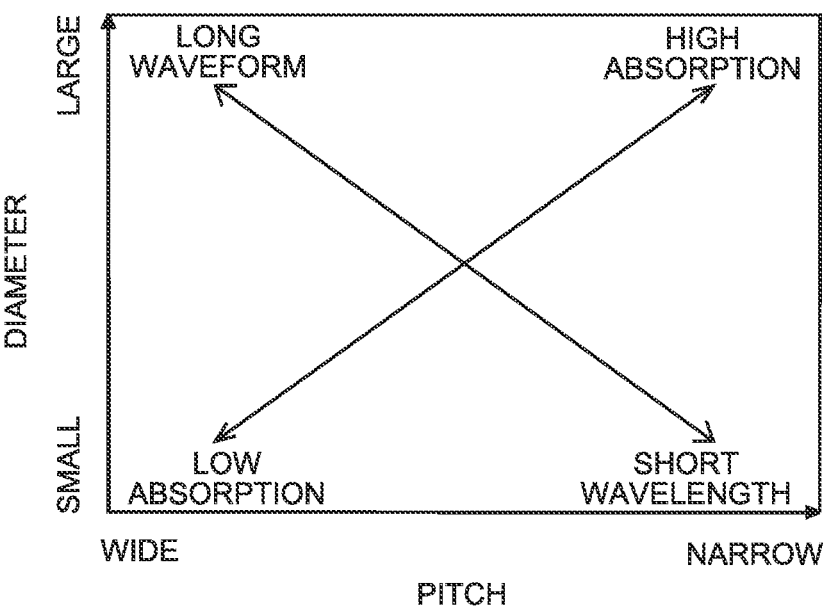
FIG. 11 is a diagram for explaining a wavelength selection function of a pillar array according to the first embodiment.

FIG. 11 is a diagram for explaining the wavelength selection function of the pillar array according to the first embodiment. As illustrated in FIG. 11, the light absorptance of the pillar array tends to be higher as the pitch between the pillars 110 becomes smaller and be higher as the diameter of each pillar becomes larger.

On the other hand, the wavelength of light absorbed by the pillar array tends to be shorter as the pitch between the pillars 110 becomes smaller and be shorter as the diameter of each pillar 110 becomes smaller. The "wavelength of light absorbed by the pillar array" as used herein may be a wavelength at which the absorptance peaks in a light absorption spectrum of the pillar array, in other words, a wavelength at which the transmittance becomes lowest in the light transmission spectrum of the pillar array.

Figure 12:
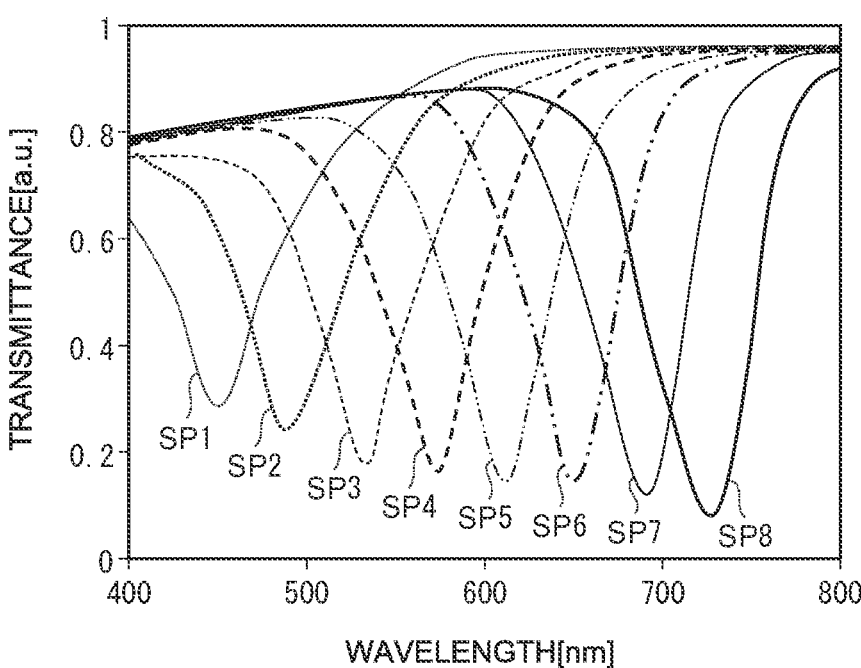
FIG. 12 is a diagram illustrating an example of a light transmission spectrum that can be implemented by the pillar array according to the first embodiment.

As examples, FIG. 12 illustrates some light transmission spectra of the pillar array. Light transmission spectra SP1 to SP8 exemplified in FIG. 12 are light transmission spectra measured when pillars 110 having uniform diameters and pitches are used. For example, the diameters and the pitches of the pillar array are designed so as to shift from the lower right to the upper left in FIG. 11 in the order from the light transmission spectra SP1 to SP8.

As illustrated in FIG. 12, the pillar array configured by the pillars 110 can function as a wavelength filter having a light transmission spectrum to selectively absorb light in a particular wavelength band. Thus, by appropriately setting the diameter and/or the pitch of the pillars 110 constituting the pillar array, a wavelength filter that selectively attenuates light in an intended wavelength band can be implemented.

As mentioned above, the pillar array can function as not only a wavelength filter that selectively absorbs light in a particular wavelength band (hereinafter referred to as "particular wavelength absorption filter") but also a wavelength filter that selectively transmits light in a particular wavelength band (hereinafter referred to as "particular wavelength transmission filter").

Figure 13:
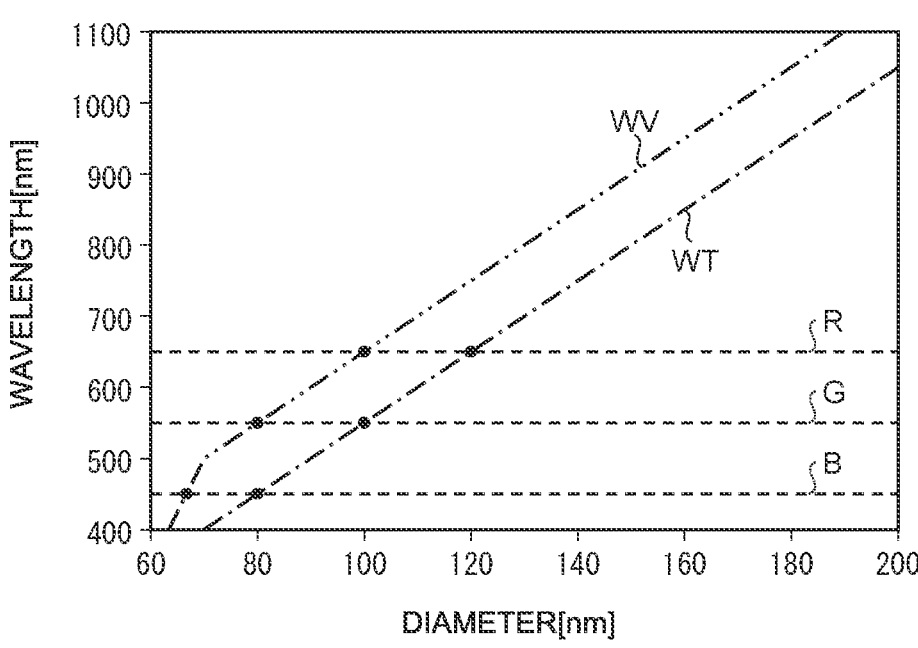
FIG. 13 is a diagram illustrating an example of a relation between the diameter of the pillar and the wavelength of light absorbed by/transmitted through the pillar array according to the first embodiment.

FIG. 13 is a diagram illustrating an example of the relation between the diameter of the pillars and the wavelength of light absorbed by/transmitted through the pillar array according to the first embodiment. FIG. 13 exemplifies a case where the pitch between the pillars 110 in the pillar array is four times the diameter of the pillars 110 (pitch/diameter=4). In the following description, a wavelength of light at which the absorptance of the pillar array forms a peak is referred to as "absorption peak wavelength", and a wavelength of light at which the transmittance of the pillar array forms a peak is referred to as "transmission peak wavelength".

In FIG. 13, a line WV indicates an absorption peak wavelength when the pillar array is designed as a particular wavelength absorption filter, and a line WT indicates a transmission peak wavelength when the pillar array is designed as a particular wavelength transmission filter. In FIG. 13, a broken line R indicates the center wavelength of light of red (R), a broken line G indicates the center wavelength of light of green (G), and a broken line B indicates the center wavelength of light of blue (B).

As illustrated in FIG. 13, in both the cases where the pillar array is designed as a particular wavelength absorption filter and the pillar array is designed as a particular wavelength transmission filter, the absorption peak wavelength or the transmission peak wavelength tends to be longer as the diameter of the pillars 110 becomes larger.

From FIG. 13, for example, it is understood that the diameter of each pillar 110 is desirably about 120 nanometers (nm) when the pillar array functions as a particular wavelength transmission filter that selectively transmits light having a wavelength component of red (R), and desirably about 100 nm when the pillar array functions as a particular wavelength absorption filter that selectively absorbs light having a wavelength component of red (R). Similarly, for example, it is understood that the diameter of each pillar 110 is desirably about 100 nm when the pillar array functions as a particular wavelength transmission filter that selectively transmits light having a wavelength component of green (G), and desirably about 80 nm when the pillar array functions as a particular wavelength absorption filter that selectively absorbs light having a wavelength component of green (G). Furthermore, for example, it is understood that the diameter of each pillar 110 is desirably about 80 nm when the pillar array functions as a particular wavelength transmission filter that selectively transmits light having a wavelength component of blue (B), and desirably about 60 nm when the pillar array functions as a particular wavelength absorption filter that selectively absorbs light having a wavelength component of blue (B).

The specific numerals illustrated in FIG. 13 are merely examples, and may be values that change depending on various conditions such as the material of the pillars 110 and the materials of the color filter 107 and other films.

1.11 Pillar Array in First Embodiment

In the first embodiment, for example, in order to attenuate IR light having a particular wavelength entering the photodiodes PD in the unit pixels 50R, 50G, and 50B that acquire a color image of three primary colors of RGB, the pillars 110 constituting a pillar array are designed so as to selectively absorb IR light having the particular wavelength.

In this manner, by providing the pillar array that absorbs IR light having the particular wavelength to the unit pixels 50R, 50G, and 50B, the color mixture caused by the incidence of IR light to the unit pixels 50R, 50G, and 50B can be reduced to acquire a color image having high color reproducibility.

1.12 Position of Pillar Array

The positions of the pillars 110 constituting the pillar array can be variously modified to, for example, positions closer to a photodiode PD in the color filter 107 (see, for example, FIG. 7), as long as the positions are included in a region from the front surface (light incident surface) of the on-chip lens 108, which is the topmost layer, to the light incident surface of the photodiode PD.

For example, the height of each pillar 110 can be set to about 300 nm. The height is not limited thereto, and may be larger or smaller than the thickness of the color filter 107.

1.13 Material of Pillar

For the material of the pillar 110 according to the first embodiment, for example, material having a refractive index of 1.5 or more can be used. Examples of the materials satisfying the condition include silicon (Si), germanium (Ge), gallium phosphide (GaP), aluminum oxide ($Al_2O_3$), cerium oxide ($CeO_2$), hafnium oxide ($HfO_2$), indium oxide ($In_2O_3$), tin oxide ($SnO_2$), niobium pentoxide ($Nb_2O_5$), magnesium oxide (MgO), tantalum pentoxide ($Ta_2O_5$), titanium pentoxide ($Ti_3O_5$), other kinds of titanium oxide (such as TiO and $TiO_2$), tungsten oxide ($WO_3$), yttrium oxide ($Y_2O_3$), zinc oxide (ZnO), zirconia ($ZrO_2$), cerium fluoride ($CeF_3$), gadolinium fluoride ($GdF_3$), lanthanum fluoride ($LaF_3$), and neodymium fluoride ($NdF_3$).

The crystal structure of the pillar 110 may be a single crystal or a polycrystal of the above-mentioned materials. Alternatively, the pillar 110 may have an amorphous structure without a crystal structure completely or incompletely.

1.14 Diameter and Pitch of Pillars

Next, the diameter and pitch of the pillars 110 are described by way of example. In this description, an example in which the shape of each pillar 110 is columnar and the arrangement thereof is hexagonal close-packed arrangement is described. For example, the following description can also be applied to square arrangement and other types of arrangement.

For example, the diameter of each pillar 110 can be set in the range of 30 to 200 nm such that the absorption peak wavelength of the pillar array substantially matches a particular wavelength of IR light. For example, the pitch between the pillars 110 can be set in the range of 200 to 1,000 nm such that absorptance of IR light having a particular wavelength is sufficiently obtained. For example, in the case of absorbing and attenuating IR light having a wavelength of 940 nm, the diameter of the pillar 110 can be set in the range of 180 to 220 nm, and the pitch between the pillars 110 can be set to 632 nm.

Comparing the case where gallium phosphide (GaP) having a refractive index of 3.18 for light having a wavelength of 800 nm is used as the material of the pillars 110 and the case where silicon (Si) having a refractive index of 3.69 for light having a wavelength of 800 nm is used as the material of the pillars 110, for example, the refractive index of silicon (Si) is about 0.86 times the refractive index of gallium phosphide (GaP). Thus, by setting the diameter and the pitch designed on the assumption that gallium phosphide (GaP) is used to about 0.86 times, the diameter and the pitch in the case of using silicon (Si) can be determined.

Similarly, the diameter and the pitch in the case of using another material can be calculated from the above-mentioned diameter and pitch in the case of using gallium phosphide (GaP) and/or the above-mentioned diameter and pitch in the case of using silicon (Si) based on the refractive index of the material.

In the present example, the case where the pillar 110 has a columnar shape has been exemplified. However, for example, when the shape of the pillar 110 is a rectangular parallelepiped the upper base of which is square, the value of the diameter described above may be applied to the length of one side of the upper base or the length of a diagonal passing through the center point of the upper base. When the pillar 110 is a polygonal column, for example, the value of the diameter described above may be applied to the length of a diagonal passing through the center point of the upper base. Furthermore, when the pillar 110 is an elliptical column, for example, the value of the diameter described above may be applied to the length of the major axis, the length of the minor axis, or the average length of the major axis and the minor axis of the upper base.

1.15 Manufacturing Method for Pillar

Next, a manufacturing method for the pillar 110 according to the first embodiment is described by way of example. FIG. 14 to FIG. 19 are diagrams illustrating the manufacturing method for the pillar according to the first embodiment. In this description, the photodiode PD formed from the N-type semiconductor region 101 and the P-type semiconductor region 102, and the insulator film 103, on the back surface of the semiconductor substrate 100, the anti-reflection film 104, and the insulator film 105 (including the inside of the trench) have already been formed on the semiconductor substrate 100. The order of the formation of the shielding film 106 may be before or after the formation of the pillar 110.

Figure 14:
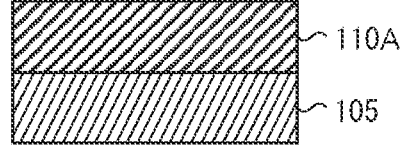
FIG. 14 is a diagram illustrating a manufacturing method for the pillars according to the first embodiment (No. 1).

In this manufacturing process, first, as illustrated in FIG. 14, a material film 110A made of the material of the pillar 110 is formed on the insulator film 105 formed on the back surface side of the semiconductor substrate 100. For the formation of the material film 110A, for example, various kinds of film forming methods such as chemical vapor deposition (CVD), plasma CVD, and sputtering can be used. For example, the thickness of the material film 110A may be substantially equal to or larger than the height of the pillar 110.

Figure 15:
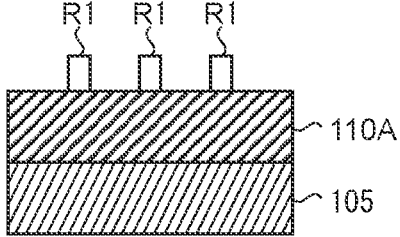
FIG. 15 is a diagram illustrating the manufacturing method for the pillars according to the first embodiment (No. 2).

Next, a resist solution such as diluted high-resolution electron beam resist (ZEP) containing conductive polymers is spin-coated on the material film 110A. Subsequently, as illustrated in FIG. 15, an arrangement pattern of the pillar 110 is transferred to the coated resist solution by using electron beam lithography or photolithography to form resist films R1 having the same arrangement pattern as the pillars 110.

Figure 16:
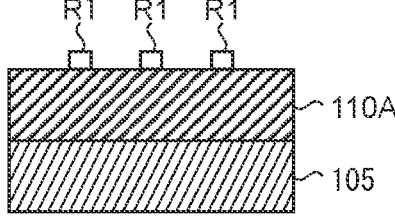
FIG. 16 is a diagram illustrating the manufacturing method for the pillars according to the first embodiment (No. 3).

Next, as illustrated in FIG. 16, the resist films R1 formed on the material film 110A are subjected to a descum process so that residues and tailing after lithography are removed.

Figure 17:
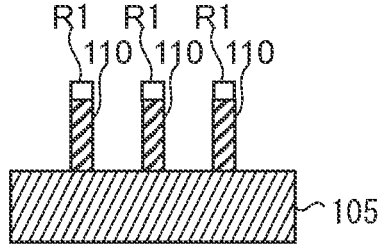
FIG. 17 is a diagram illustrating the manufacturing method for the pillars according to the first embodiment (No. 4).
Figure 18:
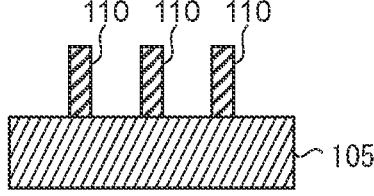
FIG. 18 is a diagram illustrating the manufacturing method for the pillars according to the first embodiment (No. 5).

Next, as illustrated in FIG. 17, the material film 110A is etched while using the resist films R1 as a mask to process the material film 110A, so that the pillars 110 are formed. For the etching of the material film 110A, deep etching technology such as deep reactive ion etching (DRIE) such as Bosch process can be used. After that, as illustrated in FIG. 18, the resist films R1 left on the pillars 110 are removed by ashing.

In this manner, the pillars 110 can be formed at the same step by using the resist films R1 formed at the same step as a mask. The same applies to a case where pillars having different diameters and pitches are mixed as in an embodiment described later, and hence the manufacturing process can be facilitated.

Figure 19:
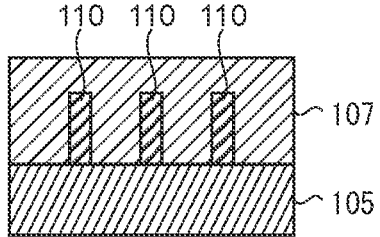
FIG. 19 is a diagram illustrating the manufacturing method for the pillars according to the first embodiment (No. 6).

Next, as illustrated in FIG. 19, material such as spin-on glass (SOG) is spin-coated on the insulator film 105 on which the pillars 110 are formed, and the material is cured to form a color filter 107. The color filter 107 may be formed by using CVD or plasma CVD instead of spin coating.

Through the steps as described above, the pillars 110 buried in the color filter 107 are formed on the insulator film 105 formed on the back surface side of the semiconductor substrate 100.

1.16 Actions and Effects

As described above, according to the first embodiment, the pillar array that absorbs IR light having a particular wavelength is provided to the unit pixels 50R, 50G, and 50B that acquire a color image, and hence the color mixture caused by the incidence of IR light can be reduced to acquire image data having high color reproducibility.

In the first embodiment, the pillars 110 constituting the pillar array that absorbs IR light having a particular wavelength are buried in the color filters 107R, 107G, and 107B. Thus, the increase in height of the color filters can be suppressed as compared with the structure in which color filters are stacked. Consequently, the leakage of light that has entered a unit pixel 50 to an adjacent pixel can be reduced to acquire image data having higher color reproducibility.

2. Second Embodiment

In the above-mentioned first embodiment, the case where the pillars 110 constituting the pillar array that absorbs IR light have the same diameter and the pillars 110 are arranged with uniform pitches has been exemplified. The pillar array that absorbs IR light is not limited to such a configuration.

Figure 20:
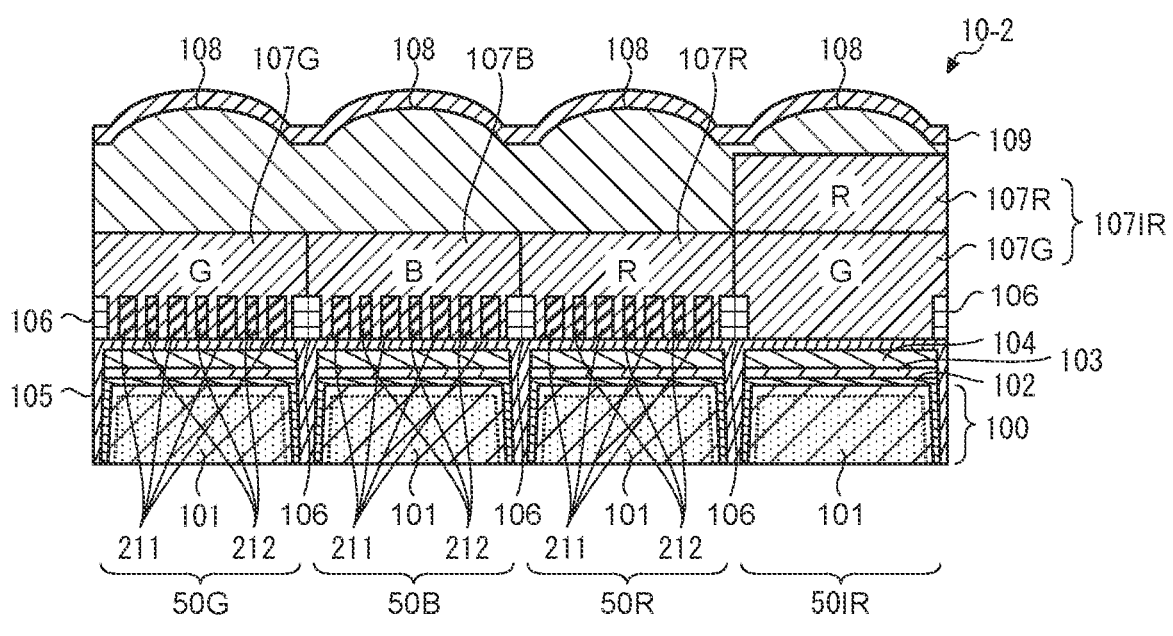
FIG. 20 is a cross-sectional diagram illustrating a cross-sectional structure example of a CMOS image sensor according to a second embodiment.

For example, as in a CMOS image sensor 10-2 exemplified in FIG. 20, a plurality of kinds (two kinds in FIG. 20) of pillars 211 and 212 having randomly different diameters may be mixed.

Figure 21:
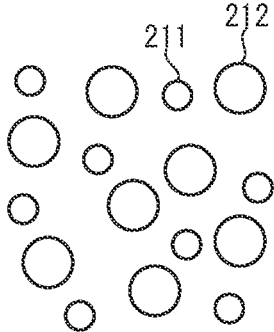
FIG. 21 is a layout diagram illustrating an arrangement example of pillars according to the second embodiment.

For example, the mixed kinds of pillars 211 and 212 may be arrangement in which pitches between the pillars are irregularly random as exemplified in FIG. 21.

In the following description, the state in which the diameters of pillars are "random" refers to a state in which two or more kinds of different diameters are mixed in a plurality of pillars, and the state in which the pitches between the pillars are "random" refers to a state in which two or more kinds of different pitches are mixed among a plurality of pillars.

In this manner, by randomly arranging a plurality of kinds of pillars (for example, the pillars 211 and 212) having different diameters, a pillar array having broad light absorption characteristics or light transmission characteristics to incident light can be implemented.

Consequently, not only IR light having a particular wavelength but also IR light in a broad wavelength band can be attenuated, and hence the mixing of colors caused by incidence of IR light can be further reduced to acquire image data having further improved color reproducibility.

Other configurations, operations, and effects may be the same as those in the above-mentioned embodiment, and hence the detailed descriptions thereof are herein omitted.

3. Third Embodiment

As mentioned in the first embodiment, the shape of each pillar 110 is not limited to a column, and can be variously modified to, for example, an elliptic column, polygonal columns of a triangular prism or higher (including rectangular parallelepiped), circular truncated cones (including elliptic truncated cone), polygonal truncated cones of a triangular truncated cone or higher, cones (including elliptic cone), and polygonal cones of a triangular cone or higher.

Figure 22:
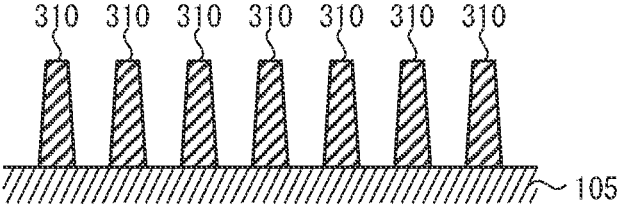
FIG. 22 is a cross-sectional diagram illustrating a shape example of pillars according to a third embodiment.

For example, by shaping the pillars such that the diameter gradually changes from the bottom surface (insulator film 105 side) toward the top surface or the apex (this shape is also referred to as "tapered shape"), as the pillars 310 exemplified in FIG. 22, the wavelength of light to be absorbed or transmitted can be changed for each height. Thus, a pillar array having broad light absorption characteristics or light transmission characteristics for incident light can be implemented.

Consequently, similarly to the second embodiment, not only IR light having a particular wavelength but also IR light in a broad wavelength band can be attenuated, and hence the mixing of colors caused by incidence of IR light can be further reduced to acquire image data having further improved color reproducibility.

When the pillar 310 has a tapered shape in which the diameter decreases toward the top surface, for example, the angle (elevation angle) of the inclined surface in the case where the top surface of the insulator film 105 is a horizontal surface can be set in the range of 45 degrees or more and less than 90 degrees. On the other hand, when the pillar 310 has a tapered shape in which the diameter increases toward the top surface, for example, the angle (elevation angle) of the inclined surface in the case where the top surface of the insulator film 105 is a horizontal surface can be set in the range of more than 90 degrees and 135 degrees or less.

For the shape in which the diameter gradually changes from the bottom surface (insulator film 105 side) toward the top surface or the apex, as mentioned above in the first embodiment, for example, various kinds of shapes such as circular truncated cones (including elliptic truncated cone), polygonal truncated cones of a triangular truncated cone or higher, cones (including elliptic cone), and polygonal cones of a triangular cone or higher can be employed.

The shape from the bottom surface (insulator film 105 side) toward the top surface or the apex is not limited to the shape (tapered shape) in which the diameter gradually changes, and may be variously changed to, for example, a shape in which the diameter changes step by step in a stair-step form.

The shape as described above in which the diameter changes gradually or step by step from the bottom surface (insulator film 105 side) toward the top surface or the apex is not limited to the third embodiment, and can be similarly applied to another embodiment described above or described later.

Other configurations, operations, and effects may be the same as those in the above-mentioned embodiments, and hence the detailed descriptions thereof are herein omitted.

4. Fourth Embodiment

In the above-mentioned first to third embodiments, the case where the pillars 110, 211 and 212, or 310 are formed inside the color filter 107 and on the insulator film 105 formed on the back surface side of the semiconductor substrate 100 has been exemplified. However, as described above, the positions of the pillars 211 and 212, or 310 constituting a pillar array can be variously modified as long as the positions are included in a region from the light incident surface (top surface) of the color filter 107 to the light incident surface of the photodiode PD.

Figure 23:
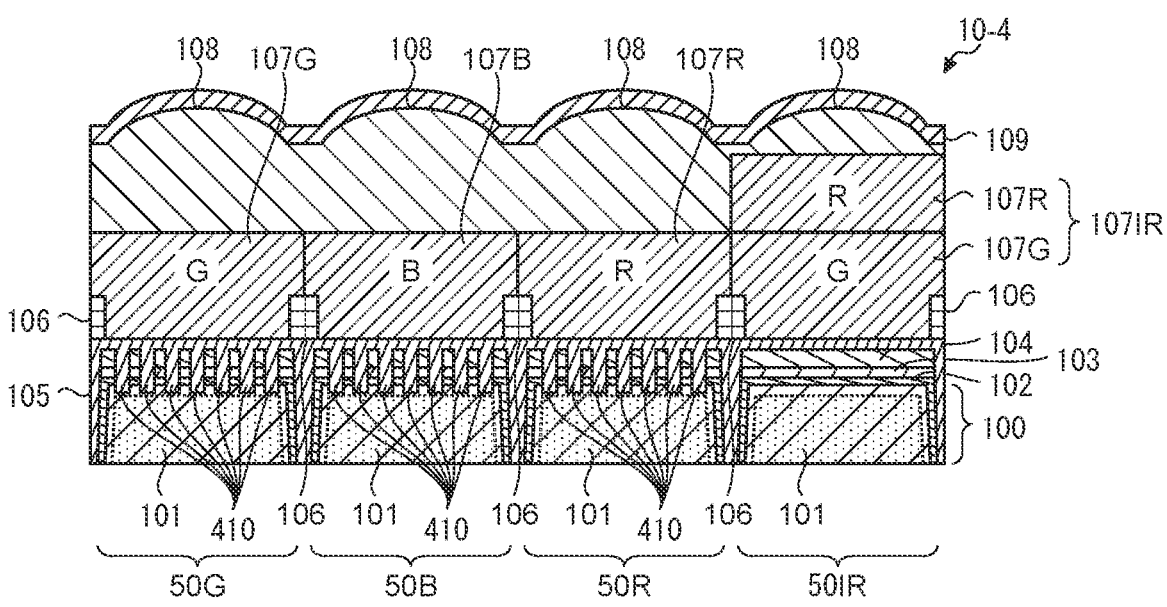
FIG. 23 is a cross-sectional diagram illustrating a cross-sectional structure example of a CMOS image sensor according to a fourth embodiment.

For example, as in a CMOS image sensor 10-4 exemplified in FIG. 23, at least a part of pillars 410 may be provided between the insulator film 105 and the photodiode PD.

For example, the pillar 410 between the insulator film 105 and the photodiode PD can be formed by forming a trench of a predetermined shape reaching the back surface of the semiconductor substrate 100 from the top surface of the anti-reflection film 104 through the insulator film 103 and filling the inside of the trench with predetermined material.

For example, the shape of the trench in which the pillar 410 is formed may be the same shape as the pillars 110, 211 and 212, or 310 exemplified in the above-mentioned first to third embodiments.

The material filled in the trench, that is, the material of the pillar 410, may be the same as or different from the material of the insulator film 105. For example, the insulator film 105 and the pillar 410 may be made of insulating material such as silicon oxide (SiO₂) or the insulator film 105 may be made of insulating material such as silicon oxide (SiO₂), and the pillar 410 may be made of silicon (Si) or gallium phosphide (GaP).

When the pillar 410 is made of the same material as the insulator film 105, the pillar 410 and the insulator film 105 can be manufactured at the same step.

Furthermore, it is preferred that the material used for the pillar 410 be insulating material. However, when the inner surface of the trench is covered with an insulator film, the material used for the pillar 410 is not limited to insulating material. In this case, the same material as the material of the pillar 110 exemplified in the first embodiment may be used for the pillar 410.

With the configuration described above, similarly to the first embodiment, the leakage of light to an adjacent pixel due to the increased height can be suppressed while the incidence of IR light to the unit pixels 50R, 50G, and 50B that acquire color images is suppressed, and hence image data having high color reproducibility can be acquired.

Other configurations, operations, and effects may be the same as those in the above-mentioned embodiments, and hence the detailed descriptions thereof are herein omitted.

5. Fifth Embodiment

In the above-mentioned first to fourth embodiments, the case where the color filters 107R, 107G, and 107B for the unit pixels 50R, 50G, and 50B that acquire color images of three primary colors of RGB are formed, respectively, so as to contact the top surface of the insulator film 105 formed on the back surface side of the semiconductor substrate 100 has been exemplified. However, the color filters are not limited to such a configuration.

Figure 24:
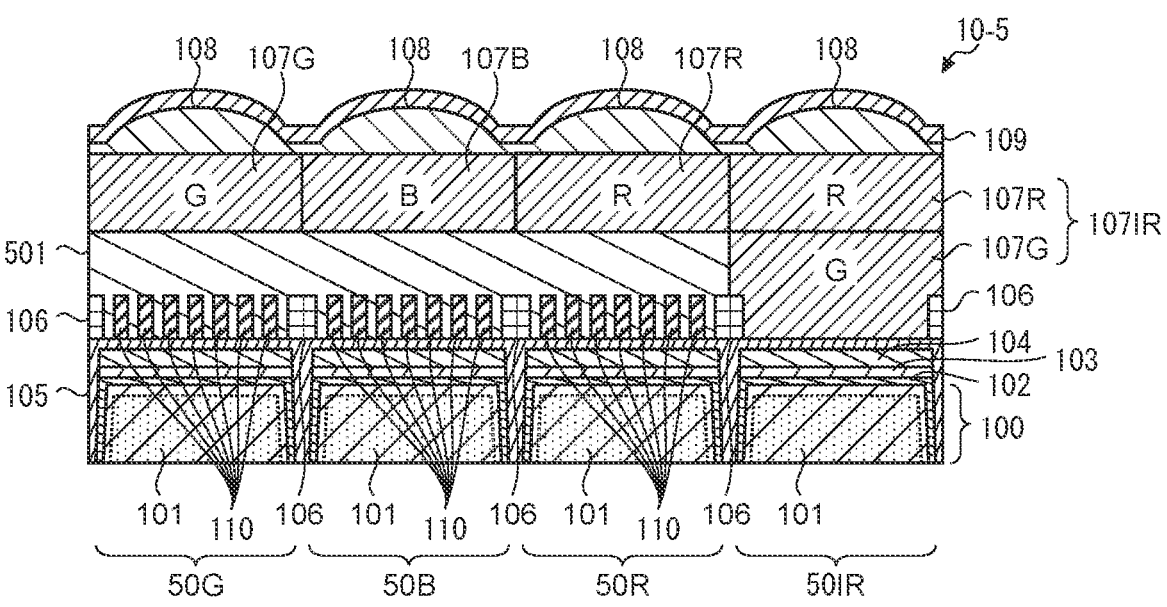
FIG. 24 is a cross-sectional diagram illustrating a cross-sectional structure example of a CMOS image sensor according to a fifth embodiment.

For example, as in a CMOS image sensor 10-5 exemplified in FIG. 24, for example, a planarization film 501 made of insulating material such as silicon nitride (SiN) may be provided on the top surface of the insulator film 105 formed on the back surface side of the semiconductor substrate 100, and the color filters 107R, 107G, and 107B may be disposed on the planarization film 501.

In this case, it is desired that the heights of the light incident surfaces (top surfaces) of the color filters 107R, 107G, and 107B substantially match the height of the light incident surface (top surface) of the color filter 107R on the upper layer side in the color filter 107IR. In this manner, the surface on which the on-chip lens 108 is formed can be planarized, and hence the manufacturing precision of the on-chip lens 108 can be improved.

In the fifth embodiment, for example, when the first to third embodiments are based (FIG. 24 illustrates a case based on the first embodiment), for example, the pillars 110, 211 and 212, or 310 may be formed inside the planarization film 501 and on the insulator film 105 formed on the back surface side of the semiconductor substrate 100.

With the configuration described above, similarly to the first embodiment, the incidence of IR light to the unit pixels 50R, 50G, and 50B that acquire color images can be suppressed, and hence image data having high color reproducibility can be acquired.

Other configurations, operations, and effects may be the same as those in the above-mentioned embodiments, and hence the detailed descriptions thereof are herein omitted.

6. Sixth Embodiment

In the above-mentioned first to fifth embodiments, the case where the color filter 107IR having the structure in which two color filters 107R and 107B are stacked is used as a color filter that selectively transmits IR light has been exemplified. However, the color filter is not limited to such a configuration.

Figure 25:
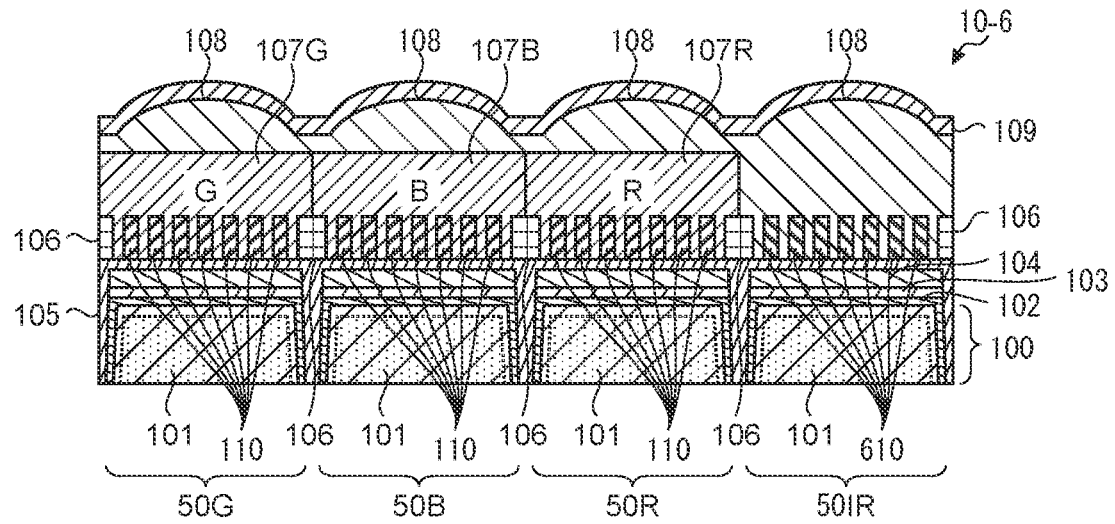
FIG. 25 is a cross-sectional diagram illustrating a cross-sectional structure example of a CMOS image sensor according to a sixth embodiment.

For example, as in a CMOS image sensor 10-6 exemplified in FIG. 25, in the unit pixel 50IR, a plurality of pillars 610 constituting a pillar array configured to selectively transmit IR light, in other words, capable of broadly absorbing light in a visible light region as a whole, may be provided on the insulator film 105 instead of the color filter 107IR having the structure in which two color filters 107R and 107B are stacked.

With such a configuration, the height of the entire color filter 107 can be decreased, and hence the leakage of light that has entered a unit pixel 50 to an adjacent pixel 50 can be further reduced. As a result, the color reproducibility of acquired image data can be further improved.

In FIG. 25, the case based on the cross-sectional structure of the CMOS image sensor 10 according to the first embodiment has been exemplified. However, the sixth embodiment is not limited to the first embodiment but may be based on another embodiment.

Other configurations, operations, and effects may be the same as those in the above-mentioned embodiments, and hence the detailed descriptions thereof are herein omitted.

7. Seventh Embodiment

In the above-mentioned first to sixth embodiments, the case where the pillar array that selectively absorbs IR light is disposed in the unit pixels 50R, 50G, and 50B that acquire color images of three primary colors of RGB has been exemplified. On the other hand, in a seventh embodiment, a case where the color filter 107 and the pillar array are combined to shape the wavelength spectrum of light entering the photodiodes PD in the unit pixels 50R, 50G, and 50B is described by way of examples. In the following description, a case based on the first embodiment is exemplified, but the basic embodiment is not limited to the first embodiment, and may be another embodiment described above or described later.

As described above, the pillar array configured by the pillars 110 can function as a particular wavelength absorption filter that selectively absorbs light having a particular wavelength, by changing the diameter of each pillar 110 and the pitch between the pillars 110.

Figure 26:
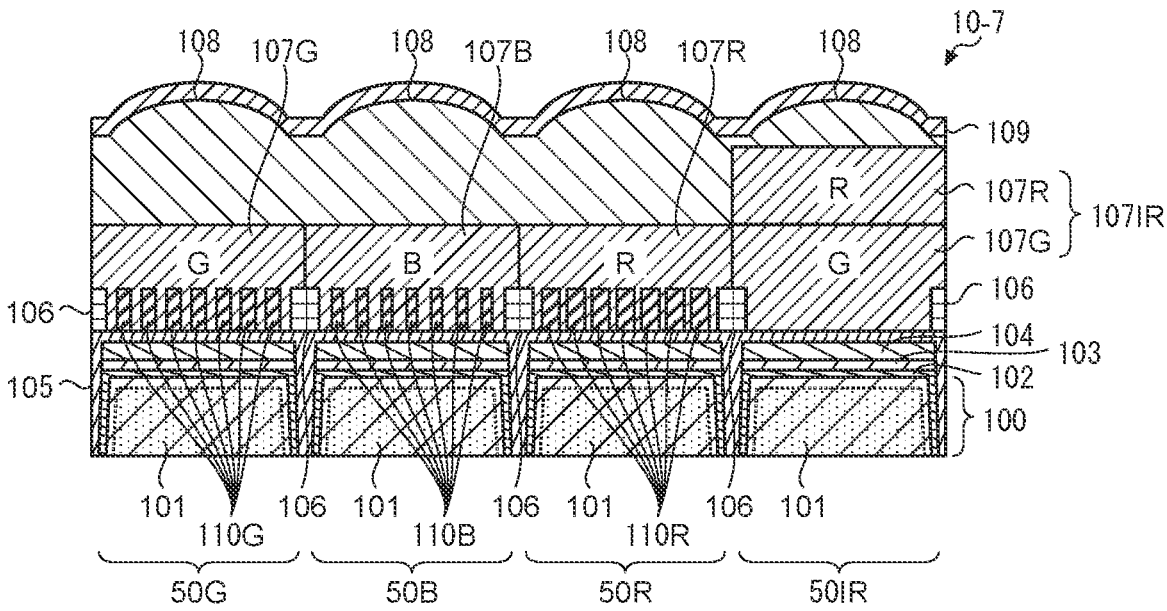
FIG. 26 is a cross-sectional diagram illustrating a cross-sectional structure example of a CMOS image sensor according to a seventh embodiment.

In view of the above, in the seventh embodiment, as in a CMOS image sensor 10-7 exemplified in FIG. 26, pillars 110R are disposed in the unit pixel 50R that receives light having a wavelength component of red (R), pillars 110G are disposed in the unit pixel 50G that receives light having a wavelength component of green (G), and pillars 110B are disposed in the unit pixel 50B that receives light having a wavelength component of blue (B).

Figure 27:
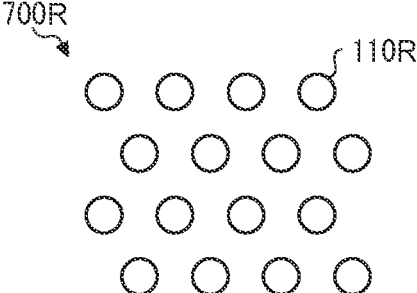
FIG. 27 is a layout diagram illustrating an arrangement example of a pillar array, according to the seventh embodiment, that transmits light having a wavelength component of red.

As exemplified in FIG. 27, in a pillar array 700R configured by the pillars 110R, the diameter of each pillar 110R and the pitch between the pillars 110R are set such that light having a wavelength component of red (R) is selectively transmitted. As exemplified in FIG. 28, in a pillar array 700G configured by the pillars 110G, the diameter of each pillar 110G and the pitch between the pillars 110G are set such that light having a wavelength component of green (G) is selectively transmitted. Furthermore, as exemplified in FIG. 29, in a pillar array 700B configured by the pillars 110B, the diameter of each pillar 110B and the pitch between the pillars 110B are set such that light having a wavelength component of blue (B) is selectively transmitted.

Figure 28:
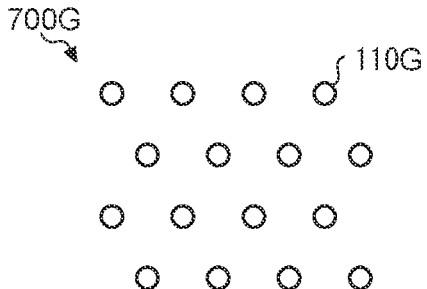
FIG. 28 is a layout diagram illustrating an arrangement example of a pillar array, according to the seventh embodiment, that transmits light having a wavelength component of green.
Figure 29:
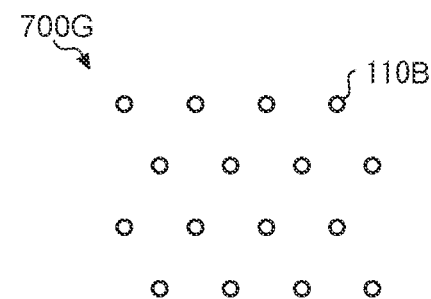
FIG. 29 is a layout diagram illustrating an arrangement example of a pillar array, according to the seventh embodiment, that transmits light having a wavelength component of blue.

As understood from the comparison of FIG. 27 to FIG. 29, the diameter of the pillar 110R is the largest and the diameter of the pillar 110B is the smallest among the pillars 110R, 110G, and 110B. This is because, as described above in the first embodiment with reference to FIG. 11 to FIG. 13, when the diameter of the pillar 110 is increased, the transmission peak wavelength or the absorption peak wavelength of the pillar array are shifted to the long wavelength side, and when the diameter of the pillar 110 is decreased, the transmission peak wavelength or the absorption peak wavelength of the pillar array are shifted to the short wavelength side.

FIG. 27 to FIG. 29 exemplify the case where the pitch in the pillar array configured by the pillars 110R, the pitch in the pillar array configured by the pillars 110G, and the pitch in the pillar array configured by the pillars 110B are the same. However, the pitches are not limited the same pitch, and can variously modified.

Figure 30:
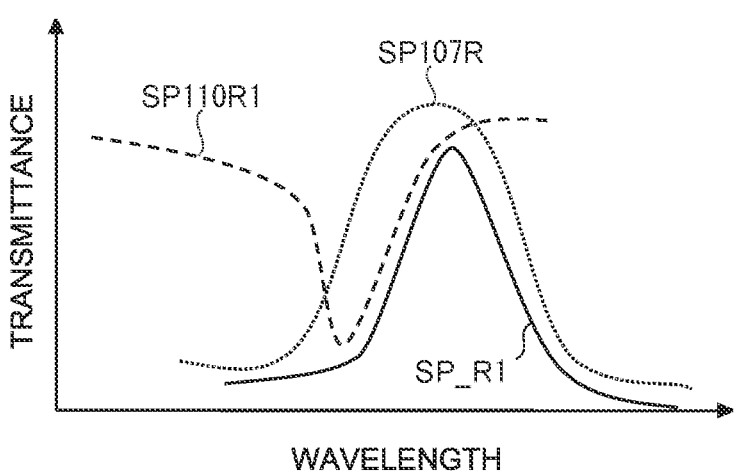
FIG. 30 is a diagram illustrating an example of a light transmission spectrum when a pillar array configured by pillars having different diameters is combined with the color filter, according to the seventh embodiment, that selectively transmits light having a wavelength component of red (No. 1).
Figure 31:
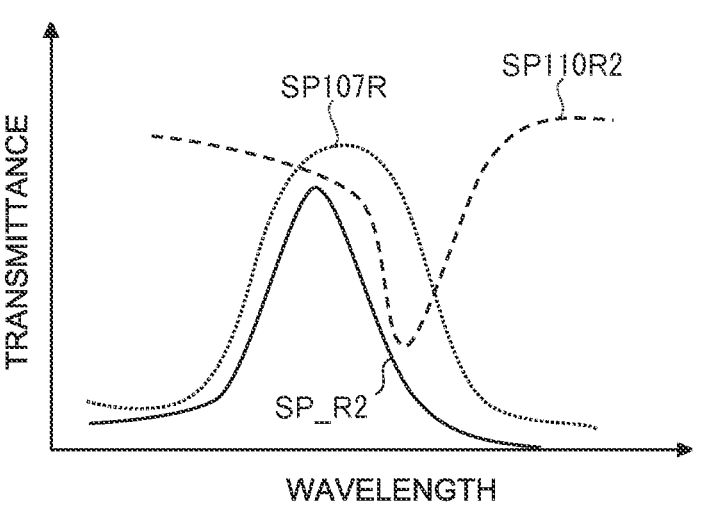
FIG. 31 is a diagram illustrating an example of a light transmission spectrum when a pillar array configured by pillars having different diameters is combined with the color filter, according to the seventh embodiment, that selectively transmits light having a wavelength component of red (No. 2).

FIG. 30 and FIG. 31 are diagrams illustrating examples of light transmission spectra when the color filter 107R that selectively transmits light having a wavelength component of red (R) is combined with the pillar array 700R configured by the pillars 110R having different diameters.

First, as illustrated in FIG. 30, when the color filter 107R is combined with a pillar array 700R designed such that the absorption peak wavelength is present on the shorter wavelength side than the transmission peak wavelength of a light transmission spectrum SP107R of the color filter 107R, a light transmission spectrum SP_R1 of a wavelength filter configured by the color filter 107R and the pillar array 700R is shifted to the longer wavelength side as a whole than the light transmission spectrum SP107R of the color filter 107R alone.

On the other hand, as illustrated in FIG. 31, when the color filter 107R is combined with a pillar array 700R designed such that the absorption peak wavelength is present on the longer wavelength side than the transmission peak wavelength of the light transmission spectrum SP107R of the color filter 107R, a light transmission spectrum SP_R2 of a wavelength filter configured by the color filter 107R and the pillar array 700R is shifted to the shorter wavelength side as a whole than the light transmission spectrum SP107R of the color filter 107R alone.

In this manner, by combining the color filter 107 and the pillar array, the wavelength spectrum of light transmitted through the color filter 107 and the pillar array to enter the photodiode PD can be shaped.

In view of the above, for example, by combining the color filters 107 that selectively transmit light having wavelength components of the same color with a pillar array that selectively absorbs a different wavelength component, image data based on light beams that are of the same type of color but at least a part of wavelength components of which do not overlap can be generated (multi-spectrum). For example, by providing a unit pixel 50R in which the color filter 107R is combined with a pillar array 700R having a light transmission spectrum SP110R1 exemplified in FIG. 30 and a unit pixel 50R in which the color filter 107R is combined with a pillar array 700R having a light transmission spectrum SP110R2 exemplified in FIG. 31, two pieces of image data based on light beams that are of a color in the same red range but at least a part of wavelength components of which do not overlap can be generated.

The shaping of the wavelength spectrum described above with reference to FIG. 30 and FIG. 31 can be applied to not only the wavelength component of red (R) but also other wavelength components of green (G) and blue (B) similarly.

As described above, in the seventh embodiment, by combining the color filter 107 and the pillar array, the wavelength spectrum of light transmitted through the color filter 107 and the pillar array to enter the photodiode PD can be shaped. Consequently, the multi-spectrum of image data that can be acquired can be obtained, and hence image data having higher color reproducibility can be acquired.

As in the seventh embodiment, by combining a pillar array that selectively absorbs light in a particular wavelength band with the color filter 107, light that has leaked from an adjacent pixel 50 can be attenuated similarly to the above-mentioned embodiments, and hence image data having higher color reproducibility can be acquired. Other configurations, operations, and effects may be the same as those in the above-mentioned embodiments, and hence the detailed descriptions thereof are herein omitted.

8. Eighth Embodiment

Next, an eighth embodiment is described in detail with reference to the drawings.

As exemplified in the above-mentioned embodiments, for example, as a configuration for acquiring color images of three primary colors of RGB, the configuration in which the unit pixels 50R, 50G, and 50B that acquire the color images are provided with the color filters 107R, 107G, and 107B that selectively transmit wavelength components of allocated colors, respectively, can be employed.

However, in a general light absorbing color filter, its spectroscopic characteristics (light absorption spectrum) exhibit a gentle curve. Thus, light having wavelength components out of a wavelength band to be transmitted, in particular, light having a wavelength component corresponding to a boundary part thereof is not sufficiently attenuated, and colors are mixed among pixels responsible for different wavelength components. As a result, the color reproducibility may reduce.

In view of the above, in the eighth embodiment, a color filter and a pillar array are combined so that spectroscopic characteristics of a wavelength filter (hereinafter referred to as "combined filter") configured by a combination of the color filter and the pillar array are adjusted, thereby improving the color reproducibility.

In the following description, the case based on the first embodiment is exemplified. The basic embodiment is not limited to the first embodiment, and may be another embodiment described above or described below. In the following description, overlapping descriptions of the same configurations, operations, and effects as the configurations, operations, and effects according to the above-mentioned embodiments are omitted by reference.

8.1 Layout Example of Color Filters

Figure 32:
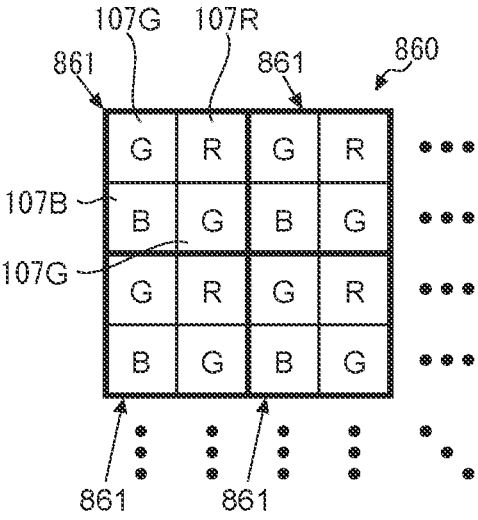
FIG. 32 is a diagram illustrating a layout example of color filters according to an eighth embodiment.

FIG. 32 is a diagram illustrating a layout example of color filters according to the eighth embodiment. As illustrated in FIG. 32, for example, Bayer arrangement is employed as color filter arrangement of a color filter array 860 according to the eighth embodiment. Thus, for example, this unit pattern 861 includes four color filters in total, that is, a color filter 107R that selectively transmits light having a wavelength component of red (R), two color filters 107G that selectively transmits light having a wavelength component of green (G), and a color filter 107B that selectively transmits light having a wavelength component of blue (B).

However, the color filter arrangement that can be applied to the color filter array 860 according to the eighth embodiment is not limited to Bayer arrangement. Similarly to the above-mentioned first embodiment, for example, various kinds of color filter arrangement such as X-Trans (registered trademark) color filter arrangement, quad Bayer arrangement, and white RGB color filter arrangement can be applied.

8.2 Cross-Sectional Structure Example of Unit Pixel

Figure 33:
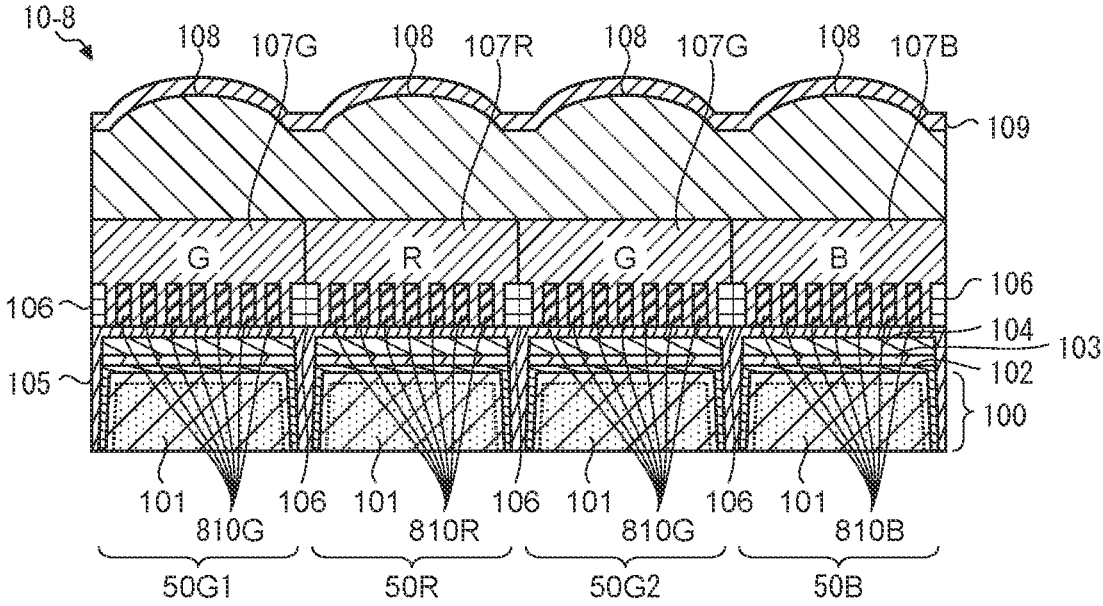
FIG. 33 is a cross-sectional diagram illustrating a cross-sectional structure example of a CMOS image sensor according to the eighth embodiment.

FIG. 33 is a cross-sectional diagram illustrating a cross-sectional structure example of a CMOS image sensor according to the eighth embodiment. Similarly to FIG. 7 in the first embodiment, for example, FIG. 33 illustrates a cross-sectional structure example of the photoreceiver chip 71 in FIG. 6, and omits a cross-sectional structure example of the circuitry chip 72. In FIG. 33, wiring layers constituting electrical connection from the transfer transistor 51 and the photoreceiver chip 71 to the circuitry chip 72 are also omitted. For the sake of description, FIG. 33 exemplifies a case where four unit pixels 50B, 50R, 50G1, and 50G2 constituting a unit pattern 861 in Bayer arrangement are arranged in a row along the cross section.

As exemplified in FIG. 33, in a CMOS image sensor 10-8 according to the eighth embodiment, a color filter 107R in the unit pixel 50R that generates a pixel signal based on light having a wavelength component corresponding to red is combined with a pillar array configured by a plurality of pillars 810R. Similarly, color filters 107G in the unit pixels 50G1 and 50G2 that generate pixel signals based on light having a wavelength component corresponding to green are each combined with a pillar array configured by a plurality of pillars 810G, and a color filter 107B in the unit pixel 50B that generates a pixel signal based on light having a wavelength component corresponding to blue is combined with a pillar array configured by a plurality of pillars 810B.

For example, similarly to the pillars 110 in the first embodiment, the positions of the pillars 810 may be on the top surface of the insulator film 105 formed on the back surface side of the semiconductor substrate 100 and inside the color filter 107. For example, the other configurations may be the same as those in the cross-sectional structure example of the unit pixel 50 describe above in the first embodiment with reference to FIG. 7.

8.3 Spectroscopic Characteristics of Combined Filters

Figure 34:
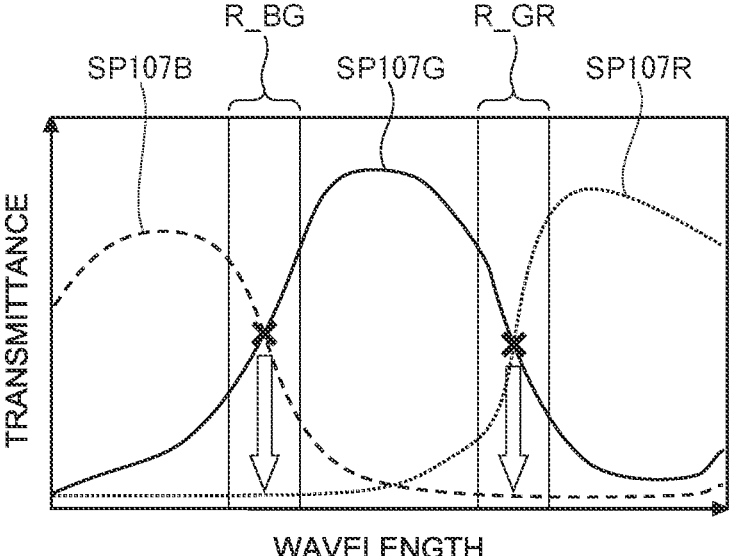
FIG. 34 is a diagram for explaining spectroscopic characteristics of combined filters according to the eighth embodiment.

FIG. 34 is a diagram for explaining spectroscopic characteristics (light transmission spectra) of the combined filters according to the eighth embodiment. As illustrated in FIG. 34, for example, in both a light transmission spectrum SP107B of the color filter 107B and a light transmission spectrum SP107G of the color filter 107G, the transmittance of light near a boundary part R_BG is not sufficiently reduced, and colors of light are mixed. Similarly, for example, in both the light transmission spectrum SP107G of the color filter 107G and a light transmission spectrum SP107R of the color filter 107R, the transmittance of light near a boundary part R_GR is not sufficiently reduced, and colors of light are mixed. The region near the boundary part may be a wavelength region including a band of the boundary part and its neighborhood band.

Figure 35:
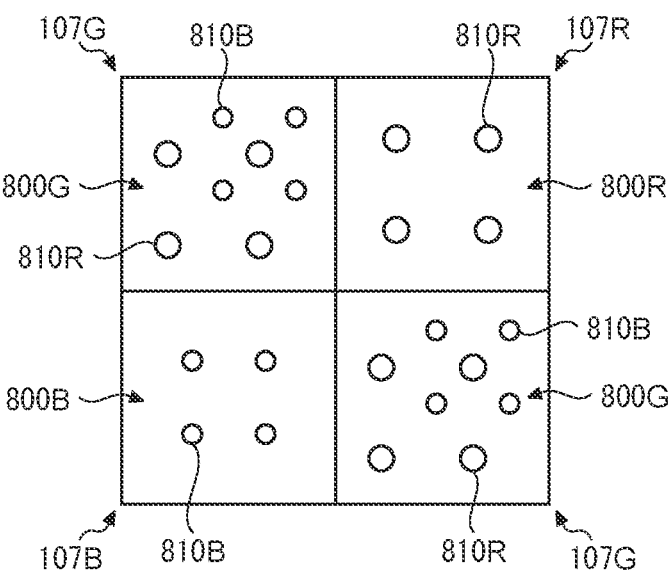
FIG. 35 is a layout diagram illustrating an arrangement example of pillars for each unit pixel according to the eighth embodiment.

In view of the above, in the eighth embodiment, as exemplified in FIG. 35, the color filter 107B is combined with a pillar array 800B (corresponding to the pillars 810B) that selectively absorbs light in a wavelength band corresponding to the vicinity of the boundary part R_BG. The color filter 107R is combined with a pillar array 800R (corresponding to the pillars 810R) that selectively absorbs light in a wavelength band corresponding to the vicinity of the boundary part R_GR.

On the other hand, the color filter 107G is combined with a pillar array 800G (corresponding to the pillars 810G) in which a pillar array that selectively absorbs light in a wavelength band corresponding to the vicinity of the boundary part R_BG and a pillar array that selectively absorbs light in a wavelength band corresponding to the vicinity of the boundary part R_GR are combined.

In this manner, light transmitted through the combined filter and having a wavelength component corresponding to the vicinity of the boundary part R_BG and light transmitted through the combined filter and having a wavelength component corresponding to the vicinity of the boundary part R_GR are attenuated, and hence the mixing of colors among pixels can be reduced to improve the color reproducibility.

Figure 36:
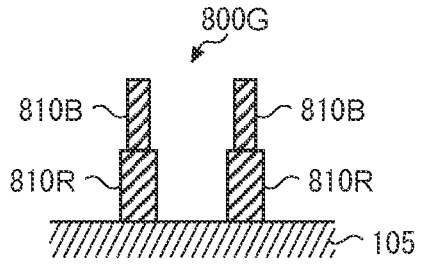
FIG. 36 is a cross-sectional diagram illustrating a configuration example of a pillar array, according to the eighth embodiment, that selectively transmits light having a wavelength component of green.

The pillar array 800G may have a configuration in which the pillar array 800B and the pillar array 800R are disposed on the same plane (top surface of insulator film 105) as exemplified in FIG. 35, and may have a configuration in which the pillar array 800B and the pillar array 800R are vertically stacked as exemplified in FIG. 36. When the pillar array 800B and the pillar array 800R are vertically stacked, the pitch between the pillars 810B constituting the pillar array 800B and the pitch between the pillars 810R constituting the pillar array 800R may be substantially the same. Of the pillar array 800B and the pillar array 800R, a pillar array having a larger diameter of the pillar 810 (for example, pillar 810R) is desirably formed in the lower stage.

8.4 Actions and Effects

With the configuration described above, according to the eighth embodiment, light having wavelength components corresponding to the vicinity of a boundary part of light transmission spectra of different color filters 107 can be sufficiently attenuated. Consequently, the mixing of colors among pixels responsible for different wavelength components can be reduced to improve the color reproducibility of acquired image data. Other configurations, operations, and effects may be the same as those in the above-mentioned embodiments, and hence the detailed descriptions thereof are herein omitted.

9. Ninth Embodiment

In the above-mentioned eighth embodiment, the case where the pillar arrays configured to absorb light having wavelength components corresponding to the vicinity of a boundary part in light transmission spectra of different color filters 107 are combined with the color filter 107 has been described by way of examples. In a ninth embodiment, a case where a pillar array configured to absorb light having a wavelength component corresponding to a tail part of a light transmission spectrum of a color filter 107 is combined with the color filter 107 is described by way of examples.

In the following description, the case based on the eighth embodiment is exemplified. The basic embodiment is not limited to the eighth embodiment, and may be another embodiment described above or described below. In the following description, overlapping descriptions of the same configurations, operations, and effects as the configurations, operations, and effects according to the above-mentioned embodiments are omitted by reference.

9.1 Spectroscopic Characteristics of Combined Filter

Figure 37:
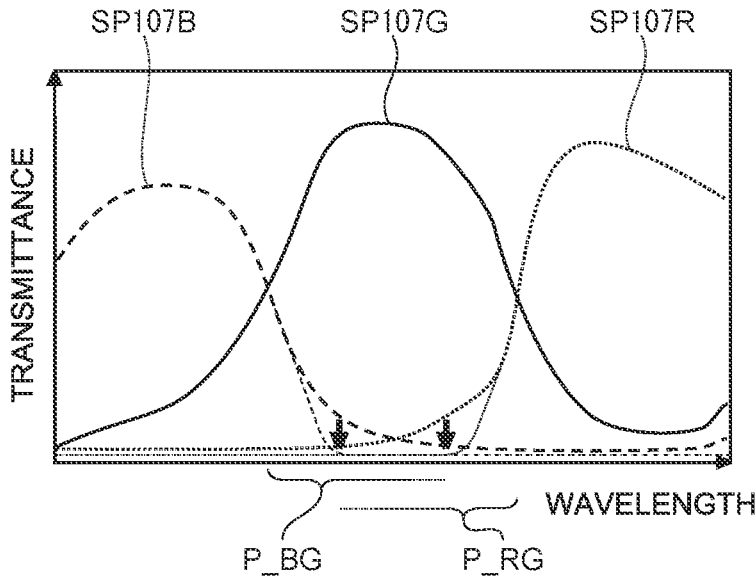
FIG. 37 is a diagram for explaining spectroscopic characteristics of combined filters according to a ninth embodiment.

FIG. 37 is a diagram for explaining spectroscopic characteristics (light transmission spectra) of combined filters according to the ninth embodiment. As mentioned above in the eighth embodiment, it cannot be said that the transmittance near a boundary part of light transmission spectra of color filters 107 that selectively transmit light having different wavelength components is sufficiently reduced. However, the transmittance of a tail part of the light transmission spectrum of the color filter 107 can be reduced by combining the color filter 107 with a pillar array.

In view of the above, in the ninth embodiment, as illustrated in FIG. 37, for example, light having a wavelength component at a tail part P_BG on the longer wavelength side in the light transmission spectrum of the color filter 107B that selectively transmits light having a wavelength component of blue (B), that is, on the green side, is attenuated by using a pillar array. Similarly, light having a wavelength component at a tail part P_RG on the shorter wavelength side in the light transmission spectrum of the color filter 107R that selectively transmits light having a wavelength component of red (R), that is, on the green side, is attenuated by using a pillar array.

In this manner, light having a wavelength component at the tail part P_BG in light entering the unit pixel 50B can be attenuated, and hence the color reproducibility of a pixel signal generated by the unit pixel 50G can be improved. Similarly, light having a wavelength component at the tail part P_RG in light entering the unit pixel 50R can be attenuated, and hence the color reproducibility of a pixel signal generated by the unit pixel 50B can be improved.

9.2 Cross-Sectional Structure Example of Unit Pixel

Figure 38:
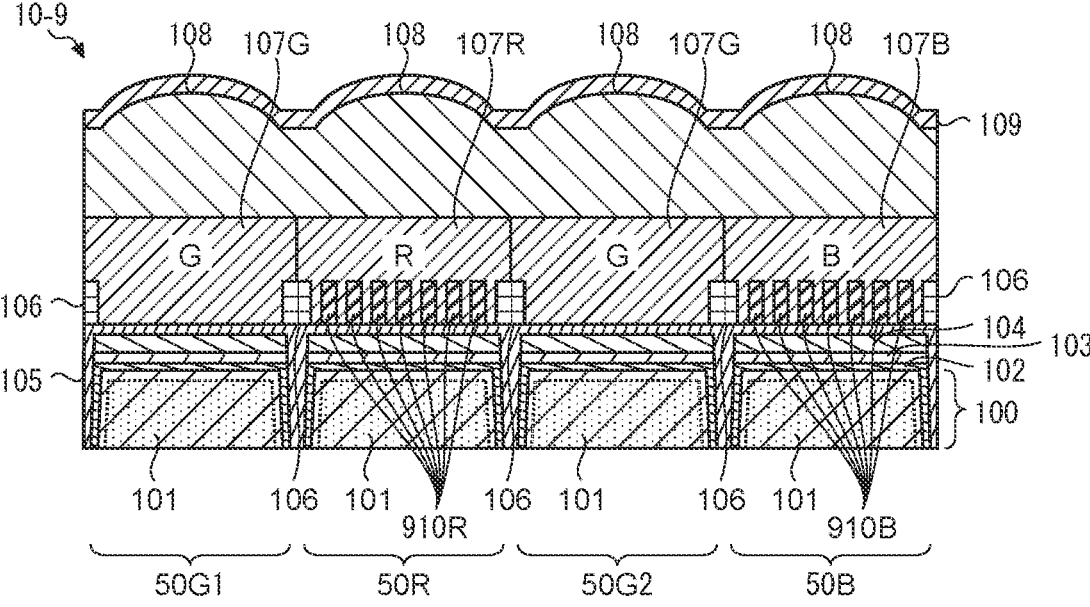
FIG. 38 is a cross-sectional diagram illustrating a cross-sectional structure example of a CMOS image sensor according to the ninth embodiment.

FIG. 38 is a cross-sectional diagram illustrating a cross-sectional structure example of a CMOS image sensor according to the ninth embodiment. For example, FIG. 38 illustrates a cross-section corresponding to the cross section of the CMOS image sensor 10-8 illustrated in FIG. 33 in the eighth embodiment.

In a CMOS image sensor 10-9 exemplified in FIG. 38, for example, in the same configuration as in the CMOS image sensor 10-8 exemplified in FIG. 33, the pillars 810G in the unit pixels 50G1 and 50G2 are omitted, and the pillars 810R and 810B in the unit pixels 50R and 50B are replaced with pillars 910R and 910B. The other configurations may be the same as in the CMOS image sensor 10-8 exemplified in FIG. 33.

9.3 Plan Layout Example of Pillars

Figure 39:
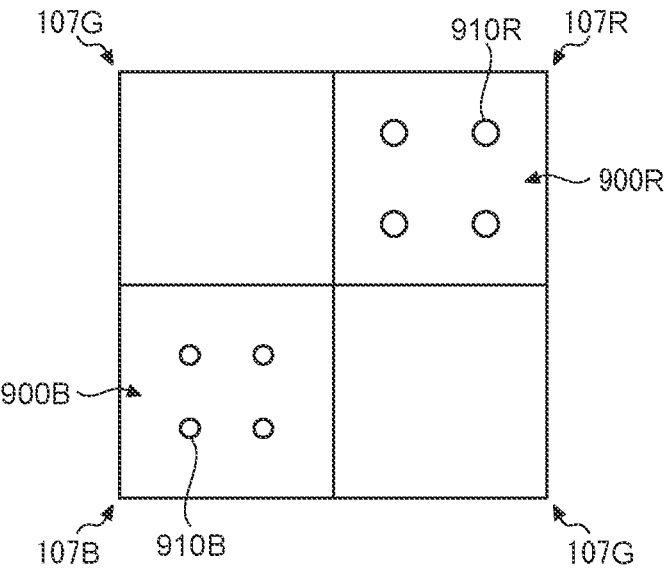
FIG. 39 is a diagram illustrating a plan layout example of pillars according to the ninth embodiment.

FIG. 39 is a diagram illustrating a plan layout example of the pillars 910 disposed in the color filters 107 in the unit pixels 50 constituting a unit pattern in Bayer arrangement. As illustrated in FIG. 39, in the ninth embodiment, a pillar array 900B (corresponding to the pillars 910B) that selectively absorbs light having a wavelength component at the tail part P_BG is disposed on the color filter 107B in the unit pixel 50B. A pillar array 900R (corresponding to the pillars 910R) that selectively absorbs light having a wavelength component at the tail part P_RG is disposed on the color filter 107R in the unit pixel 50R. In the color filters 107G in the unit pixels 50G1 and 50G2, pillar arrays are not necessarily required to be disposed.

9.4 Diameter and Pitch of Pillars

For example, the diameter of each pillar 910B constituting the pillar array 900B combined with the color filter 107B can be set in the range of 80 to 120 nm. For example, the pitch between the pillars 910B in the pillar array 900B can be set to 320 nm.

On the other hand, for example, the diameter of each pillar 910R constituting the pillar array 900R combined with the color filter 107R can be set in the range of 60 to 80 nm. For example, the pitch between the pillars 910R in the pillar array 900R can be set to 320 nm.

However, the diameters of the pillars 910B and 910R and the pitches between the pillars 910B or 910R are not limited to the above-mentioned values, and may be changed as appropriate depending on the materials of the pillars 910B and 910R.

9.5 Actions and Effects

With the configuration described above, according to the ninth embodiment, light having wavelength components corresponding to tail parts of light transmission spectra of different color filters 107 can be sufficiently attenuated. Consequently, the mixing of colors among pixels responsible for different wavelength components can be reduced to improve the color reproducibility of acquired image data.

Other configurations, operations, and effects may be the same as those in the above-mentioned embodiments, and hence the detailed descriptions thereof are herein omitted.

10. Tenth Embodiment

In the above-mentioned ninth embodiment, the case where light having a wavelength component at the tail part P_BG on the green side of the light transmission spectrum of the color filter 107B that selectively transmits light having a wavelength component of blue (B) is attenuated and light having a wavelength component at the tail part P_GR on the green side of the light transmission spectrum of the color filter 107R that selectively transmits light having a wavelength component of red (R) is attenuated to reduce the mixing of colors among pixels responsible for different wavelength components and improve the color reproducibility of image data has been described by way of examples.

Figure 40:
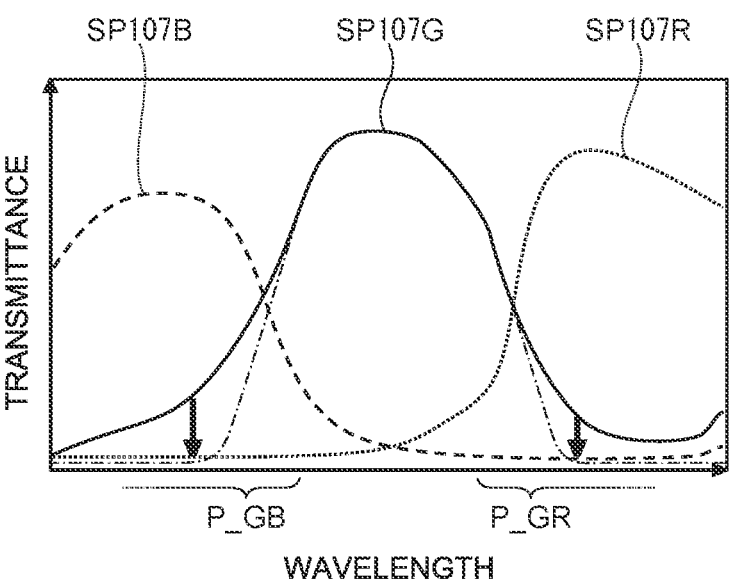
FIG. 40 is a diagram for explaining spectroscopic characteristics of combined filters according to a tenth embodiment.

However, the method for reducing the mixing of colors among pixels responsible for different wavelength components to improve the color reproducibility of image data is not limited to the method exemplified in the ninth embodiment. For example, as exemplified in FIG. 40, a method for attenuating light having a wavelength component at a tail part P_GB on the blue side and light having a wavelength component at a tail part P_GR on the red side of the light transmission spectrum of the color filter 107B that selectively transmits light having a wavelength component of green (G) can be employed.

Figure 41:
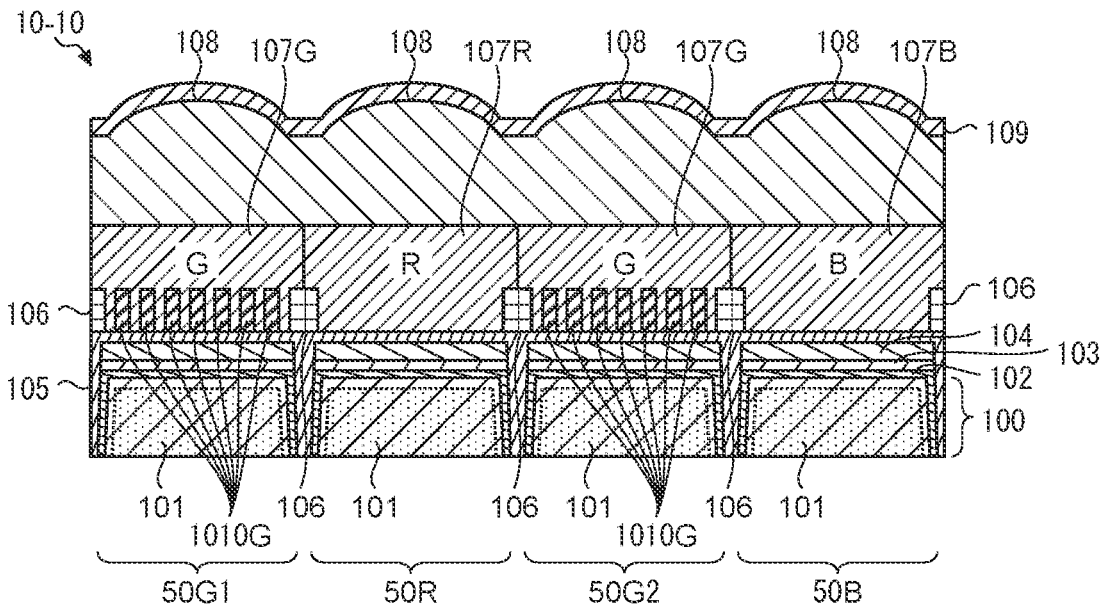
FIG. 41 is a cross-sectional diagram illustrating a cross-sectional structure example of a CMOS image sensor according to the tenth embodiment.

In this case, for example, as in a CMOS image sensor 10-10 exemplified in FIG. 41, the unit pixels 50G1 and 50G2 that generate pixel signals based on light having a wavelength component corresponding to green are combined with a pillar array configured by a plurality of pillars 1010G.

For example, similarly to the pillars 110 in the first embodiment, the positions of the pillars 1010G may be on the top surface of the insulator film 105 formed on the back surface side of the semiconductor substrate 100 and inside the color filter 107.

In the color filter 107, in other words, the layout of a pillar array 1000G configured by the pillars 1010G on the insulator film 105 can be, for example, similarly to the layout of the pillar array 800G described above in the eighth embodiment with reference to FIG. 35, a layout in which a plurality of pillars 1010GB constituting a pillar array that selectively absorbs light in a wavelength band corresponding to a tail part P_GB and a plurality of pillars 1010GR constituting a pillar array that selectively absorbs light in a wavelength band corresponding to a tail part P_GR are combined. The pillars 1010GR and 1010GB correspond to the pillars 1010G in FIG. 41.

In this manner, light transmitted through the combined filter and having a wavelength component corresponding to the tail part P_GB and light transmitted through the combined filter and having a wavelength component corresponding to the tail part P_GR are attenuated. Thus, the mixing of colors among pixels can be reduced to improve the color reproducibility.

Figure 42:
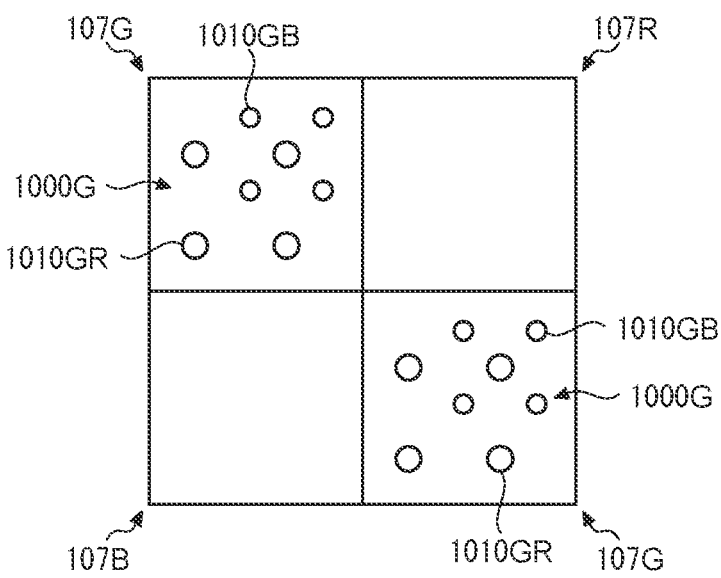
FIG. 42 is a diagram illustrating a plan layout example of pillars according to the tenth embodiment.

The pillar array 1000G is not limited to the configuration in which the pillar 1010GR and the pillar 1010GB are disposed in the same plane (top surface of insulator film 105) as exemplified in FIG. 42, and may be, for example, the configuration in which the pillar array 1010GR and the pillars 1010GB are vertically stacked as described above in the eighth embodiment with reference to FIG. 36.

For example, the diameter of each pillar 1010GB can be set in the range of 60 to 80 nm. For example, the pitch between the pillars 1010GB can be set to 280 nm.

On the other hand, for example, the diameter of each pillar 1010GR can be set in the range of 100 to 130 nm, and, for example, the pitch between the pillars 1010GR can be set to 400 nm.

However, the diameters of the pillars 1010GB and 1010GR and the pitch between the pillars 1010GB or 1010GR are not limited to the above-mentioned values, and may be changed as appropriate depending on the materials of the pillars 1010GB and 1010GR.

With the configuration described above, according to the tenth embodiment, light having wavelength components corresponding to the vicinity of a tail part of light transmission spectra of different color filters 107 can be sufficiently attenuated. Consequently, the mixing of colors among pixels responsible for different wavelength components can be reduced to improve the color reproducibility of acquired image data.

Other configurations, operations, and effects may be the same as those in the above-mentioned embodiments, and hence the detailed descriptions thereof are herein omitted.

11. Eleventh Embodiment

The configuration according to the ninth embodiment and the configuration according to the tenth embodiment described above can be combined.

Figure 43:
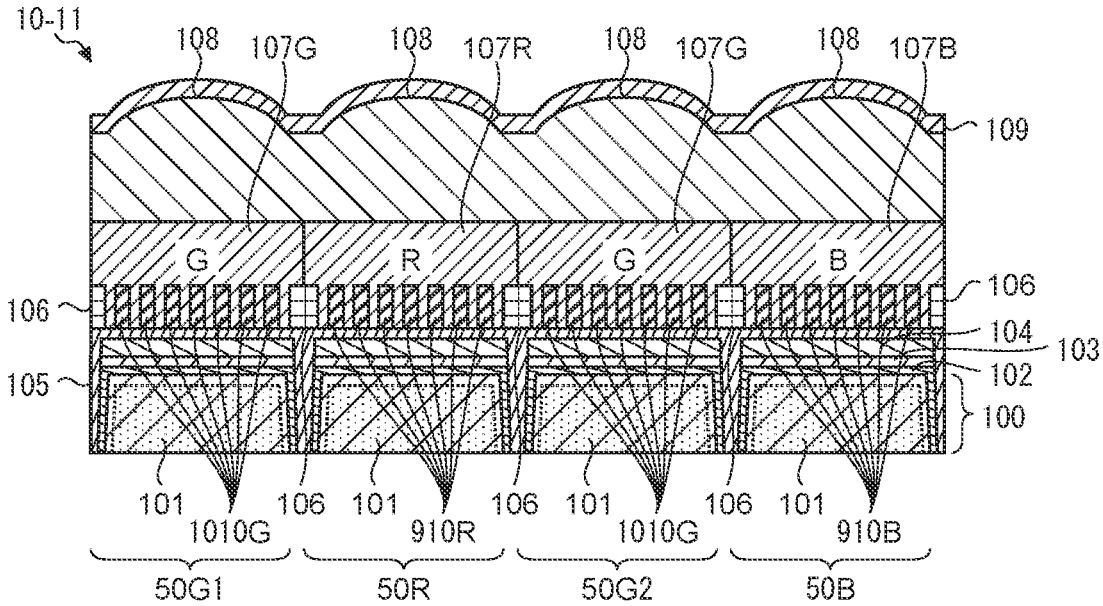
FIG. 43 is a cross-sectional diagram illustrating a cross-sectional structure example of a CMOS image sensor according to an eleventh embodiment.

In this case, for example, as in a CMOS image sensor 10-11 exemplified in FIG. 43, a pillar array configured by a plurality of pillars 910R is disposed in the unit pixel 50R, a pillar array configured by a plurality of pillars 910B is disposed in the unit pixel 50B, and pillar arrays configured by a plurality of pillars 1010G (corresponding to 1010GR and 1010GB) are disposed in the unit pixels 50G1 and 50G2.

Figure 44:
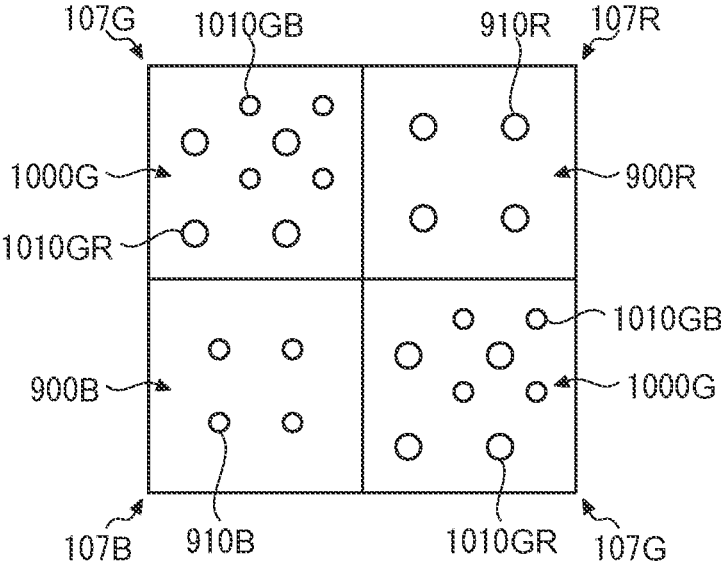
FIG. 44 is a diagram illustrating a plan layout example of pillars according to the eleventh embodiment.

For example, the plan layout of pillar arrays disposed in the color filters 107R, 107G, and 107B in the unit pixels 50R, 50G1, 50G2, and 50B may be, as exemplified in FIG. 44, a layout in which the plan layout of the pillar arrays 900R and 900B exemplified above in the ninth embodiment with reference to FIG. 39 and the plan layout of the pillar array 1000G exemplified above in the tenth embodiment with reference to FIG. 42 are combined. However, the pillar array 1000G is not limited to the configuration in which the pillars 1010GR and the pillars 1010GB are disposed in the same plane (top surface of insulator film 105), and may be, for example, the configuration in which the pillar array 1010GR and the pillars 1010GB are vertically stacked as described above in the eighth embodiment with reference to FIG. 36.

Figure 45:
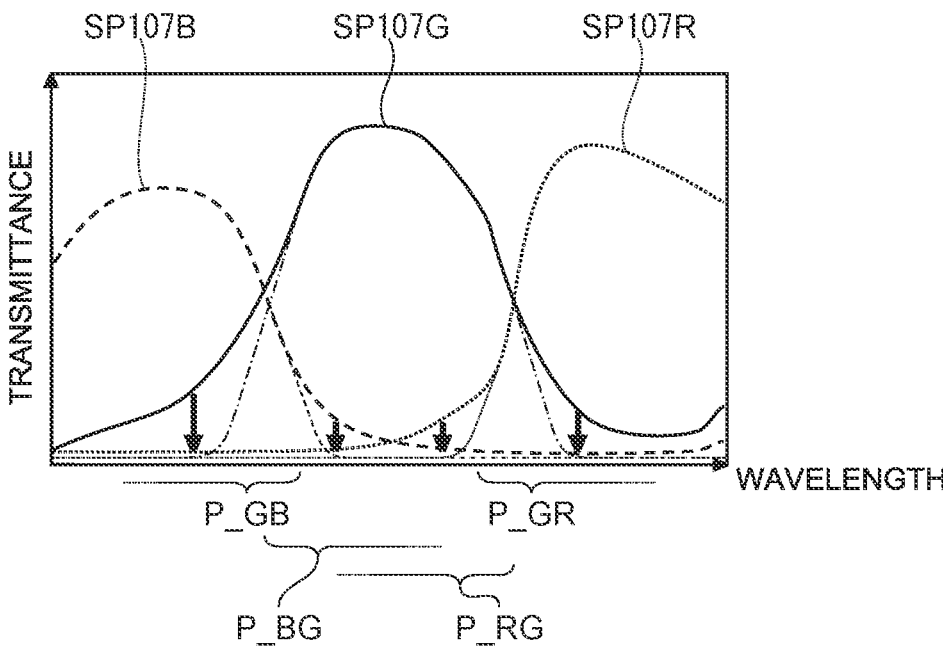
FIG. 45 is a diagram for explaining spectroscopic characteristics of combined filters according to the eleventh embodiment.

With the configuration described above, as exemplified in FIG. 45, light having a wavelength component at the tail part P_BG in light entering the unit pixel 50B and light having a wavelength component at the tail part P_RG in light entering the unit pixel 50R can be attenuated, and light having wavelength components at tail parts P_GR and P_GB in light entering the unit pixels 50G1 and 50G2 can be attenuated. Consequently, the mixing of colors among pixels responsible for different wavelength components can be further reduced to further improve the color reproducibility of acquired image data.

Other configurations, operations, and effects may be the same as those in the above-mentioned embodiments, and hence the detailed descriptions thereof are herein omitted.

12. Twelfth Embodiment

Next, a twelfth embodiment is described in detail with reference to the drawings.

When color filter arrangement such as quad Bayer arrangement in which color filters 107 that transmit light having the same wavelength component are adjacent is employed, as an intrinsic problem, there may be a case where a difference in sensitivity occurs between the unit pixel 50R or 50B to which the unit pixel 50G including the color filter 107G on the side where the image height is higher is adjacent and the unit pixel 50R or 50B to which the unit pixel 50R or 50B including the color filter 107R or 106B that selectively transmits light having the same wavelength component on the side where the image height is higher is adjacent. In other words, there may be a case where the difference in sensitivity occurs between adjacent pixels 50 that generate pixel signals based on light having the same wavelength component (hereinafter referred to as "adjacent pixels 50 of same color").

It is considered that this is because a part of light entering a photodiode PD in the unit pixel 50R or 50B located on the side where the image height is higher among the adjacent pixels 50 of the same color is absorbed and attenuated by the color filter 107G adjacent on the side where the image height is higher.

Such a problem becomes severe in a region where light obliquely enters and the image height is high.

In view of the above, in the twelfth embodiment, when color filter arrangement such as quad Bayer arrangement in which color filters 107 that transmit light having the same wavelength component are adjacent is employed, the difference in sensitivity caused between adjacent pixels 50 provided with the color filters 107 that transmit light having the same wavelength component can be reduced.

In the following description, a case where quad Bayer arrangement is employed as color filter arrangement is exemplified. In the following description, the case based on the eighth embodiment is exemplified. The basic embodiment is not limited to the eighth embodiment, and may be another embodiment described above or described below. In the following description, overlapping descriptions of the same configurations, operations, and effects as the configurations, operations, and effects according to the above-mentioned embodiments are omitted by reference.

12.1 Layout of Pixel Array

Figure 46:
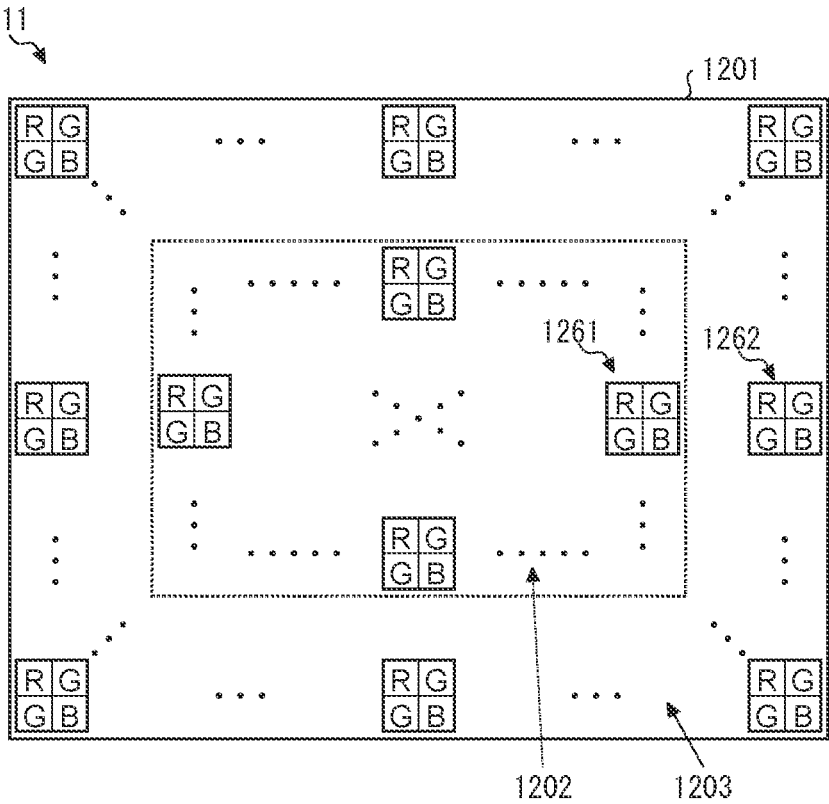
FIG. 46 is a plan diagram illustrating a layout example of a pixel array according to a twelfth embodiment.

FIG. 46 is a plan diagram illustrating a layout example of a pixel array according to the twelfth embodiment. As illustrated in FIG. 46, in the twelfth embodiment, an effective pixel region 1201 in a pixel array 11 in which a plurality of unit pixels 50 are arranged in accordance with quad Bayer arrangement is sectioned into a center region 1202 and a peripheral region 1203 based on the image height. The effective pixel region 1201 may be a region in which unit pixels 50 that may be targets from which pixel signals constituting image data are read are arranged. The center region 1202 may be, for example, a region in which the image height is 80% or less, and the peripheral region 1203 may be a region in which the image height is higher than 80%. However, these numerals are merely specific examples, and can be variously changed.

12.2 Center Region 12.2.1 Layout of Unit Pattern

Figure 47:
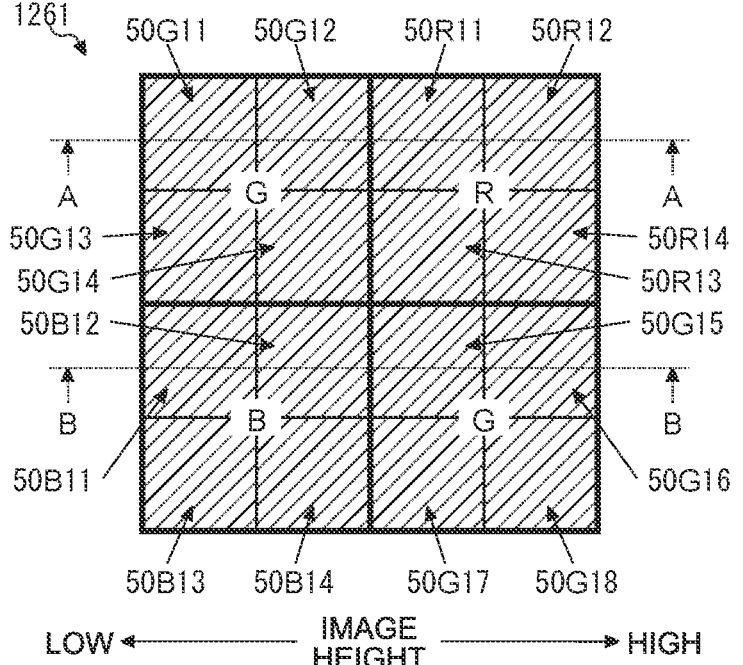
FIG. 47 is a diagram illustrating a plan layout of unit pattern belonging to a center region in FIG. 46.

FIG. 47 is a diagram illustrating a plan layout of a unit pattern 1261 belonging to the center region 1202 in FIG. 46. As illustrated in FIG. 47, when color filter arrangement is quad Bayer arrangement, for example, in the unit pattern 1261 in quad Bayer arrangement, unit pixels 50G11 to 50G14 including a color filter 107G are disposed at four pixels in total of 2×2 pixels located on the upper left, unit pixels 50R11 to 50R14 including a color filter 107R are disposed at four pixels in total of 2×2 pixels located on the upper right, unit pixels 50B11 to 50B14 including a color filter 107B are disposed at four pixels in total of 2×2 pixels located on the lower left, and unit pixels 50G15 to 50G18 including a color filter 107G are disposed at four pixels in total of 2×2 pixels located on the lower right.

12.2.2 Cross-Sectional Structure of Unit Pixel

Figure 48:
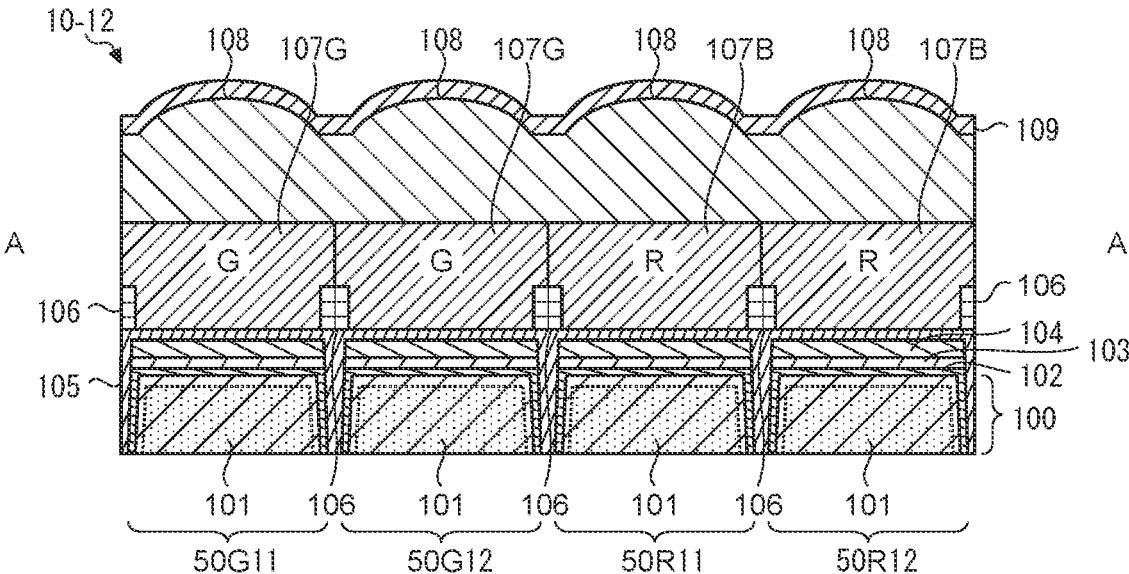
FIG. 48 is a cross-sectional diagram illustrating a cross-sectional structure of a surface A-A in FIG. 47.
Figure 49:
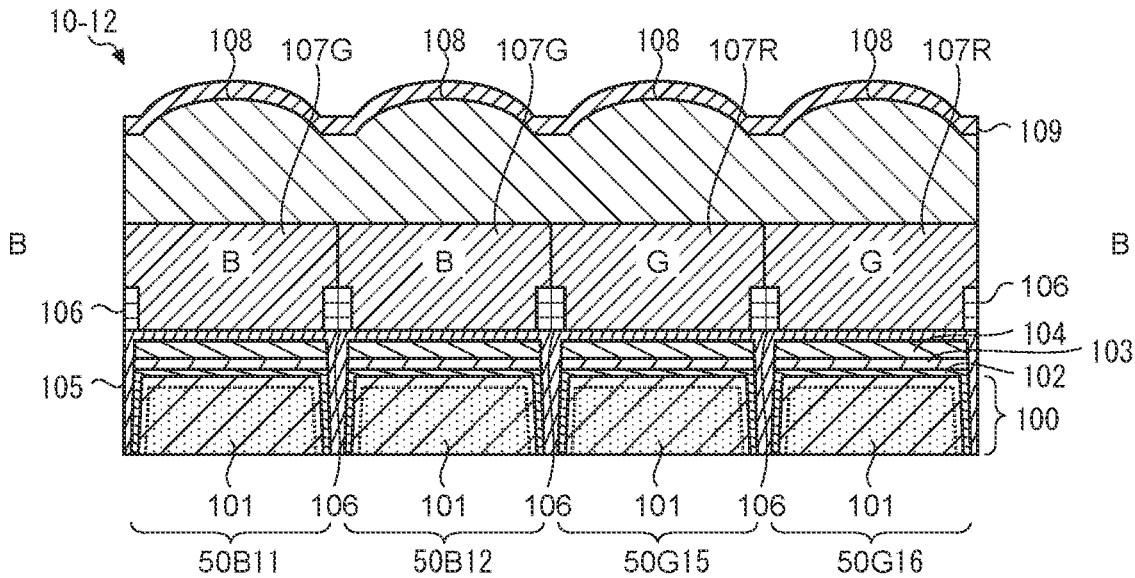
FIG. 49 is a cross-sectional diagram illustrating a cross-sectional structure of a surface B-B in FIG. 47.

FIG. 48 is a cross-sectional diagram illustrating a cross-sectional structure of a surface A-A in FIG. 47. FIG. 49 is a cross-sectional diagram illustrating a cross-sectional structure of a surface B-B in FIG. 47. Similarly to FIG. 7 in the first embodiment, for example, FIG. 48 and FIG. 49 illustrate a cross-sectional structure example of the photoreceiver chip 71 in FIG. 6, and omit a cross-sectional structure example of the circuitry chip 72. In FIG. 48 and FIG. 49, wiring layers constituting electrical connection from the transfer transistor 51 and the photoreceiver chip 71 to the circuitry chip 72 are also omitted.

First, as illustrated in FIG. 48, in the surface A-A, the unit pixels 50G11 and 50G12 and the unit pixels 50R11 and 50R12 are arranged. On the other hand, as illustrated in FIG. 49, in the surface B-B, the unit pixels 50B11 and 50B12 and the unit pixels 50G15 and 50G16 are arranged.

For example, the cross-sectional structures of the unit pixels 50G11 and 50G12, 50R11 and 50R12, 50B11 and 50B12, and 50G15 and 50G16 may be the same as a configuration obtained by omitting the pillars 110 from the unit pixel 50 exemplified above in the first embodiment with reference to FIG. 7.

Such a cross-sectional structure may be similarly applied to the unit pixels 50R13 and 50R14, the unit pixels 50B13 and 50B14, and the unit pixels 50G13, 50G14, 50G17, and 50G18 (not shown).

In this manner, pillars are not provided in the color filter 107 in the unit pixel 50 belonging to the center region 1202. However, the pillars are not necessarily required to be absent, and if needed, the pillars may be provided in the color filter 107.

12.3 Peripheral Region 12.3.1 Layout of Unit Pattern

Figure 50:
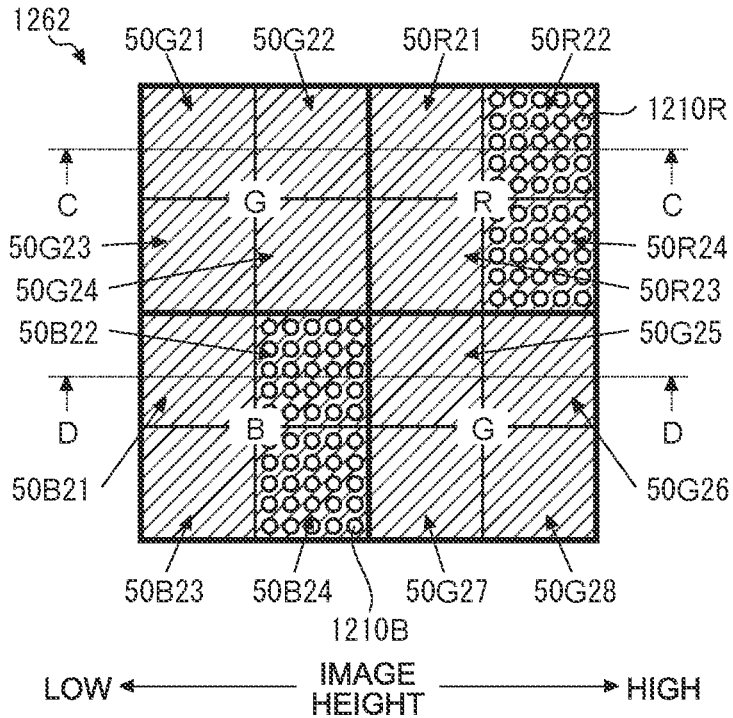
FIG. 50 is a diagram illustrating a plan layout of unit patterns belonging to a peripheral region in FIG. 46.

FIG. 50 is a diagram illustrating a plan layout of a unit pattern 1262 belonging to the peripheral region 1203 in FIG. 46. As illustrated in FIG. 50, when color filter arrangement is quad Bayer arrangement, for example, in the unit pattern 1262 in quad Bayer arrangement, unit pixels 50G21 to 50G24 including a color filter 107G are disposed at four pixels in total of 2×2 pixels located on the upper left, unit pixels 50R21 to 50R24 including a color filter 107R are disposed at four pixels in total of 2×2 pixels located on the upper right, unit pixels 50B21 to 50B24 including a color filter 107B are disposed at four pixels in total of 2×2 pixels located on the lower left, and unit pixels 50G25 to 50G28 including a color filter 107G are disposed at four pixels in total of 2×2 pixels located on the lower right.

Of the unit pixels 50R21 to 50R24, in each of the unit pixels 50R22 and 50R24, which are located on the side where the image height is higher, in other words, to which the unit pixels 50G including the color filter 107G are adjacent on the side where the image height is higher, a pillar array configured by a plurality of pillars 1210R is provided.

Similarly, of the unit pixels 50B21 to 50B24, in each of the unit pixels 50B22 and 50B24 located on the side where the image height is higher, a pillar array configured by a plurality of pillars 12108 is provided.

12.3.2 Cross-Sectional Structure of Unit Pixel

Figure 51:
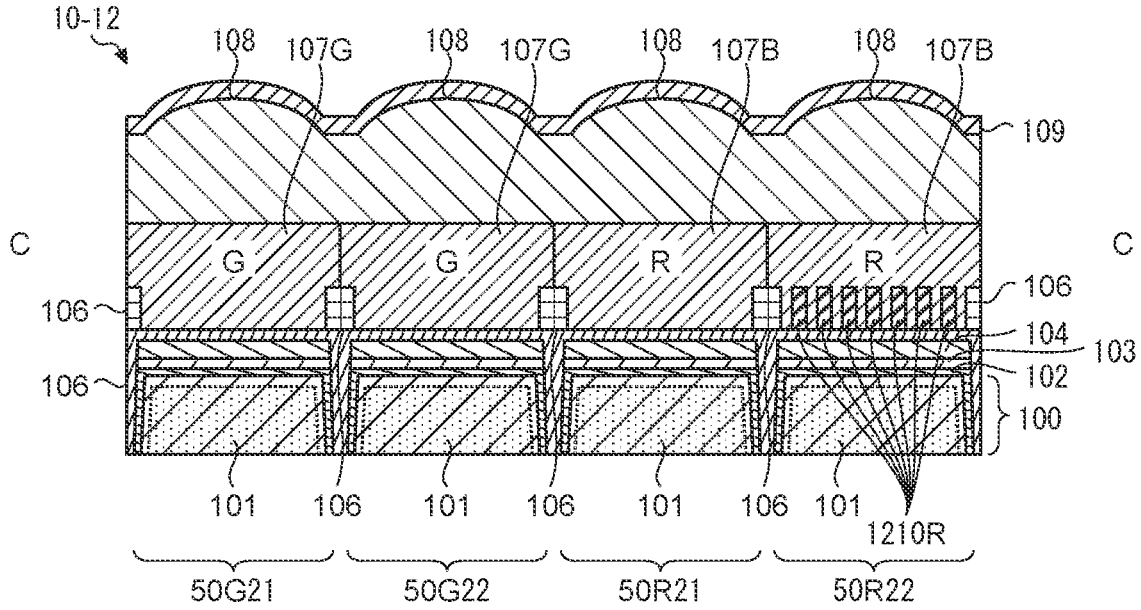
FIG. 51 is a cross-sectional diagram illustrating a cross-sectional structure of a surface C-C in FIG. 50.
Figure 52:
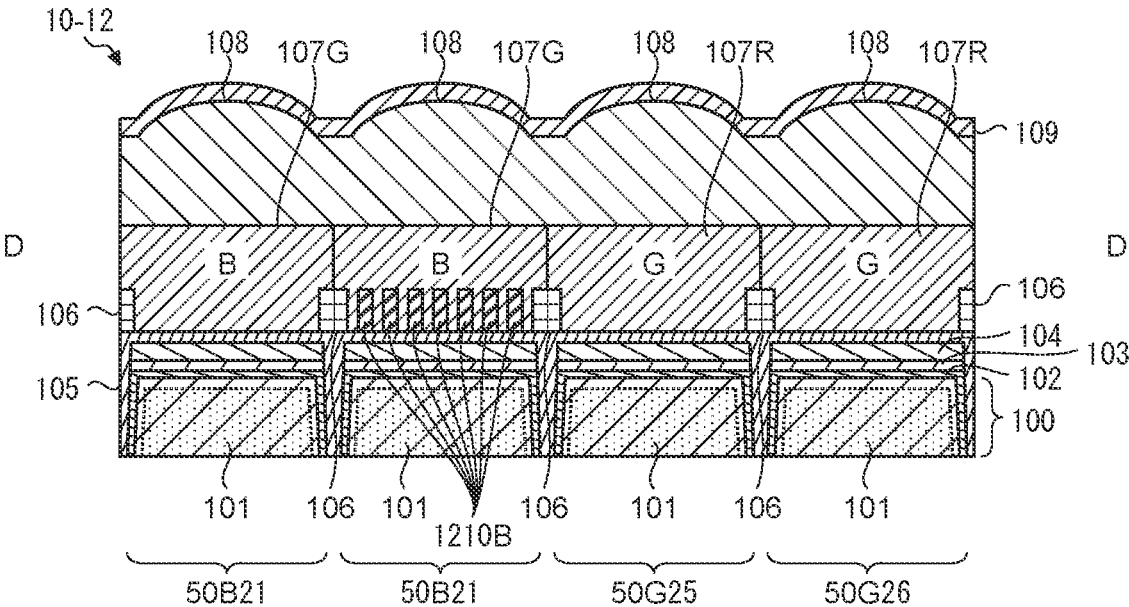
FIG. 52 is a cross-sectional diagram illustrating a cross-sectional structure of a surface D-D in FIG. 50.

FIG. 51 is a cross-sectional diagram illustrating a cross-sectional structure of a surface C-C in FIG. 50. FIG. 52 is a cross-sectional diagram illustrating a cross-sectional structure of a surface D-D in FIG. 50. Similarly to FIG. 48 and FIG. 49, for example, FIG. 51 and FIG. 52 illustrate a cross-sectional structure example of the photoreceiver chip 71 in FIG. 6, and omit a cross-sectional structure example of the circuitry chip 72. In FIG. 51 and FIG. 52, wiring layers constituting electrical connection from the transfer transistor 51 and the photoreceiver chip 71 to the circuitry chip 72 are also omitted.

First, as in a cross-sectional structure of a CMOS image sensor 10-12 exemplified in FIG. 51, in the surface C-C, the unit pixels 50G21 and 50G22 and the unit pixels 50R21 and 50R22 are arranged. On the other hand, as in a cross-sectional structure of the CMOS image sensor 10-12 exemplified in FIG. 52, in the surface D-D, the unit pixels 50B21 and 50B22 and the unit pixels 50G25 and 50G26 are arranged.

For example, the cross-sectional structures of the unit pixels 50G21 and 50G22, 50R21, 50B21, and 50G25 and 50G26 may be the same as a configuration obtained by omitting the pillars 110 from the unit pixel 50 exemplified above in the first embodiment with reference to FIG. 7.

Such a cross-sectional structure may be similarly applied to the unit pixel 50R23, the unit pixel 50B23, and the unit pixels 50G23, 50G24, 50G27, and 50G28 (not shown).

On the other hand, in the unit pixel 50R22 and the unit pixel 50R24 (not shown), as described above, a pillar array configured by a plurality of pillars 1210R is provided. Similarly, in the unit pixel 50B22 and the unit pixel 50B24 (not shown), a pillar array configured by a plurality of pillars 1210B is provided. For example, similarly to the first embodiment, the positions of the pillars 1210R and 1210B may be inside the color filter 107 and on the insulator film 105 formed on the back surface side of the semiconductor substrate 100.

12.4 Spectroscopic Characteristics of Pillar Array

The pillar arrays configured by the pillars 1210R provided in the unit pixels 50R22 and 50R24 are designed so as to function as a particular wavelength absorption filter that absorbs light leaking from a unit pixel 50G adjacent on the side where the image height is higher, for example, light having a wavelength component of green (G). In view of the above, for the pillar array configured by the pillars 1210R, for example, the pillar array 900R configured by the pillars 910R exemplified in the ninth embodiment can be used.

On the other hand, the pillar arrays configured by the pillars 1210B provided in the unit pixels 50B22 and 50B24 are designed so as to function as a particular wavelength absorption filter that absorbs light leaking from a unit pixel 50G adjacent on the side where the image height is higher, for example, light having a wavelength component of green (G). In view of the above, for the pillar array configured by the pillars 1210B, for example, the pillar array 900B configured by the pillars 910B exemplified in the ninth embodiment can be used.

12.5 Actions and Effects

As described above, according to the twelfth embodiment, the leaking of light to a unit pixel 50R or 50B to which a unit pixel 50G including a color filter 107G on the side where the image height is higher from the unit pixel 50G can be reduced. Consequently, the difference in sensitivity caused between adjacent pixels 50 provided with color filters 107 that transmit light having the same wavelength component can be reduced to acquire color images having high color reproducibility.

Other configurations, operations, and effects may be the same as those in the above-mentioned embodiments, and hence the detailed descriptions thereof are herein omitted.

13. Thirteenth Embodiment

In the above-mentioned twelfth embodiment, the case where the effective pixel region 1201 in the pixel array 11 is sectioned into the center region 1202 and the peripheral region 1203 based on the image height has been exemplified. However, the effective pixel region 1201 may be sectioned into a larger number of regions based on the image height.

Figure 53:
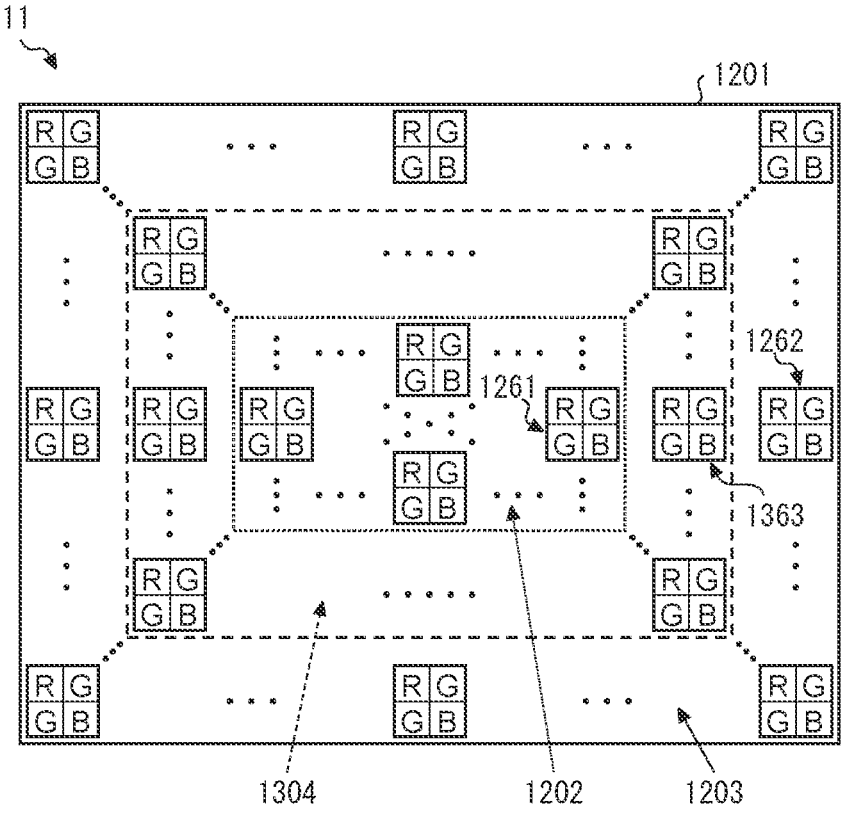
FIG. 53 is a plan diagram illustrating a layout example of a pixel array according to a thirteenth embodiment.

For example, as exemplified in FIG. 53, the effective pixel region 1201 may be sectioned into three regions, that is, the center region 1202 and the peripheral region 1203 as well as an intermediate region 1304 located between the center region 1202 and the peripheral region 1203. In this case, the intermediate region 1304 is a region surrounding the center region 1202, and the peripheral region 1203 is a region surrounding the intermediate region 1304.

13.1 Intermediate Region 13.1.1 Layout of Unit Pattern

Figure 54:
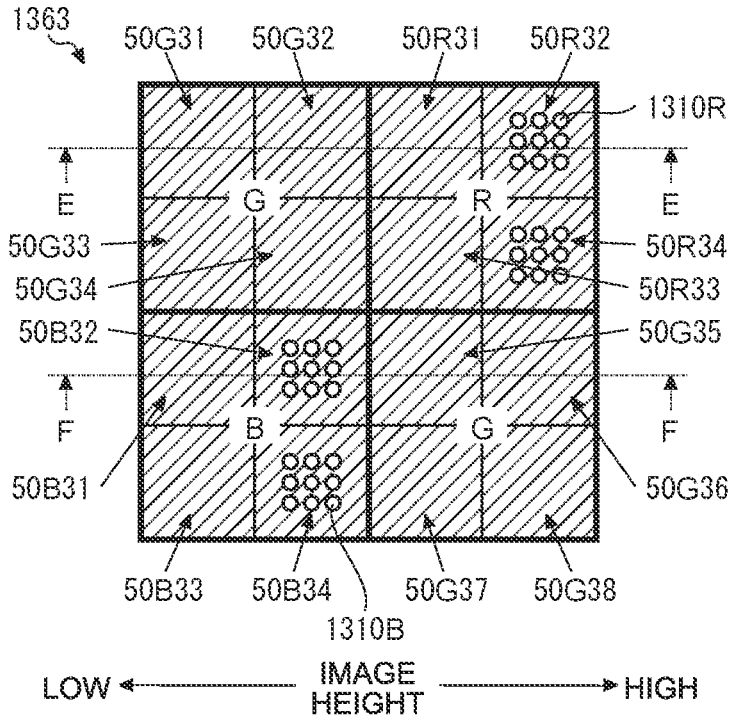
FIG. 54 is a diagram illustrating a plan layout of unit patterns belonging to an intermediate region in FIG. 53.

FIG. 54 is a diagram illustrating a plan layout of a unit pattern 1363 belonging to the intermediate region 1304 in FIG. 53. As illustrated in FIG. 54, when the color filter arrangement is quad Bayer arrangement, for example, in the unit pattern 1363 of the quad Bayer arrangement, unit pixels 50G31 to 50G34 provided with a color filter 107G are disposed at four pixels in total of 2×2 pixels located on the upper left, unit pixels 50R31 to 50R34 provided with a color filter 107R are disposed at four pixels in total of 2×2 pixels located on the upper right, unit pixels 50B31 to 50B34 provided with a color filter 1076 are disposed at four pixels in total of 2×2 pixels located on the lower left, and unit pixels 50G35 to 50G38 provided with a color filter 107G are disposed at four pixels in total of 2×2 pixels located on the lower right.

Of the unit pixels 50R31 to 50R34, in each of the unit pixels 50R32 and 50R34, which are located on the side where the image height is higher, in other words, to which the unit pixels 50G including the color filter 107G are adjacent on the side where the image height is higher, a pillar array configured by a plurality of pillars 1310R is provided.

Similarly, of the unit pixels 50B31 to 50B34, in each of the unit pixels 50B32 and 50B34 located on the side where the image height is higher, a pillar array configured by a plurality of pillars 13108 is provided.

13.1.2 Cross-Sectional Structure of Unit Pixel

Figure 55:
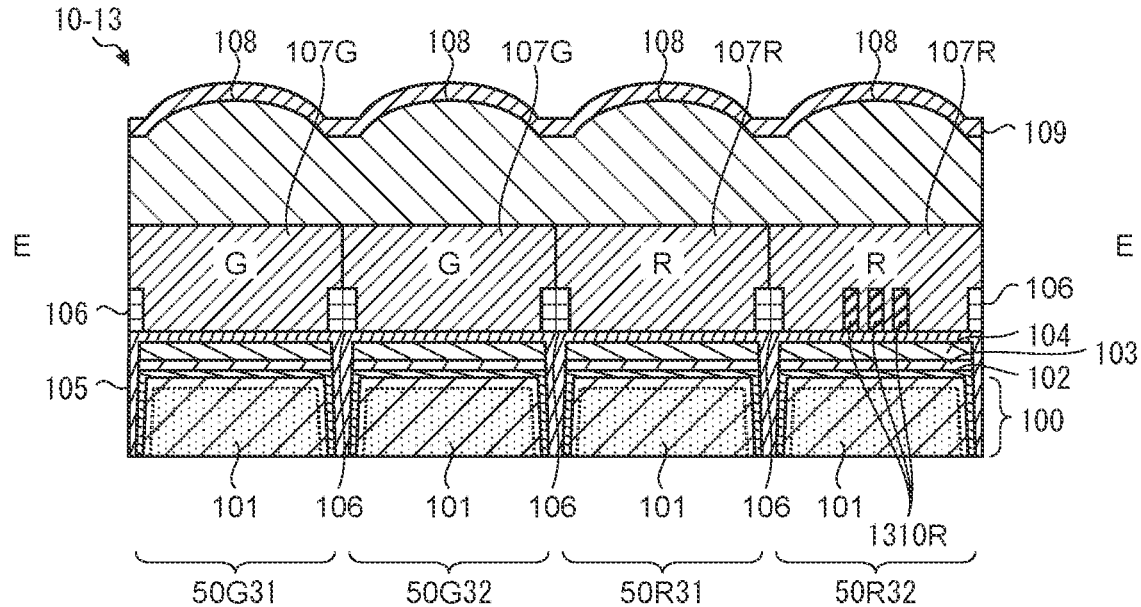
FIG. 55 is a cross-sectional diagram illustrating a cross-sectional structure of a surface E-E in FIG. 54.
Figure 56:
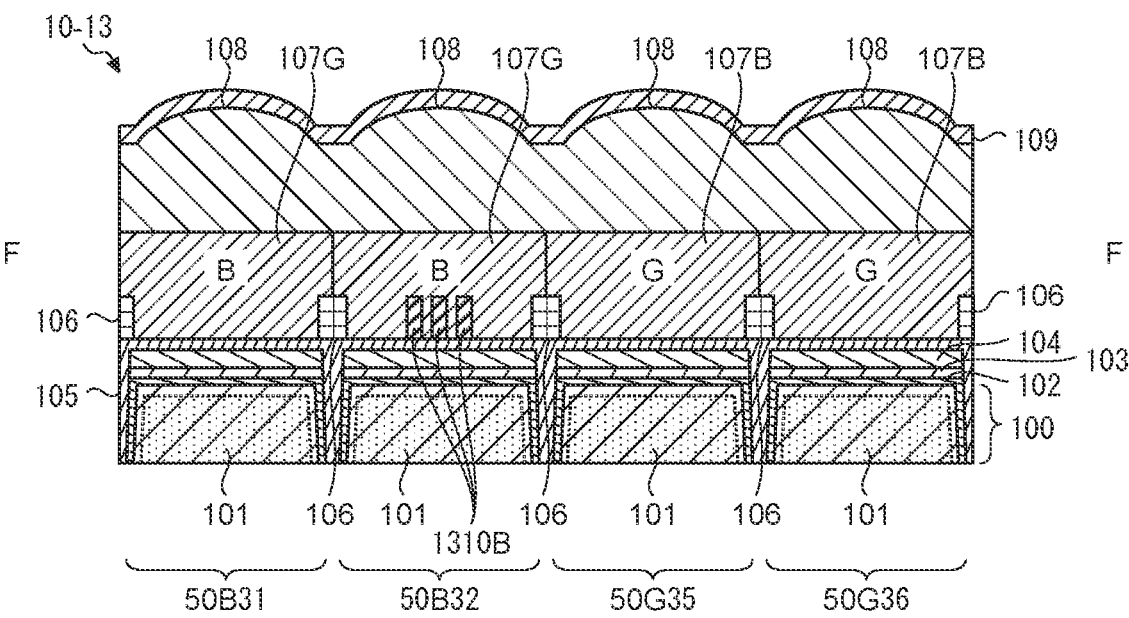
FIG. 56 is a cross-sectional diagram illustrating a cross-sectional structure of a surface F-F in FIG. 54.

FIG. 55 is a cross-sectional diagram illustrating a cross-sectional structure of a surface E-E in FIG. 54. FIG. 56 is a cross-sectional diagram illustrating a cross-sectional structure of a surface F-F in FIG. 54. Similarly to FIG. 48 and FIG. 49, for example, FIG. 55 and FIG. 56 illustrate a cross-sectional structure example of the photoreceiver chip 71 in FIG. 6, and omit a cross-sectional structure example of the circuitry chip 72. In FIG. 55 and FIG. 56, wiring layers constituting electrical connection from the transfer transistor 51 and the photoreceiver chip 71 to the circuitry chip 72 are also omitted.

First, as in the cross-sectional structure of a CMOS image sensor 10-13 exemplified in FIG. 55, the unit pixels 50G31 and 50G32 and the unit pixels 50R31 and 50R32 are arranged in the surface E-E. On the other hand, as in the cross-sectional structure of the CMOS image sensor 10-13 exemplified in FIG. 56, the unit pixels 50B31 and 50B32 and the unit pixels 50G35 and 50G36 are arranged in the surface F-F.

For example, the cross-sectional structures of the unit pixels 50G31 and 50G32, 50R31, 50B31, and 50G35 and 50G36 may be the same as a configuration obtained by omitting the pillars 110 from the unit pixel 50 exemplified above in the first embodiment with reference to FIG. 7.

Such a cross-sectional structure may be similarly applied to the unit pixel 50R33, the unit pixel 50B33, and the unit pixels 50G33, 50G34, 50G37, and 50G38 (not shown).

On the other hand, in the unit pixel 50R32 and the unit pixel 50R34 (not shown), as described above, a pillar array configured by a plurality of pillars 1310R is provided. Similarly, in the unit pixel 50B32 and the unit pixel 50B34 (not shown), a pillar array configured by a plurality of pillars 1310B is provided. For example, similarly to the first embodiment, the positions of the pillars 1310R and 1310B may be inside the color filter 107 and on the insulator film 105 formed on the back surface side of the semiconductor substrate 100.

13.2 Spectroscopic Characteristics of Pillar Array

The pillar arrays configured by the pillars 1310R provided in the unit pixels 50R32 and 50R34 are designed so as to function as a particular wavelength absorption filter that absorbs light leaking from a unit pixel 50G adjacent on the side where the image height is higher, for example, light having a wavelength component of green (G). In view of the above, for the pillar array configured by the pillars 1210R, for example, the pillar array 900R configured by the pillars 910R exemplified in the ninth embodiment can be used.

On the other hand, the pillar arrays configured by the pillars 13108 provided in the unit pixels 50B32 and 50B34 are designed so as to function as a particular wavelength absorption filter that absorbs light leaking from a unit pixel 50G adjacent on the side where the image height is higher, for example, light having a wavelength component of green (G). In view of the above, for the pillar array configured by the pillars 1310B, for example, the pillar array 900B configured by the pillars 910B exemplified in the ninth embodiment can be used.

However, the amount of light attenuated by the pillar arrays configured by the pillars 1310R and 1310B may be lower than the amount of light attenuated by the pillar arrays configured by the pillars 1210R and 1210B according to the twelfth embodiment. In view of the above, in the thirteenth embodiment, the pillars 1310R or the pillars 1310B are formed in a region narrower than the regions where the pillars 1210R and the pillars 12108 are formed in each unit pixel 50 according to the twelfth embodiment.

13.3 Actions and Effects

With the configuration described above, the amount of light attenuated by the pillar arrays configured by the pillars 1310R and 1310B can be gradually increased from a region where the image height is low (center region 1202) to a region where the image height is high (peripheral region 1203). Consequently, a pillar array having light absorptance corresponding to the degree of light leakage from the unit pixel 50G can be disposed in each unit pixel 50, and hence color images having higher color reproducibility can be acquired.

In the above description, the case where the effective pixel region 1201 is sectioned into two or three regions based on the image height has been exemplified. The effective pixel region 1201 is not limited to the examples, and may be sectioned into a larger number of regions, for example, four or more regions.

Other configurations, operations, and effects may be the same as those in the above-mentioned embodiments, and hence the detailed descriptions thereof are herein omitted.

14. Fourteenth Embodiment

Next, a fourteenth embodiment is described in detail with reference to the drawings. In the above-mentioned embodiments, the case where the shielding film 106 is used has been exemplified as the configuration for reducing the leakage of light that has entered a unit pixel 50 to a photodiode PD in an adjacent pixel 50. In the fourteenth embodiment, on the other hand, a case where a pillar array is used instead of the shielding film 106 is described by way of example.

In the following description, the case based on the eighth embodiment is exemplified. The basic embodiment is not limited to the eighth embodiment, and may be another embodiment described above or described below. In the following description, overlapping descriptions of the same configurations, operations, and effects as the configurations, operations, and effects according to the above-mentioned embodiments are omitted by reference.

14.1 Cross-Sectional Structure Example of Unit Pixel

Figure 57:
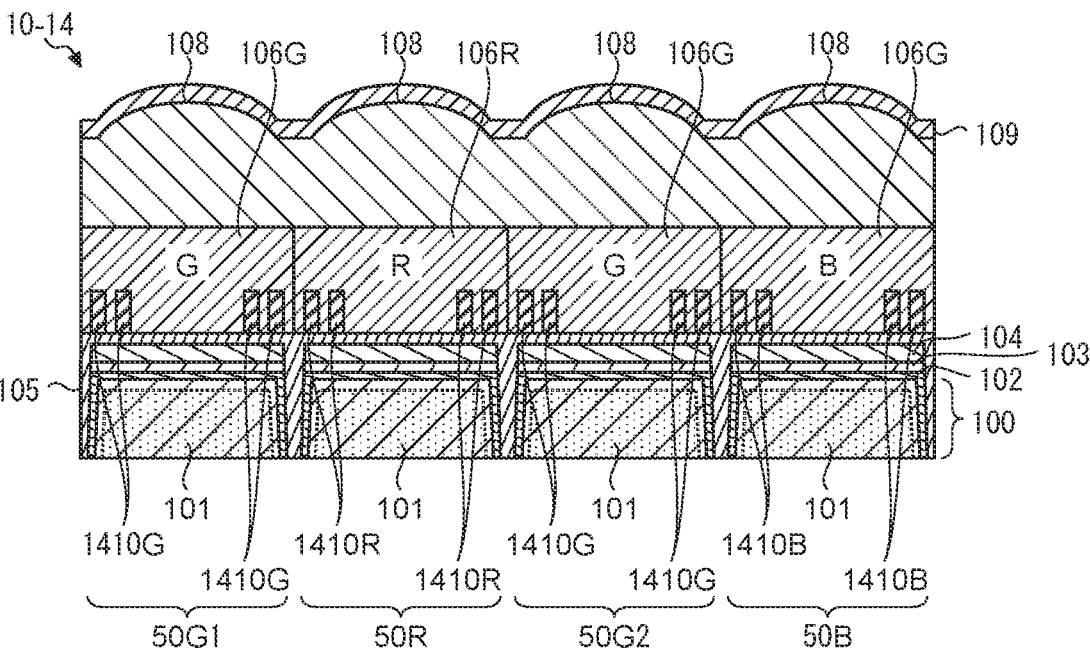
FIG. 57 is a cross-sectional diagram illustrating a cross-sectional structure example of a CMOS image sensor according to a fourteenth embodiment.

FIG. 57 is a cross-sectional diagram illustrating a cross-sectional structure example of a CMOS image sensor according to the fourteenth embodiment. Similarly to FIG. 33 in the eighth embodiment, for example, FIG. 57 illustrates a cross-sectional structure example of the photoreceiver chip 71 in FIG. 6, and omits a cross-sectional structure example of the circuitry chip 72. In FIG. 57, wiring layers constituting electrical connection from the transfer transistor 51 and the photoreceiver chip 71 to the circuitry chip 72 are also omitted. For the sake of description, FIG. 57 exemplifies a case where four unit pixels 50B, 50R, 50G1, and 50G2 constituting a unit pattern 861 in Bayer arrangement are arranged in a row along the cross section.

As exemplified in FIG. 57, in a CMOS image sensor 10-14 according to the fourteenth embodiment, the unit pixels 50R, 50G1, 50G2, and 50B have a configuration obtained by, for example, omitting the pillars 110 from the unit pixel 50 exemplified above in the eighth embodiment with reference to FIG. 33 and replacing the shielding film 106 disposed between the unit pixels 50 with pillars 1410R, 1410G, or 1410B.

14.2 Planar Layout Example of Pillars

Figure 58:
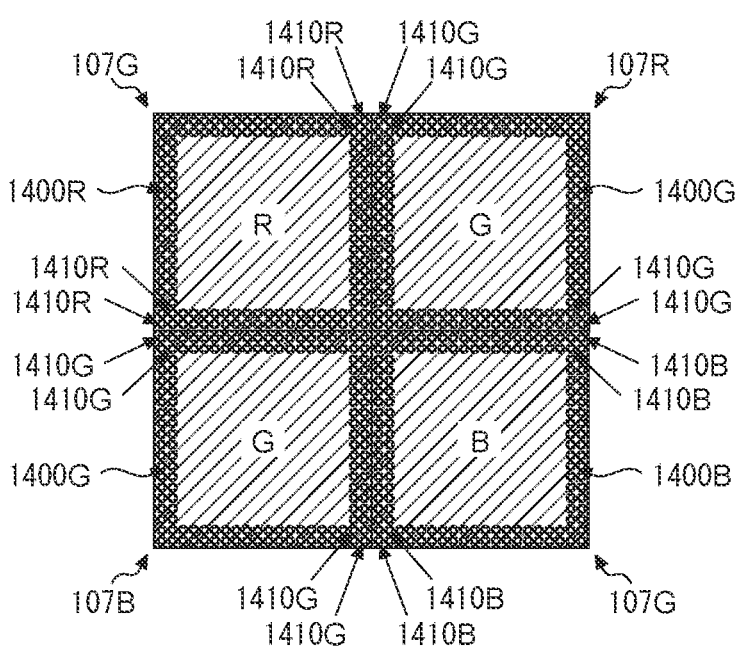
FIG. 58 is a diagram illustrating a plan layout example of pillars according to the fourteenth embodiment.

FIG. 58 is a diagram illustrating a plan layout example of the pillars 1410 disposed in the color filters 107 in the unit pixels 50 constituting a unit pattern of Bayer arrangement. As illustrated in FIG. 58, in each unit pixel 50, for example, the pillars 1410 are arranged on the insulator film 105 formed on the back surface side of the semiconductor substrate 100 in at least two rows at a peripheral part of each color filter 107, thereby constituting a pillar array functioning as a shieling portion.

For example, at a peripheral part of a color filter 107R, the pillars 1410R are disposed in two or more rows so as to surround a center part of the color filter 107R, thereby constituting a pillar array 1400R. Similarly, at a peripheral part of a color filter 107G, the pillars 1410G are disposed in two or more rows so as to surround a center part of the color filter 107G, thereby constituting a pillar array 1400G. At a peripheral part of a color filter 107B, the pillars 1410B are disposed in two or more rows so as to surround a center part of the color filter 107B, thereby constituting a pillar array 1400B.

At the center part of each color filter 107, a pillar array for the purpose of attenuating light leaking from an adjacent pixel 50 according to the above-mentioned embodiments may be provided 14.3 Spectroscopic Characteristics of Pillar Array FIG. 59 is a diagram illustrating an example of spectroscopic characteristics of the pillar array 1400R provided in the unit pixel 50R. As a reference, FIG. 59 also illustrates spectroscopic characteristics of the color filter 107R (light transmission spectrum SP107R).

As illustrated in FIG. 59, in the fourteenth embodiment, for example, the pillar array 1400R has at least one of a light transmission spectrum SP1410B selectively absorbing light having a wavelength component of blue (B), a light transmission spectrum SP1410G selectively absorbing light having a wavelength component of green (G), and a light transmission spectrum SP1410IR selectively absorbing light having a wavelength component corresponding to IR light. In other words, the pillar array 1400R is configured by using the pillars 1410R that do not absorb light having a wavelength component of red (R), and thus functions as a waveguide that transmits light having a wavelength component of red (R).

The above-mentioned configuration may be similarly applied to the other pillar arrays 1400G and 1400B. In other words, the pillar array 1400G is configured by using the pillars 1410G that do not absorb light having a wavelength component of green (G), and thus functions as a waveguide that transmits light having a wavelength component of green (G). The pillar array 1400B is configured by using the pillars 1410B that do not absorb light having a wavelength component of blue (B), and thus functions as a waveguide that transmits light having a wavelength component of blue (B).

14.4 Function of Pillar as Optical Waveguide

FIGS. 60A, 60B, and 60C are diagrams for explaining propagation of light that has obliquely entered a peripheral part of the color filter 107. In FIGS. 60A, 60B, and 60C, the description is given by referring to the color filter 107R, but the same may apply to the other color filters 107G and 107B. In FIGS. 60A, 60B, and 60C, light L10 entering the color filter 107R is, for example, light having a broad wavelength spectrum for a visible light region.

As illustrated in FIGS. 60A, 60B, and 60C, the light L10 that has obliquely entered the peripheral part of the color filter 107R propagates through the color filter 107R, and, as illustrated in FIG. 60A, the wavelength spectrum thereof is shaped in accordance with spectroscopic characteristics (see light transmission spectrum SP107R in FIG. 59) of the color filter 107R. As a result, the light L10 is converted into light L11 having a wavelength component of red. After that, the light L11 enters the pillar 1410R located at the peripheral part of the color filter 107R.

For example, the pillar 1410R has a refractive index lower than that of the surrounding color filter 107R. Thus, the light L11 that has entered the pillar 1410R is repeatedly reflected or totally reflected by a boundary surface of the pillar 1410R and the color filter 107R, and then exits from the bottom surface of the pillar 1410R toward a photodiode PD (not shown). In this manner, the pillar 1410R functions as an optical waveguide that guides light, having entered the peripheral part of the color filter 107R, to the back surface (a surface on the side opposite to a light incident surface) of the color filter 107R.

The light L11 that has entered the pillar 1410R propagates through the pillar 1410, and, as illustrated in FIG. 60B, the wavelength spectrum thereof is shaped in accordance with spectroscopic characteristics (see light transmission spectra SP1410R, SP1410G, and SP1401B in FIG. 59) of the pillar array 1400R. As a result, the light L11 is converted into light L12 having a wavelength spectrum illustrated in FIG. 60C. After that, the light L12 exits from the bottom surface of the pillar 1410R, that is, the back surface of the color filter 107R, toward the photodiode PD.

The above-mentioned configuration may be similarly applied to the other color filters 107G and 1078.

14.5 Actions and Effects

As described above, in the fourteenth embodiment, at the peripheral part of each color filter 107, the pillar array 1400 functioning as not only a shieling portion that blocks light having wavelength components other than a wavelength component to be transmitted through the color filter 107 but also an optical waveguide that guides light having the wavelength component to be transmitted through the color filter 107 to the back surface of the color filter 107 is provided. Consequently, of light that has obliquely entered the peripheral part of each color filter 107, light having wavelength components other than a wavelength component to be transmitted through the color filter 107 can be attenuated, and the exit of light having the wavelength component to be transmitted through the color filter 107 toward an adjacent pixel 50 can be suppressed. As a result, the leakage of light that has obliquely entered a unit pixel 50 to a photodiode PD in an adjacent pixel 50 can be suppressed to improve the color reproducibility of acquired color images.

Other configurations, operations, and effects may be the same as those in the above-mentioned embodiments, and hence the detailed descriptions thereof are herein omitted.

15. Fifteenth Embodiment

In the above-mentioned embodiments, the case where the spectroscopic characteristics of the pillar array 1400 provided instead of the shielding film 106 are spectroscopic characteristics that light having a wavelength component to be transmitted through a color filter 107 in which the pillar array 1400 is provided is transmitted and light having other wavelength components is absorbed has been exemplified. However, the spectroscopic characteristics of the pillar array provided instead of the shielding film 106 are not limited to such spectroscopic characteristics, and may be, for example, spectroscopic characteristics of broad light absorption characteristics (light absorption spectrum) capable of absorbing at least a visible light region (may include IR light region) as a whole.

Figure 61:
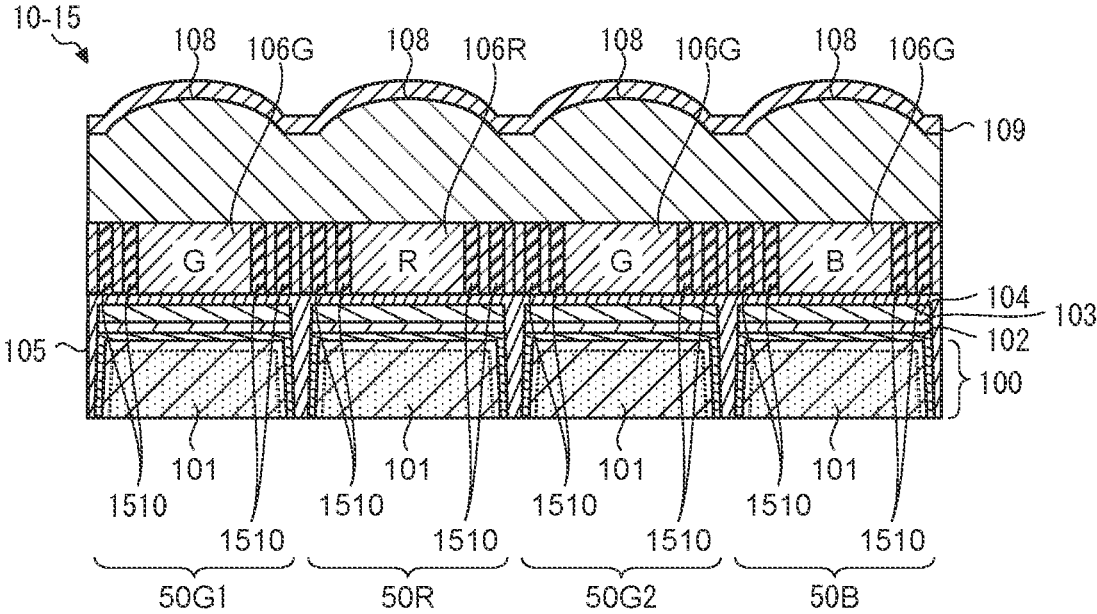
FIG. 61 is a cross-sectional diagram illustrating a cross-sectional structure example of a CMOS image sensor according to a fifteenth embodiment.

FIG. 61 is a cross-sectional diagram illustrating a cross-sectional structure example of a CMOS image sensor according to a fifteenth embodiment. Similarly to FIG. 57 in the fourteenth embodiment, for example, FIG. 61 illustrates a cross-sectional structure example of the photoreceiver chip 71 in FIG. 6, and omits a cross-sectional structure example of the circuitry chip 72. In FIG. 61, wiring layers constituting electrical connection from the transfer transistor 51 and the photoreceiver chip 71 to the circuitry chip 72 are also omitted. For the sake of description, FIG. 61 exemplifies a case where four unit pixels 50B, 50R, 50G1, and 50G2 constituting a unit pattern 861 in Bayer arrangement are arranged in a row along the cross section.

As exemplified in FIG. 61, a CMOS image sensor 10-15 according to the fifteenth embodiment has a configuration obtained by replacing the pillars 1410R, 1410G, and 1410B provided at the peripheral part of the color filter 107 with pillars 1510R, 1510G, and 1510B, respectively, in the same configuration as in the CMOS image sensor 10-14 described above in the fourteenth embodiment with reference to FIG. 57.

Figure 62:
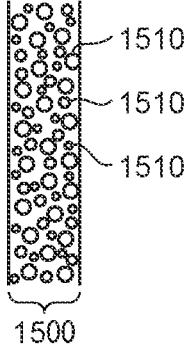
FIG. 62 is a diagram illustrating a plan layout example of pillars according to the fifteenth embodiment.

As exemplified in FIG. 62, a plurality of pillars 1510 include a plurality of kinds of pillars 1510 having randomly different diameters, and the pillars 1510 are randomly disposed to constitute a pillar array 1500 having broad light absorption characteristics (light absorption spectrum) capable of absorbing at least a visible light region (may include a region of IR light) as a whole.

By disposing the pillar array 1500 formed from the pillars 1510 having the configuration described above at a peripheral part of the color filter 107 instead of the shielding film 106, light that has obliquely entered the peripheral part of the color filter 107 can be attenuated as a whole. As a result, the leakage of light that has obliquely entered a unit pixel 50 to a photodiode PD in an adjacent pixel 50 can be suppressed to improve the color reproducibility of acquired color images.

Other configurations, operations, and effects may be the same as those in the above-mentioned embodiments, and hence the detailed descriptions thereof are herein omitted.

16. Sixteenth Embodiment

In the above-mentioned embodiments, the case where the height of the pillars (such as the pillar 110) from the top surface of the insulator film 105 is lower than the height of the color filter 107 from the top surface of the insulator film 105, in other words, the case where the pillars are buried in the color filter 107, has been exemplified. However, the embodiments are not limited to such a configuration.

Figure 63:
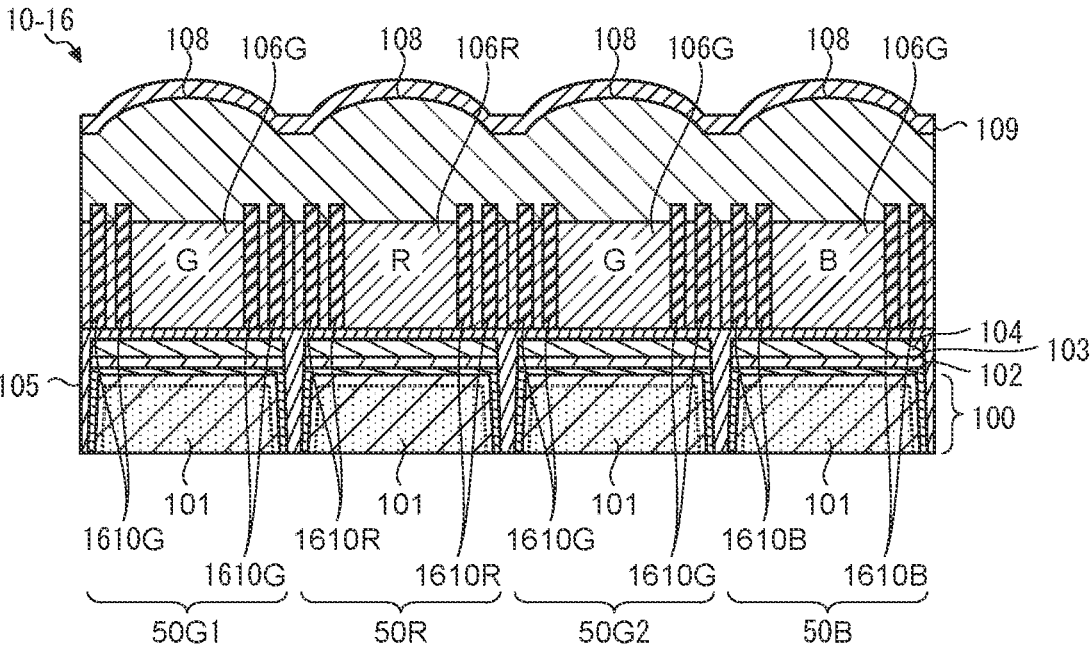
FIG. 63 is a cross-sectional diagram illustrating a cross-sectional structure example of a CMOS image sensor according to a sixteenth embodiment.

For example, as in a CMOS image sensor 10-16 exemplified in FIG. 63, the height of a pillar 1610 from the top surface of the insulator film 105 may be higher than the height of the color filter 107 from the top surface of the insulator film 105. FIG. 63 exemplifies a case based on the fourteenth embodiment, but the basic embodiment is not limited to the fourteenth embodiment, and may be another embodiment described above or described later.

17. Seventeenth Embodiment

Figure 64:
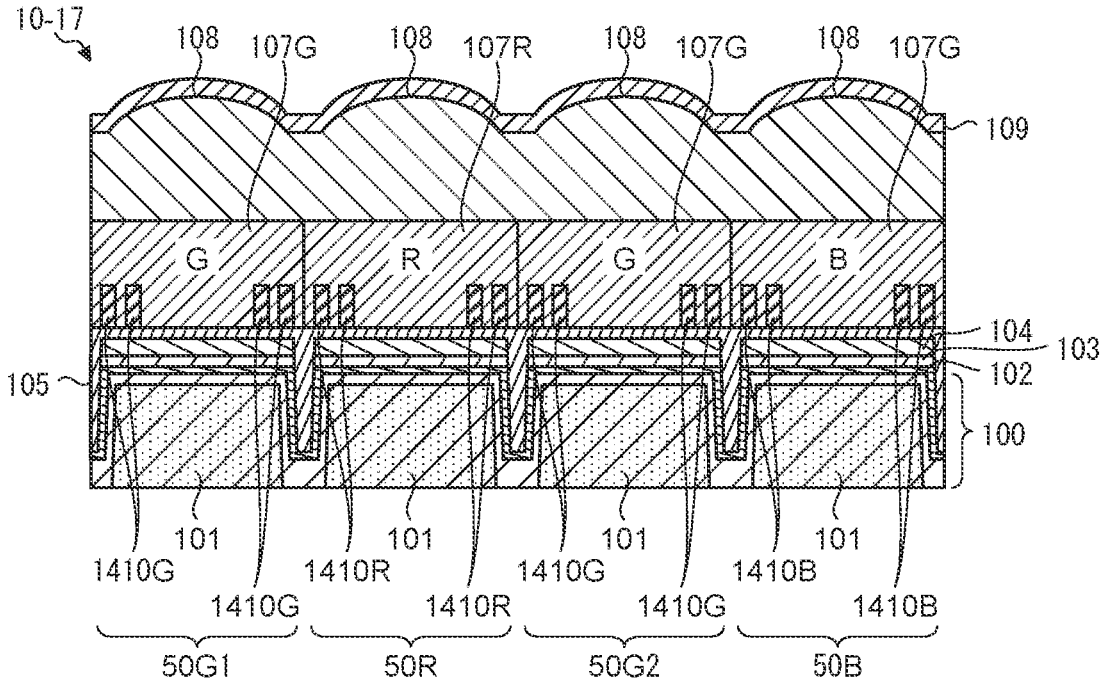
FIG. 64 is a cross-sectional diagram illustrating a cross-sectional structure example of a CMOS image sensor according to a seventeenth embodiment.

In the above-mentioned embodiments, the case where an FFTI pixel separation portion is provided between unit pixels 50 has been exemplified. The pixel separation portion is not limited to the FFTI type, and, for example, may be of an RDTI type as in a CMOS image sensor 10-17 exemplified in FIG. 64. FIG. 64 exemplifies a case based on the fourteenth embodiment, but the basic embodiment is not limited to the fourteenth embodiment, and may be another embodiment described above or described later.

18. Eighteenth Embodiment

Pupil correction can be applied to the above-mentioned embodiments. In this case, as in a CMOS image sensor 10-18 exemplified in FIG. 65 and a plan layout example of color filters 107 and photodiodes PD exemplified in FIG. 66, the positional relation between each color filter 107 and the photodiode PD in addition to the positional relation between the on-chip lens 108 and the color filter 107 may be corrected (pupil correction).

In this case, similarly to the shift amount (correction amount) of the on-chip lens 108 with respect to the color filter 107, for example, the shift amount (correction amount) of the color filter 107 with respect to the photodiode PD can be calculated based on the image height of the unit pixel 50 or chief ray angle (CRA) characteristics of the imaging lens 20 (see FIG. 2).

Figure 65:
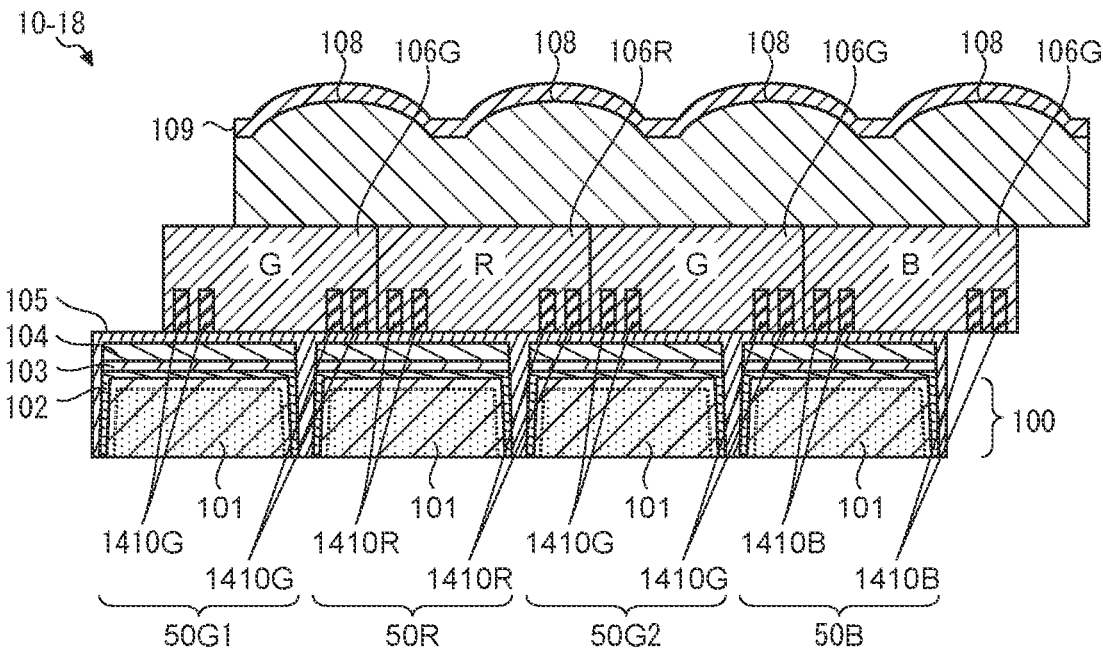
FIG. 65 is a cross-sectional diagram illustrating a cross-sectional structure example of a CMOS image sensor according to an eighteenth embodiment.
Figure 66:
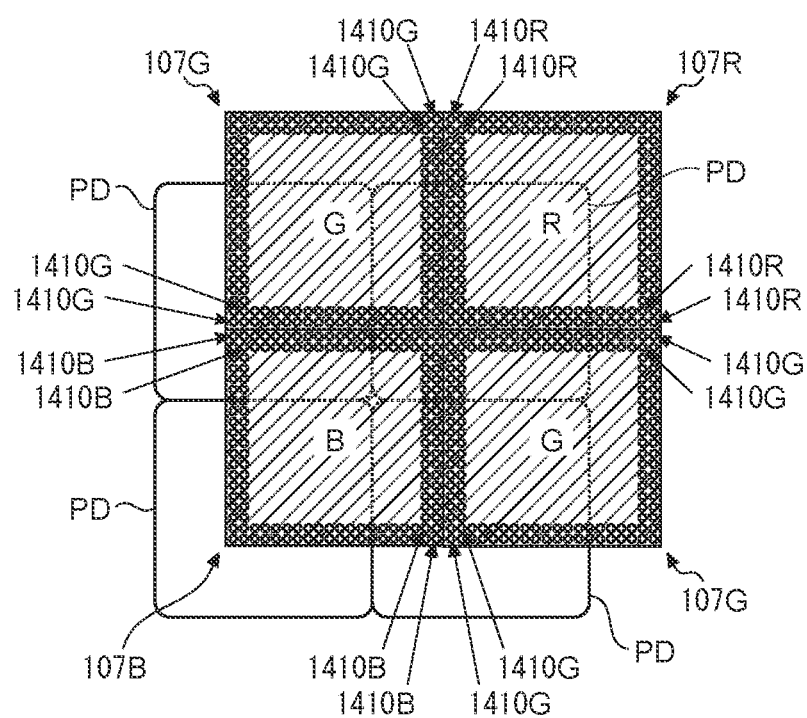
FIG. 66 is a diagram illustrating a plan layout example of color filters and photodiodes according to the eighteenth embodiment.

FIG. 65 illustrates a cross-sectional structure example of a CMOS image sensor 10-18 when an optical axis of the imaging lens 20 (for example, corresponding to the center in the effective pixel region of the pixel array 11) is present in the right direction in the figure. FIG. 66 is a plan layout diagram of the color filters 107 and the photodiodes PD as seen from the light incident direction, illustrating an example of the positional relation between the color filter 107 and the photodiode PD when the optical axis of the imaging lens 20 is present in the upper right direction in the figure.

FIG. 65 and FIG. 66 exemplify a case based on the fourteenth embodiment, but the basic embodiment is not limited to the fourteenth embodiment, and may be another embodiment described above or described later.

19. Nineteenth Embodiment

Next, a nineteenth embodiment is described in detail with reference to the drawings.

Figure 67:
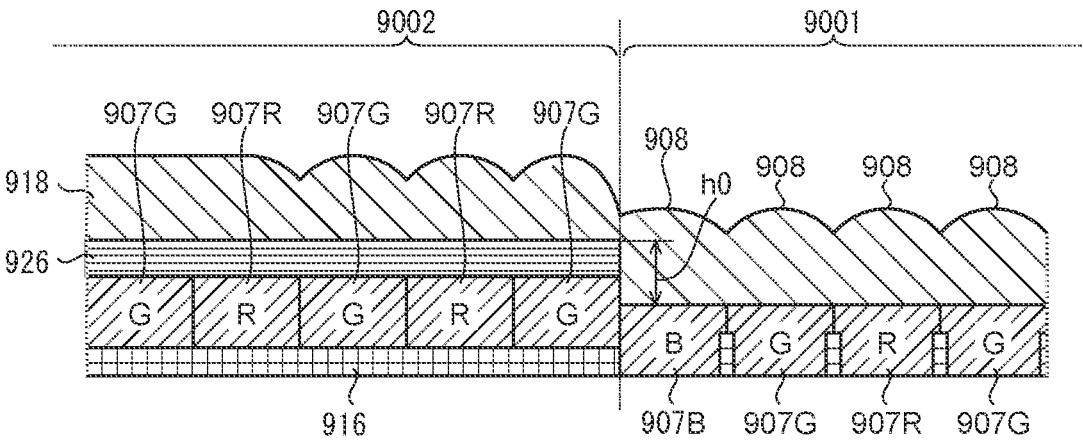
FIG. 67 is a cross-sectional diagram illustrating a cross-sectional structure example of a general CMOS image sensor.

As exemplified in FIG. 67, in a general CMOS image sensor, a region (hereinafter referred to "shielding region") 9002 around an effective pixel region 9001 in a pixel array is covered with a shielding film (hereinafter referred to as "optical black (OPB) solid film") 916 that blocks light entering a peripheral part of the pixel array.

On the OPB solid film 916, a color filter 907 is formed continuously from the effective pixel region 9001 in order to maintain the manufacturing precision (such as precision of shape) of the color filter 907 at the peripheral part of the effective pixel region 9001.

On the color filter 907 in the shielding region 9002, a film (hereinafter referred to as "anti-flare film") 926 having a broad light absorption spectrum for at least a visible light region is provided in order to reduce the generation of flare caused by diffused reflection of light entering the shielding region 9002.

At at least a boundary part between the effective pixel region 9001 and the shielding region 9002 on the anti-flare film 926, an on-chip lens 918 formed continuously from the on-chip lens 908 in the effective pixel region 9001 is provided in order to maintain the manufacturing precision (such as precision of shape) of the on-chip lens 908 at the peripheral part of the effective pixel region 9001.

In the case of the configuration described above, the surface, in the shielding region 9002, on which the on-chip lens 918 is formed (for example, the top surface of the anti-flare film 926) becomes higher than the surface, in the effective pixel region 9001, on which the on-chip lens 908 is formed (for example, the top surface of the color filter 907) by a thickness h0 determined by adding the thickness of the OPB solid film 916 and the thickness of the anti-flare film 926, and a step having the thickness h0 is formed at the boundary part between the effective pixel region 9001 and the shielding region 9002.

When such a step occurs, it is difficult to maintain the manufacturing precision (such as precision of shape) of the on-chip lens 908 at the peripheral part in the effective pixel region 9001. Accordingly, it is difficult to acquire accurate color information (pixel signal) of light that has entered a unit pixel located at the peripheral part of the effective pixel region 9001, and a unit pixel that should be substantially ineffective comes into existence at the peripheral part of the effective pixel region 9001. Thus, there is a problem in that the effective pixel region is reduced.

In view of the above, in the nineteenth embodiment, by reducing a step of the surface on which the on-chip lens is formed at a boundary part between the effective pixel region and the shielding region, the manufacturing precision of the on-chip lens formed at the peripheral part of the effective pixel region can be maintained to reduce the reduction of the effective pixel region.

In the following description, the case based on the eighth embodiment is exemplified. The basic embodiment is not limited to the eighth embodiment, and may be another embodiment described above or described below. In the following description, overlapping descriptions of the same configurations, operations, and effects as the configurations, operations, and effects according to the above-mentioned embodiments are omitted by reference.

19.1 Plan Layout of Photoreceiver Chip

Figure 68:
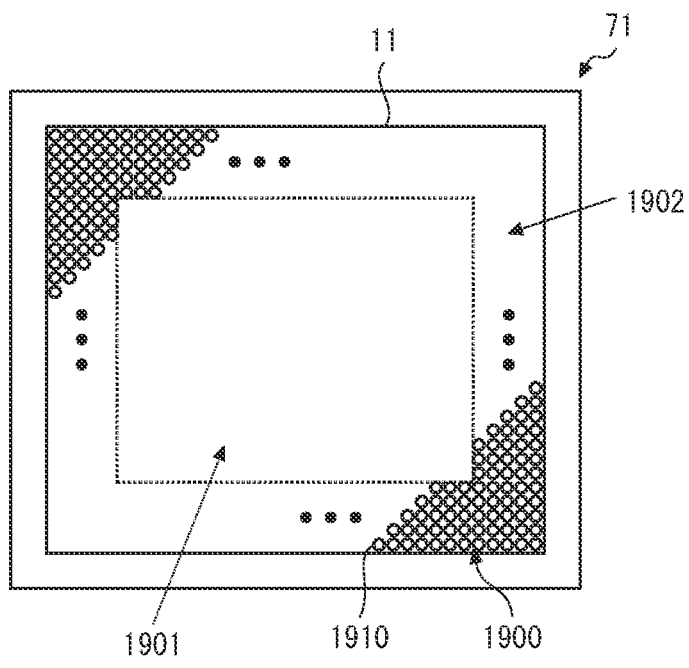
FIG. 68 is a diagram illustrating a plan layout example of a photoreceiver chip according to a nineteenth embodiment.

FIG. 68 is a diagram illustrating a plan layout example of the photoreceiver chip according to the nineteenth embodiment. As illustrated in FIG. 68, the pixel array 11 (see FIG. 3) formed in the photoreceiver chip 71 is divided into an effective pixel region 1901 and a shielding region 1902. For example, the effective pixel region 1901 may be a region in which unit pixels 50 that are targets from which pixel signals constituting image data are read are arranged in a two-dimensional grid pattern. For example, the shielding region 1902 may be a region in which unit pixels 50 are arranged but the light incident surfaces of the photodiodes PD are covered with an OPB solid film 1916 described later.

In the shielding region 1902, a pillar array 1900 configured by a plurality of pillars 1910 arranged with a pitch shorter than the pitch of the photodiodes PD in the effective pixel region 1901 is provided. For example, the pillar array 1900 functions as a substitute of an anti-flare film that reduces the generation of flare caused by diffused reflection of light entering the shielding region 1902. In view of the above, in the nineteenth embodiment, the pillar array 1900 is configured to have a broad light absorption spectrum for at least a visible light region.

For example, the pillar array 1900 having such a light absorption spectrum can be configured by a plurality of kinds of pillars 1910 the diameters and pitches of which are (randomly) different, as with the pillar arrays configured by the pillars 211 and 212 described above in the second embodiment with reference to FIG. 21. Alternatively, the pillar array 1900 may be configured by pillars 1910 the diameters of which change gradually or step by step from the bottom surface (insulator film 105 side) toward the top surface or the apex as with the pillars 310 described above in the third embodiment with reference to FIG. 22. However, the pillar array is not limited thereto, and may be variously modified as long as the pillar array has a broad light absorption spectrum for at least a visible light region.

19.2 Cross-Sectional Structure Example of Shielding Region

Figure 69:
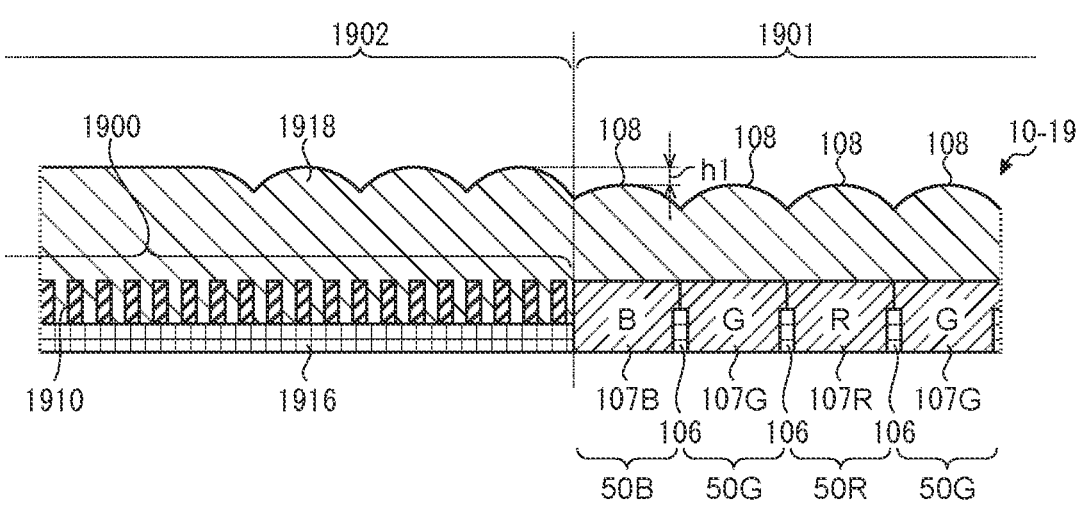
FIG. 69 is a cross-sectional diagram illustrating a cross-sectional structure example of a CMOS image sensor according to the nineteenth embodiment.

FIG. 69 is a cross-sectional diagram illustrating a cross-sectional structure example of a CMOS image sensor according to the nineteenth embodiment. For simple description, FIG. 69 illustrates a cross-sectional structure example of layers upper than the insulator film 105 in the above-mentioned embodiments, and omits cross-sectional structures of lower layers. For example, the cross-sectional structures of the layers lower than the insulator film 105 in the effective pixel region 1901 may be the same as in the above-mentioned embodiments (see, for example, FIG. 33). In the shielding region 1902, the vicinity of a boundary with the effective pixel region 1901 may be the same as in the above-mentioned embodiments, and in a region apart from the boundary with the effective pixel region 1901, the photodiode PD (for example, N-type semiconductor region 101) may be omitted.

As in a CMOS image sensor 10-19 exemplified in FIG. 69, in the shielding region 1902, the top surface of the insulator film 105 formed on the back surface side of the semiconductor substrate 100 is covered with an OPB solid film 1916. For the OPB solid film 1916, for example, material such as tungsten (W) can be used similarly to the shielding film 106 in the above-mentioned embodiments. On the OPB solid film 1916, a pillar array 1900 configured by a plurality of pillars 1910 is provide.

Furthermore, on the OPB solid film 1916 on which the pillar array 1900 is provided, an on-chip lens 1918 formed continuously from the on-chip lens 108 in the effective pixel region 1901 is provided.

19.3 Diameter, Pitch, and Height of Pillars

For example, a plurality of diameters of the pillars 1910 can be set in the range of 80 to 130 nm regularly or randomly.

For example, a plurality of pitches between the pillars 1910 can be set in the range of 200 to 480 nm regularly or randomly.

Furthermore, for example, the height of the pillars 1910 can be set to about 300 nm.

However, the diameter, the pitch, and the height of the pillars 1910 according to the nineteenth embodiment are not limited to the above-mentioned numerals, and can be variously changed as long as the pillar array has a board light absorption spectrum for at least a visible light region.

19.4 Actions and Effects

As described above, in the nineteenth embodiment, the pillar array 1900 buried in the on-chip lens 1918 is provided instead of an anti-flare film. In this manner, a step between the surface in the effective pixel region 1901 on which the on-chip lens 108 is formed and the surface in the shielding region 1902 on which the on-chip lens 1918 is formed can be reduced by the height of the anti-flare film, and hence the manufacturing precision (such as precision of shape) of the on-chip lens 108 at the peripheral part of the effective pixel region 1901 can be maintained.

In the nineteenth embodiment, the pillar array 1900 is configured to have a broad light absorption spectrum for at least a visible light region, and hence the color filter 107 in the shielding region 1902 can be omitted. Consequently, the step between the surface in the effective pixel region 1901 on which the on-chip lens 108 is formed and the surface in the shielding region 1902 on which the on-chip lens 1918 is formed can be further reduced to further reduce a difference h1 between the height of the on-chip lens 108 in the effective pixel region 1901 and the height of the on-chip lens 1918 in the shielding region 1902 after the manufacturing. Thus, the manufacturing precision (such as precision of shape) of the on-chip lens 108 at the peripheral part of the effective pixel region 1901 can be further maintained.

Other configurations, operations, and effects may be the same as those in the above-mentioned embodiments, and hence the detailed descriptions thereof are herein omitted.

20. Twentieth Embodiment

In the above-mentioned nineteenth embodiment, the color filter 107 in the shielding region 1902 is omitted to further reduce the step between the formation surface of the on-chip lens 108 in the effective pixel region 1901 and the formation surface of the on-chip lens 1918 in the shielding region 1902. However, the color filter 107 in the shielding region 1902 is not necessarily required to be omitted.

Figure 70:
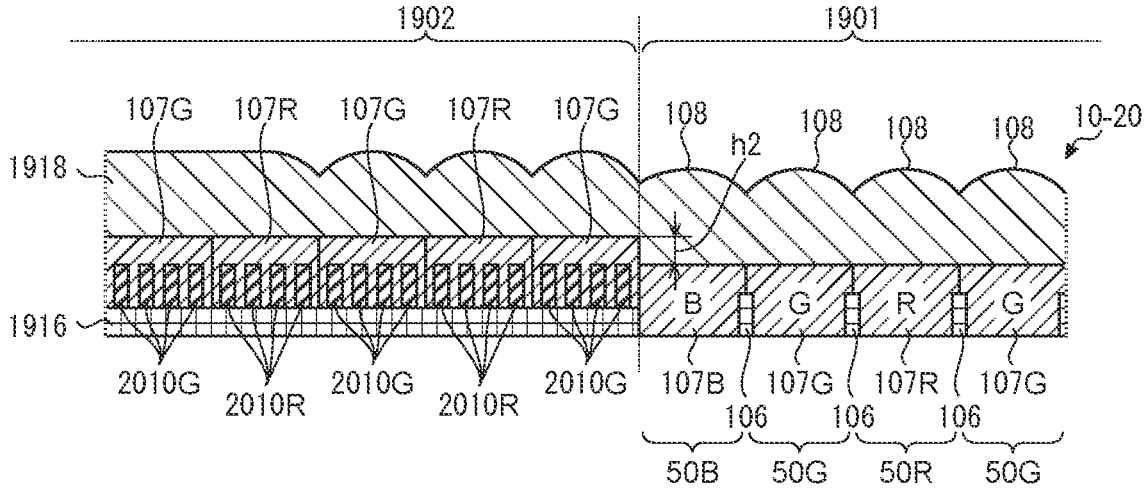
FIG. 70 is a cross-sectional diagram illustrating a cross-sectional structure example of a CMOS image sensor according to a twentieth embodiment.

In this case, for example, as in a CMOS image sensor 10-20 exemplified in FIG. 70, a pillar 2010 is formed on the OPB solid film 1916 and in the color filter 107.

Figure 71:
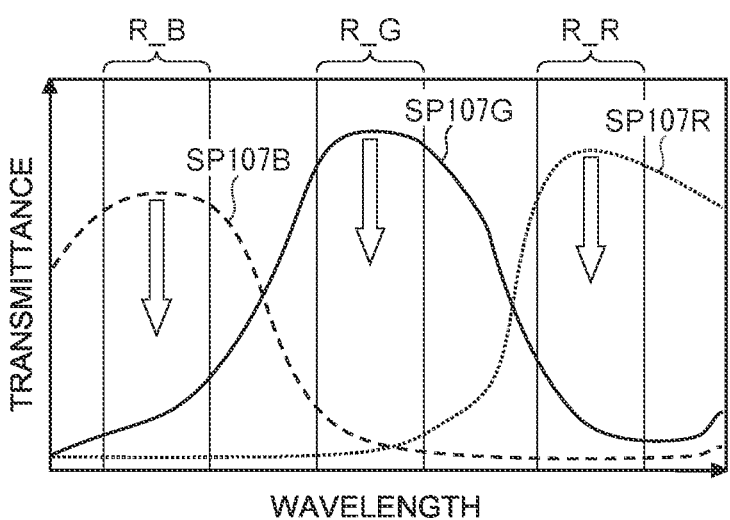
FIG. 71 is a diagram for explaining spectroscopic characteristics of a pillar array according to the twentieth embodiment.

As exemplified in FIG. 71, spectroscopic characteristics of a pillar array configured by pillars 2010R formed in a color filter 107R in the shielding region 1902 may be spectroscopic characteristics that absorb light having a wavelength region R_R mainly transmitted through at least the color filter 107R (light transmission spectrum SP107R). In this manner, a combined filter having a broad light absorption spectrum in at least a visible light region is formed by the color filter 107R and the pillar array configured by the pillars 2010R, and hence the generation of flare caused by light entering the color filter 107R in the shielding region 1902 can be suppressed.

Similarly, spectroscopic characteristics of a pillar array configured by pillars 2010G formed in a color filter 107G in the shielding region 1902 may be spectroscopic characteristics that absorb light having a wavelength region R_G (see FIG. 71) mainly transmitted through at least the color filter 107G (light transmission spectrum SP107G). In this manner, a combined filter having a broad light absorption spectrum in at least a visible light region is formed by the color filter 107G and the pillar array configured by the pillars 2010G, and hence the generation of flare caused by light entering the color filter 107G in the shielding region 1902 can be suppressed.

In FIG. 70, the color filter 107B is not provided in the shielding region 1902. Without being limited thereto, the color filter 107B may be provided in the shielding region 1902. In this case, spectroscopic characteristics of a pillar array configured by pillars 2010B formed in the color filter 107B in the shielding region 1902 may be spectroscopic characteristics that absorb light in a wavelength region R_B (see FIG. 71) mainly transmitted through at least the color filter 107B (light transmission spectrum SP107B). In this manner, a combined filter having a broad light absorption spectrum in at least a visible light region is formed by the color filter 107B and the pillar array configured by the pillars 2010B, and hence the generation of flare caused by light entering the color filter 107B in the shielding region 1902 can be suppressed.

For example, the diameter of the pillars 2010R formed in the color filter 107R in the shielding region 1902 can be set in the range of 80 to 120 nm. For example, the pitch between the pillars 2010R can be set to 400 nm. For example, the height of the pillars 2010R can be set to 300 nm.

For example, the diameter of the pillars 2010G formed in the color filter 107G in the shielding region 1902 can be set in the range of 80 to 130 nm. For example, the pitch between the pillars 2010R can be set to 320 nm. For example, the height of the pillars 2010R can be set to 300 nm.

In the case where the color filter 107B is provided in the shielding region 1902, for example, the diameter of the pillars 2010B formed in the color filter 107B in the shielding region 1902 can be set in the range of 60 to 80 nm. For example, the pitch between the pillars 2010B can be set to 280 nm. For example, the height of the pillars 2010B can be set to 300 nm. For example, similarly to the pillars constituting the pillar array 800G described above in the eighth embodiment with reference to FIG. 36, the pillar 2010G may have a structure in which the pillar 2010R and the pillar 20108 are stacked.

These numerals and structures are merely examples, and may be variously modified depending on the material used for the pillar 2010.

As described above, the combined filter configured by the color filter 107 and the pillar array can be used instead of an anti-flare film. Consequently, a step h2 between the surface, in the effective pixel region 1901, on which the on-chip lens 108 is formed and the surface, in the shielding region 1902, on which the on-chip lens 1918 is formed can be reduced by the height of the anti-flare film, and hence the manufacturing precision (such as precision of shape) of the on-chip lens 108 at the peripheral part of the effective pixel region 1901 can be maintained.

Other configurations, operations, and effects may be the same as those in the above-mentioned embodiments, and hence the detailed descriptions thereof are herein omitted.

21. Twenty-First Embodiment

Next, a twenty-first embodiment is described in detail with reference to the drawings. In the above-mentioned nineteenth embodiment, by providing the pillar array 1900 having a broad light absorption spectrum for at least a visible light region instead of an anti-flare film, the generation of flare caused by diffused reflection of light entering the shielding region 1902 is suppressed.

In the twenty-first embodiment, on the other hand, a case where a pillar array in addition to the anti-flare film is provided in the shielding region so as to further suppress the generation of flare caused by diffused reflection of light entering the shielding region is described by way of example.

In the above-mentioned embodiments, the CMOS image sensor 10 capable of acquiring a color image, which includes the color filter 107 in at least the effective pixel region, has been exemplified. The basic image sensor is not limited to an image sensor that acquires color images. For example, an image sensor that generates monochrome pixel signals for the purpose of ranging and sensing can be intended. In view of the above, in the twenty-first embodiment, a case based on an image sensor that generates monochrome pixel signals is taken as an example.

21.1 Cross-Sectional Structure Example of Shielding Region

Figure 72:
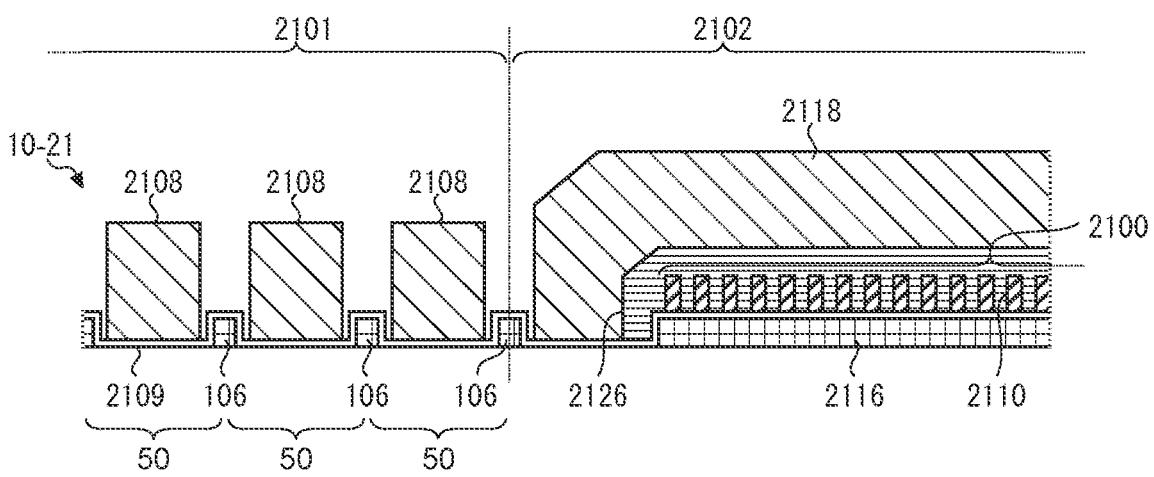
FIG. 72 is a cross-sectional diagram illustrating a cross-sectional structure example of a CMOS image sensor according to a twenty-first embodiment.

FIG. 72 is a cross-sectional diagram illustrating a cross-sectional structure example of a CMOS image sensor according to the twenty-first embodiment. For simple description, FIG. 72 illustrates a cross-sectional structure example of layers upper than the insulator film 105 in the above-mentioned embodiments, and omits the cross-sectional structure of lower layers. However, for example, the cross-sectional structures of the layers lower than the insulator film 105 in an effective pixel region 2101 may be the same as in the above-mentioned embodiments (see, for example, FIG. 33). In a shielding region 2102, the vicinity of a boundary with the effective pixel region 2101 may be the same as in the above-mentioned embodiments, and in a region apart from the boundary with the effective pixel region 2101, the photodiode PD (for example, N-type semiconductor region 101) may be omitted.

As illustrated in FIG. 72, in the effective pixel region 2101 in the CMOS image sensor 10-21, for example, on-chip lenses 2108 having rectangular cross sections are provided on the top surface of the insulator film 105 formed on the back surface side of the semiconductor substrate 100. The shapes of the top surface and the bottom surface of each on-chip lens 2108 may be various shapes such as a circle, an oval, and polygons of a triangle or larger. Instead of the on-chip lens 2108 having a rectangular cross section, the on-chip lens 108 the top surface of which has a radius of curvature as exemplified in the above-mentioned embodiments may be used.

A shielding film 106 that reduces the leakage of light, having obliquely entered a unit pixel 50, to a photodiode PD in an adjacent pixel 50 is provided between the on-chip lenses 2108.

In the shielding region 2102, on the other hand, an OPB solid film 2116 is formed on the top surface of the insulator film 105. For example, the formation region of the OPB solid film 2116 may be the entire shielding region 2102, or may be a region from a position apart from a boundary between the effective pixel region 2101 and the shielding region 2102 by a predetermined distance (for example, one unit pixel 50) to the outer edge of the shielding region 2102.

FIG. 72 exemplifies the structure in which the insulator film 105 on which the shielding film 106 and the OPB solid film 2116 are formed is covered by a passivation film 2109, but the passivation film 2109 may be omitted, or may be formed so as to cover the surfaces of the on-chip lenses 2108 and 2118. In the following description, it is assumed that the passivation film 2109 is omitted for clarity.

A pillar array 2100 configured by a plurality of pillars 2110 is provided on the top surface of the OPB solid film 2116. For example, similarly to the pillar array 1900 exemplified in the nineteenth embodiment, the pillar array 2100 may be designed to have a broad light absorption spectrum in at least a visible light region.

On the surface of the OPB solid film 2116 on which the pillars 2110 are provided, an anti-flare film 2126 is provided such that the pillars 2110 are buried.

The surface of the anti-flare film 2126 is covered with an on-chip lens 2118 formed continuously from the on-chip lens 2108 in the effective pixel region 2101 in order to maintain the manufacturing precision (such as precision of shape) of the on-chip lens 2108 at the peripheral part of the effective pixel region 2101.

Other configurations may be the same as those in the nineteenth embodiment, for example, and hence the detailed descriptions thereof are herein omitted.

21.2 Actions and Effects

As described above, by using the anti-flare film 2126 and the pillar array 2100 in combination and burying the pillar array 2100 in the anti-flare film 2126, the thickness of the anti-flare film 2126 can be reduced without deteriorating the flare reduction ability. Consequently, the step between the surface in the effective pixel region 2101 on which the on-chip lens 2108 is formed and the surface in the shielding region 2102 on which the on-chip lens 2118 is formed can be reduced by the reduced thickness, and hence the manufacturing precision (such as precision of shape) of the on-chip lens 2108 at the peripheral part of the effective pixel region 2101 can be maintained.

Other configurations, operations, and effects may be the same as those in the above-mentioned embodiments, and hence the detailed descriptions thereof are herein omitted.

22. Twenty-Second Embodiment

Figure 73:
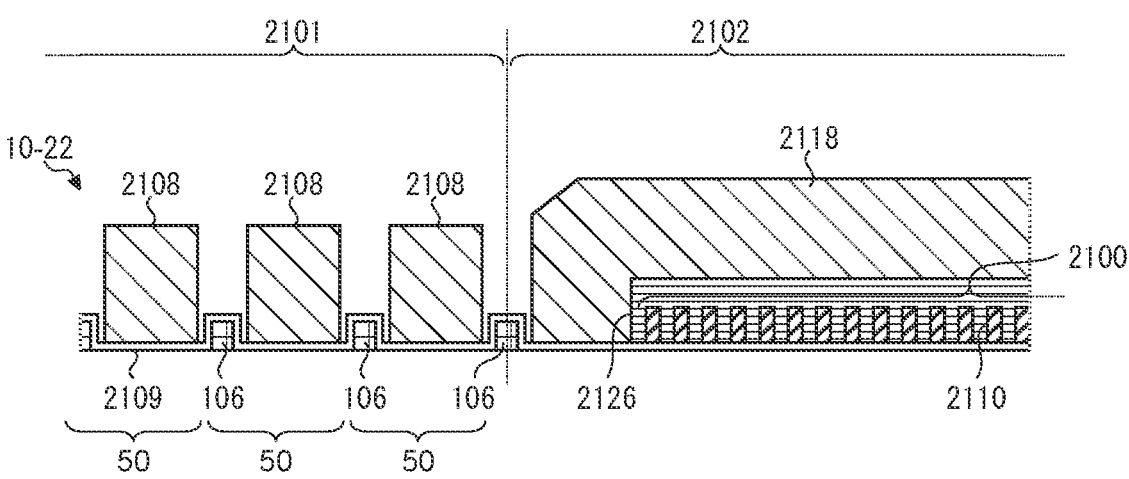
FIG. 73 is a cross-sectional diagram illustrating a cross-sectional structure example of a CMOS image sensor according to a twenty-second embodiment.

Although, in the twenty-first embodiment, the case where the pillar array 2100 and the anti-flare film 2126 are formed on the OPB solid film 2116 has been exemplified, the present invention is not limited to such a configuration. For example, the OPB solid film 2116 may be omitted as in a CMOS image sensor 10-22 exemplified in FIG. 73.

In this manner, by omitting the OPB solid film 2116, a step between a surface, in the effective pixel region 2101, on which the on-chip lens 2108 is formed and a surface, in the shielding region 2102, on which the on-chip lens 2118 is formed can be reduced by the thickness of the OPB solid film 2116. Thus, the manufacturing precision (such as precision of shape) of the on-chip lens 108 at the peripheral part of the effective pixel region 1901 can be further maintained.

Other configurations, operations, and effects may be the same as those in the above-mentioned embodiments, and hence the detailed descriptions thereof are herein omitted.

23. Twenty-Third Embodiment

Figure 74:
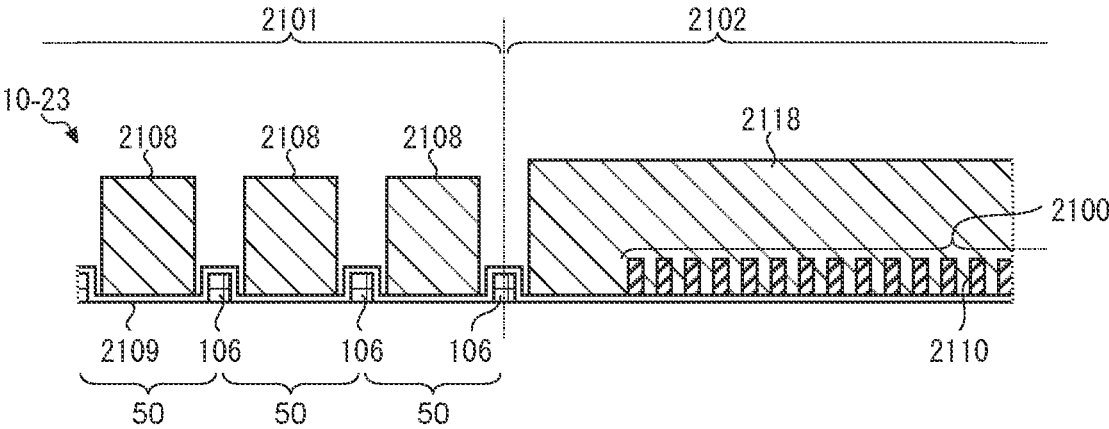
FIG. 74 is a cross-sectional diagram illustrating a cross-sectional structure example of a CMOS image sensor according to a twenty-third embodiment.

Although, in the above-mentioned twenty-second embodiment, the case where the OPB solid film 2116 is omitted has been exemplified, the present invention is not limited to such a configuration. For example, the anti-flare film 2126 may be further omitted as in a CMOS image sensor 10-23 exemplified in FIG. 74.

In this manner, by omitting the anti-flare film 2126, the step between the surface in the effective pixel region 2101 on which the on-chip lens 2108 is formed and the surface in the shielding region 2102 on which the on-chip lens 2118 is formed can be reduced by a difference between the height of the anti-flare film 2126 and the height of the pillar 2110, and hence the manufacturing precision (such as precision of shape) of the on-chip lens 108 at the peripheral part of the effective pixel region 1901 can be further maintained.

Other configurations, operations, and effects may be the same as those in the above-mentioned embodiments, and hence the detailed descriptions thereof are herein omitted.

24. Twenty-Fourth Embodiment

Figure 75:
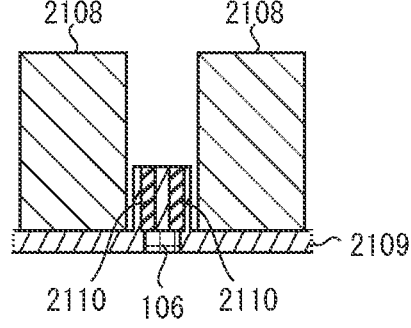
FIG. 75 is a cross-sectional diagram illustrating a cross-sectional structure example of a shielding film in a CMOS image sensor according to a twenty-fourth embodiment.

In the above-mentioned nineteenth to twenty-third embodiments, the case where the pillar 1910, 2010, or 2110 is provided in the shielding region 1902 or 2102 has been exemplified. The location to dispose the pillar 1910, 2010, or 2110 is not limited to the shielding region 1902 or 2102. For example, as illustrated in FIG. 75, the pillar 1910, 2010, or 2110 may be provided on the shielding film 106 provided at a boundary part of unit pixels 50. The shielding film 106 may be omitted from the configuration illustrated in FIG. 75. Such a configuration can decrease the thickness of the shielding film 106 or omit the shielding film 106.

FIG. 75 illustrates a case based on the twenty-first embodiment, but the basic embodiment is not limited to the twenty-first embodiment, and may be another embodiment described above or described later.

Other configurations, operations, and effects may be the same as those in the above-mentioned embodiments, and hence the detailed descriptions thereof are herein omitted.

25. Twenty-Fifth Embodiment

Next, a twenty-first embodiment is described in detail with reference to the drawings.

In the above-mentioned first to eighteenth embodiments, the case where the pillars are disposed in the color filter 107 has been exemplified. The arrangement location of the pillars is not limited to the inside of the color filter 107, and can be variously changed. In the twenty-fifth embodiment, a case where pillars are disposed in an on-chip lens is described by way of example.

25.1 Cross-Sectional Structure Example of Unit Pixel

Figure 76:
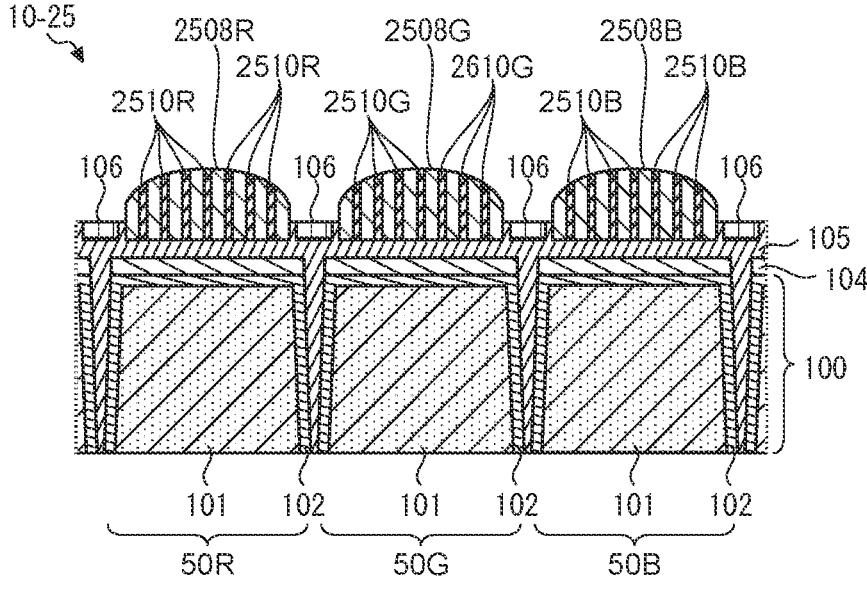
FIG. 76 is a cross-sectional diagram illustrating a cross-sectional structure example of a CMOS image sensor according to a twenty-fifth embodiment.

FIG. 76 is a cross-sectional diagram illustrating a cross-sectional structure example of a CMOS image sensor according to the twenty-fifth embodiment. Similarly to FIG. 33 in the eighth embodiment, for example, FIG. 76 illustrates a cross-sectional structure example of the photoreceiver chip 71 in FIG. 6, and omits a cross-sectional structure example of the circuitry chip 72. In FIG. 76, wiring layers constituting electrical connection from the transfer transistor 51 and the photoreceiver chip 71 to the circuitry chip 72 are also omitted. For the sake of description, FIG. 76 exemplifies a case where three unit pixels 50R, 50G, and 50B that receive wavelength components of three primary colors of RGB are arranged in a row along the cross section.

As exemplified in FIG. 76, a CMOS image sensor 10-25 according to the twenty-fifth embodiment has, for example, the same cross-sectional structure as the CMOS image sensor 10-18 according to the eighth embodiment exemplified in FIG. 33 but the color filter 107 is omitted, the pillars 110 are replaced by pillars 2510, and the pillars 2510 are disposed in an on-chip lens 2508.

In other words, the CMOS image sensor 10-25 according to the twenty-fifth embodiment has a configuration in which the on-chip lens 2508 including the pillars 2510 inside is provided on the top surface of the insulator film 105 formed on the back surface side of the semiconductor substrate 100.

FIG. 76 exemplifies the on-chip lenses 2508 separated for each unit pixel 50. Without being limited thereto, for example, the on-chip lenses 2508 may be integrally formed so as to be continuous across adjacent pixels 50 like the on-chip lenses 108 exemplified in the eighth embodiment. In FIG. 76, the passivation film 109 is omitted, but the passivation film 109 may be provided.

To more specifically describe the configuration illustrated in FIG. 76, a pillar array configured by a plurality of pillars 2510R is provided in an on-chip lens 2508R in a unit pixel 50R that generates a pixel signal based on light having a wavelength component corresponding to red. For example, similarly to the pillar array 1400R exemplified in the fourteenth embodiment, the pillar array configured by the pillars 2510R has a light transmission spectrum SP1410B selectively absorbing light having a wavelength component of blue (B), a light transmission spectrum SP1410G selectively absorbing light having a wavelength component of green (G), and a light transmission spectrum SP1410IR selectively absorbing light having a wavelength component corresponding to IR light (see, for example, FIG. 59). In other words, the pillar array configured by the pillars 2510R has spectroscopic characteristics that transmit light having a wavelength component of red (R) and absorb light having other wavelength components.

Similarly, a pillar array configured by a plurality of pillars 2510G is provided in an on-chip lens 2508G in a unit pixel 50G that generates a pixel signal based on light having a wavelength component corresponding to green. For example, similarly to the pillar array 1400G exemplified in the fourteenth embodiment, the pillar array configured by the pillars 2510G has a light transmission spectrum SP1410B selectively absorbing light having a wavelength component of blue (B), a light transmission spectrum SP1410R selectively absorbing light having a wavelength component of red (R), and a light transmission spectrum SP1410IR selectively absorbing light having a wavelength component corresponding to IR light (see, for example, FIG. 59). In other words, the pillar array configured by the pillars 2510G has spectroscopic characteristics that transmit light having a wavelength component of green (G) and absorb light having other wavelength components.

Similarly, a pillar array configured by a plurality of pillars 2510B is provided in an on-chip lens 2508B in a unit pixel 50B that generates a pixel signal based on light having a wavelength component corresponding to blue. For example, similarly to the pillar array 1400B exemplified in the fourteenth embodiment, the pillar array configured by the pillars 2510B has a light transmission spectrum SP1410G selectively absorbing light having a wavelength component of green (G), a light transmission spectrum SP1410R selectively absorbing light having a wavelength component of red (R), and a light transmission spectrum SP1410IR selectively absorbing light having a wavelength component corresponding to IR light (see, for example, FIG. 59). In other words, the pillar array configured by the pillars 2510B has spectroscopic characteristics that transmit light having a wavelength component of blue (B) and absorb light having other wavelength components.

However, in the twenty-fifth embodiment, the pillars 2510R are provided at at least a center part of the on-chip lens 2508R. Other configurations may be the same as, for example, the cross-sectional structure example of the unit pixel 50 described above in the eighth embodiment with reference to FIG. 33.

25.2 Manufacturing Method for On-Chip Lens

Next, a manufacturing method for an on-chip lens including pillars therein according to the twenty-fifth embodiment is described below by way of specific example. In the following description, the insulator film 105 has already been formed on the back surface side of the semiconductor substrate 100, and the shielding film 106 has already been formed on the insulator film 105.

Figure 77:
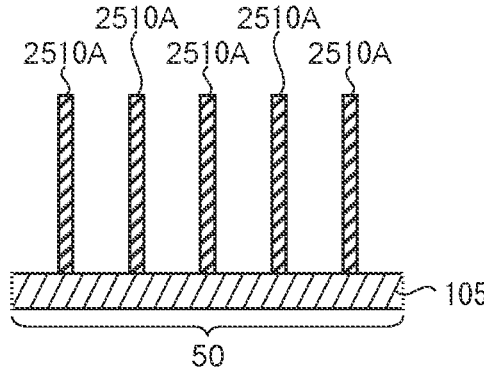
FIG. 77 is a diagram illustrating a manufacturing method for an on-chip lens according to the twenty-fifth embodiment (No. 1).

In this manufacturing method, first, as illustrated in FIG. 77, pillars 2510A made of the same material as the pillars 2510 are formed on the insulator film 105 formed on the back surface side of the semiconductor substrate 100. The material of the pillar 2510A and its crystal state may be the same as in the above-mentioned embodiments. For the formation of the pillar 2510A, for example, photolithography and etching technology can be used. Specifically, for example, a material film of the same material as the pillar 2510 is formed on the insulator film 105, and a resist solution is spin-coated on the top surface of the material film. An arrangement pattern of the pillars 2510 is transferred to the spin-coated resist solution to form a resist film having the same pattern as the arrangement pattern of the pillars 2510. The material film is etched by, for example, DRIE with the use of the resist film as a mask to form the pillars 2510A. For example, the height of the manufactured pillar 2510A may be equal to or higher than the height of the highest pillar 2510 among the pillars 2510 after the processing.

Figure 78:
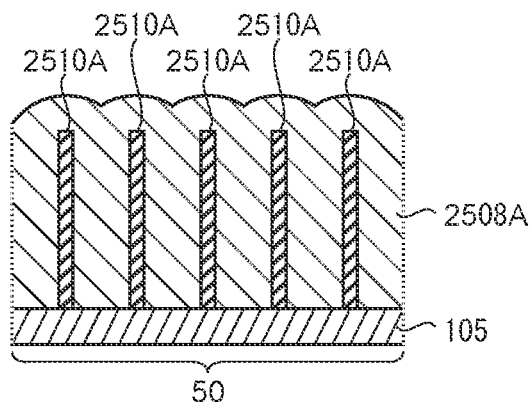
FIG. 78 is a diagram illustrating the manufacturing method for an on-chip lens according to the twenty-fifth embodiment (No. 2).

Next, as illustrated in FIG. 78, on the insulator film 105 on which the pillars 2510A are formed, a material film 2508A of the same material as the on-chip lens 2508 is formed such that the pillars 2510A are buried. For the material of the material film 2508A, for example, silicon oxide ($SiO_2$) can be used. For the formation of the material film 2508A, for example, sputtering or CVD (including plasma CVD) can be used.

Figure 79:
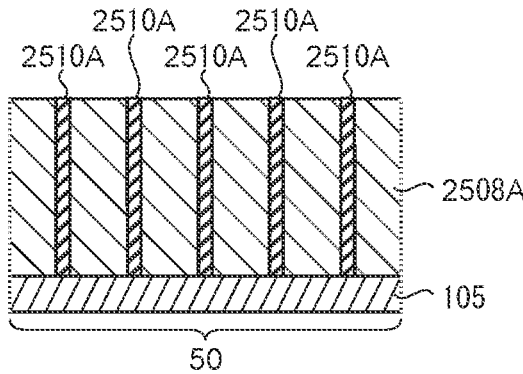
FIG. 79 is a diagram illustrating the manufacturing method for the on-chip lens according to the twenty-fifth embodiment (No. 3).

Next, as illustrated in FIG. 79, the top surface of the material film 2508A is planarized by, for example, chemical mechanical polishing (CMP). In this case, the top surface of the pillar 2510A may be exposed from the top surface of the material film 2508A.

Figure 80:
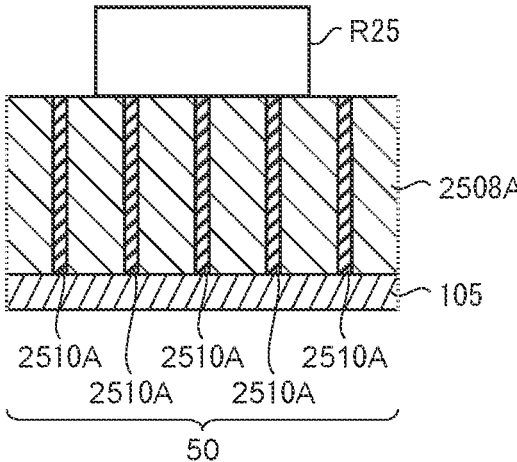
FIG. 80 is a diagram illustrating the manufacturing method for the on-chip lens according to the twenty-fifth embodiment (No. 4).

Next, as illustrated in FIG. 80, a resist film R25 for each unit pixel 50 is formed on the top surface of the material film 2508A. For example, the formation position of the resist film R25 may be a center part in a region in which each unit pixel 50 is formed. For the formation of the resist film R25, ordinary photolithography may be used.

Figure 81:
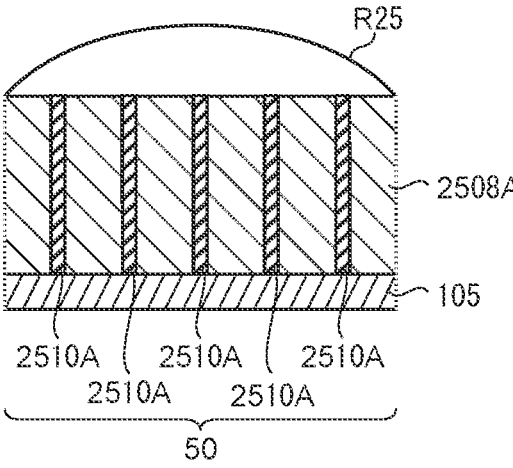
FIG. 81 is a diagram illustrating the manufacturing method for the on-chip lens according to the twenty-fifth embodiment (No. 5).

Next, the resist film R25 on the material film 2508A is heated and molten so that, as illustrated in FIG. 81, the surface of the softened resist film R25 has a radius of curvature. For the heating of the resist film R25, baking and annealing can be used.

Figure 82:
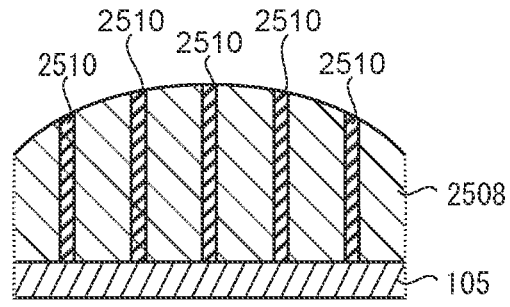
FIG. 82 is a diagram illustrating the manufacturing method for the on-chip lens according to the twenty-fifth embodiment (No. 6).

Next, the resist film R25, the material film 2508A, and the pillars 2510A are etched from above the resist film R25 a surface of which has a radius of curvature, thereby transferring the radius of curvature of the surface of the resist film R25 to the surface of a structure of the material film 2508A and the pillars 2510A. In this manner, as illustrated in FIG. 82, the on-chip lens 2508 including the pillars 2510 inside is formed. In the etching in this case, it is preferred to use etching conditions that the selection ratios for the resist film R25, the material film 2508A, and the pillars 2510A are the same. However, the radius of curvature of the surface of the resist film R25 is not required to be transferred to the material film 2508A and the pillars 2510A as it is. The radius of curvature of the surface of the resist film R25 may be different from the radius of curvature of the surface of the on-chip lens 2508 after the processing.

25.3 Actions and Effects

As described above, by disposing the pillar array configured by the pillars 2510 functioning as a wavelength filter in the on-chip lens 2508, the color filter 107 can be omitted. Consequently, the thickness of the photoreceiver chip 71 can be decreased, and an electronic device can be downsized due to the downsized CMOS image sensor 10-25.

Other configurations, operations, and effects may be the same as those in the above-mentioned embodiments, and hence the detailed descriptions thereof are herein omitted.

26. Twenty-Sixth Embodiment

In the above-mentioned twenty-fifth embodiment, the diameters and the pitches of the pillars 2510 provided in each on-chip lens 2508 can be variously changed similarly to the above-mentioned embodiments.

Figure 83:
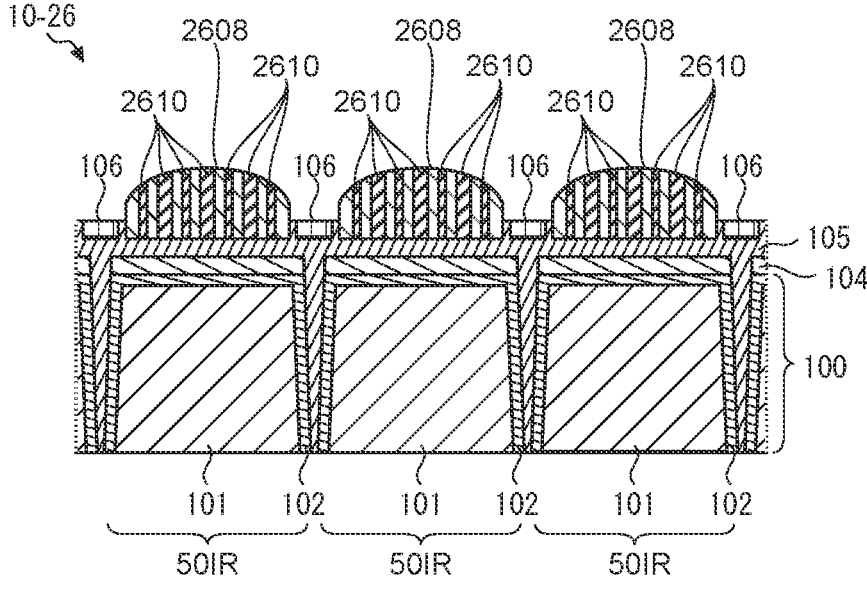
FIG. 83 is a cross-sectional diagram illustrating a cross-sectional structure example of a CMOS image sensor according to a twenty-sixth embodiment.

For example, as in a CMOS image sensor 10-26 exemplified in FIG. 83, the diameters and the pitches of pillars 2610 provided in each on-chip lens 2608 can be randomly changed (see, for example, FIG. 21) so as to constitute a pillar array as a wavelength filter for broadly absorbing light in a visible light region as a whole, thereby constituting a unit pixel 50IR that generates a pixel signal based on IR light.

The pillar array for broadly absorbing light in a visible light region as a whole is not limited to the random configuration exemplified in FIG. 21, and can be implemented by various configurations as exemplified in FIG. 22 and FIG. 35 in which the diameter changes gradually or step by step from the bottom surface (insulator film 105 side) toward the top surface or the apex.

27. Twenty-Seventh Embodiment

The above-mentioned embodiments are not limited to the structure in which one on-chip lens 108 or 2508 is disposed in one unit pixel 50, and can be similarly applied to a structure in which one on-chip lens is disposed in two or more unit pixels 50.

Figure 84:
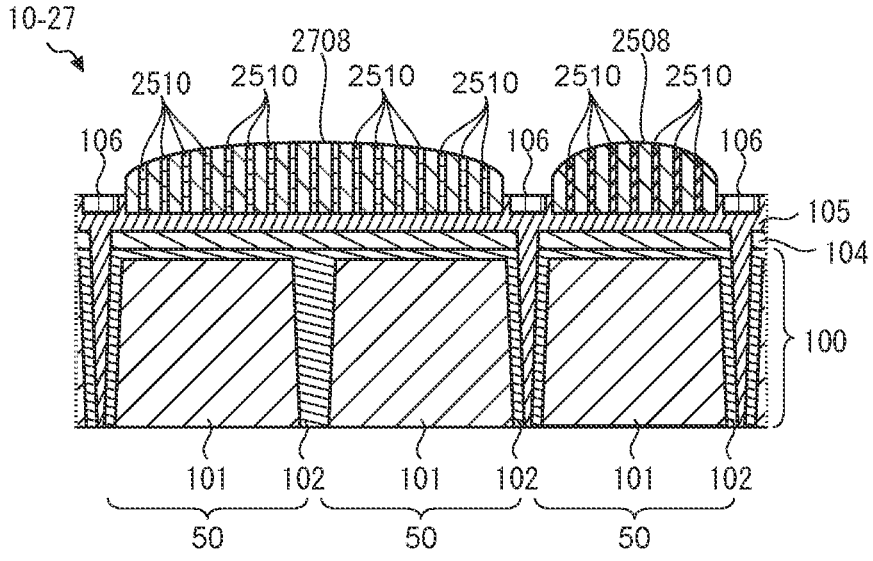
FIG. 84 is a cross-sectional diagram illustrating a cross-sectional structure example of a CMOS image sensor according to a twenty-seventh embodiment.

For example, as in a CMOS image sensor 10-27 exemplified in FIG. 84, the structure exemplified in the twenty-fifth embodiment can be similarly applied to a structure in which one on-chip lens 2708 is disposed in two unit pixels 50.

FIG. 84 exemplifies the case based on the twenty-fifth embodiment. However, the basic embodiment is not limited to the twenty-fifth embodiment, and may be the embodiments described above or described later.

28. Twenty-Eighth Embodiment

Furthermore, in the above-mentioned embodiments, the case where the unit pixels 50 are separated by the FFTI or RDTI pixel separation portion has been exemplified. The above-mentioned embodiments are not limited to these configurations.

Figure 85:
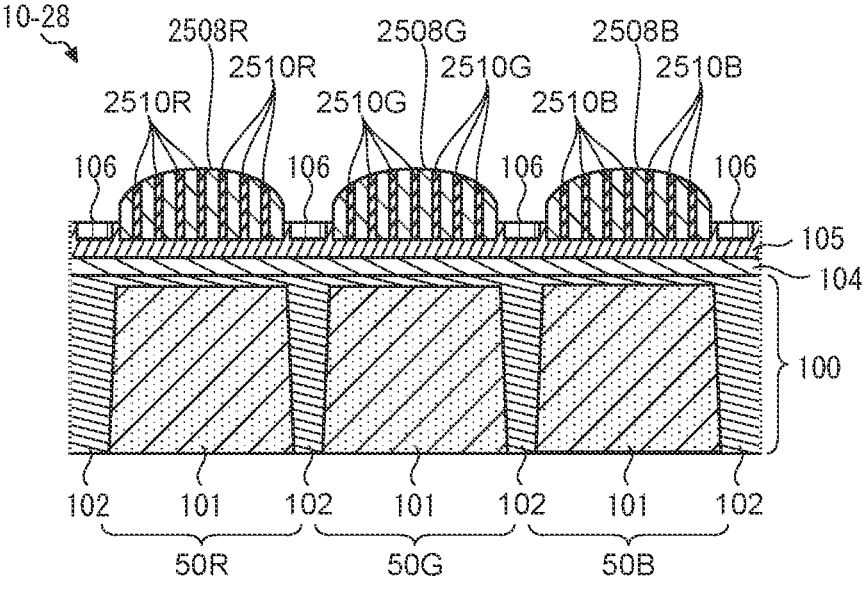
FIG. 85 is a cross-sectional diagram illustrating a cross-sectional structure example of a CMOS image sensor according to a twenty-eighth embodiment.

For example, as in a CMOS image sensor 10-28 exemplified in FIG. 85, the unit pixels 50 are not necessarily required to be separated by a pixel separation portion. FIG.

85 exemplifies the case based on the twenty-fifth embodiment. The basic embodiment is not limited to the twenty-fifth embodiment, and may be any one of the above-mentioned embodiments.

29. Applications to Mobile Body

The technology according to the present disclosure (present technology) may be applied to various products. For example, the technology according to the present disclosure may be implemented as devices mounted on any kind of mobile bodies, including automobiles, electric vehicles, hybrid electric vehicles, motorcycles, bicycles, personal mobilities, airplanes, drones, ships, and robots.

Figure 86:
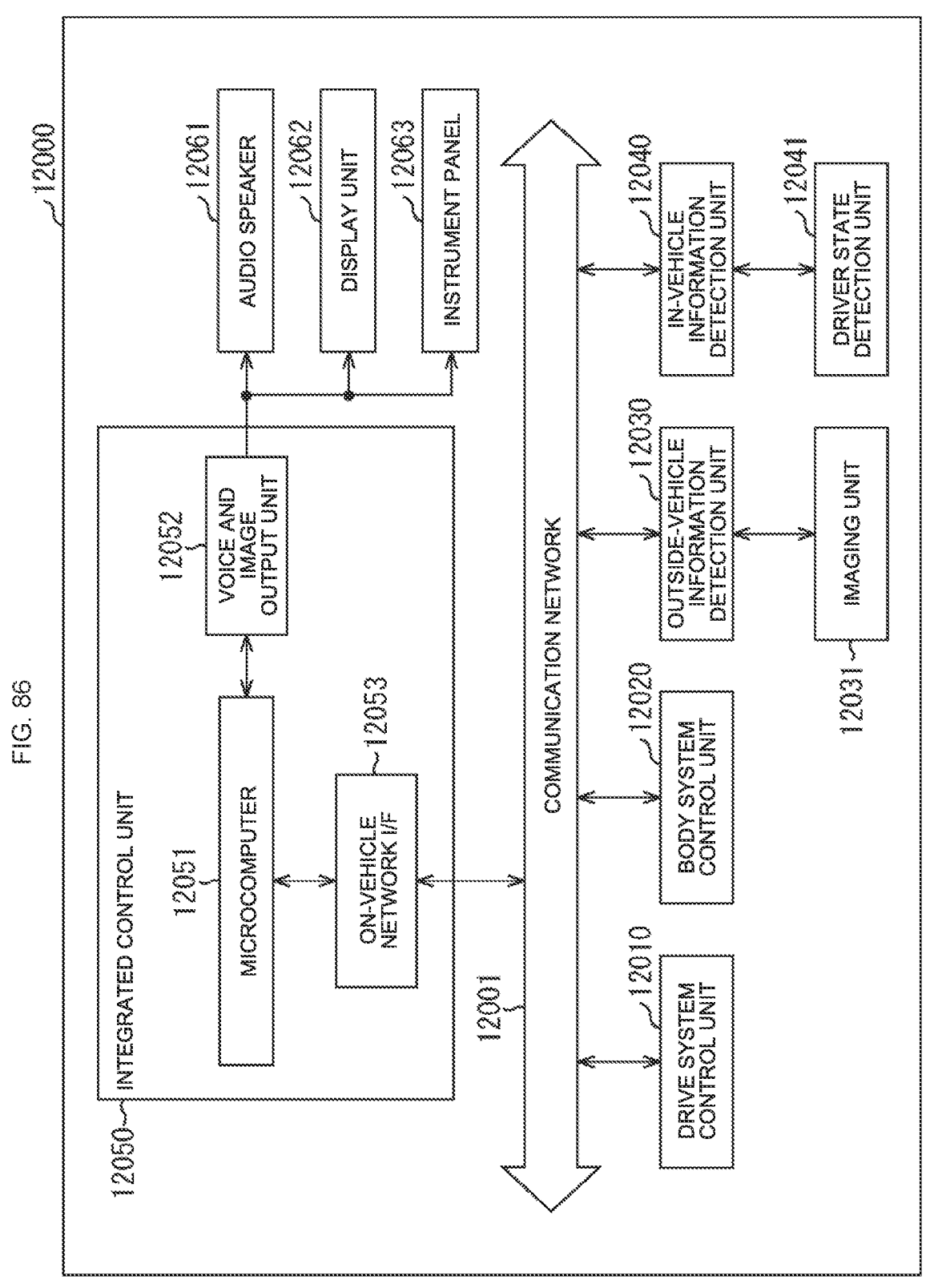
FIG. 86 is a block diagram illustrating an example of a schematic configuration of a vehicle control system.

FIG. 86 is a block diagram illustrating a schematic configuration example of a vehicle control system as an example of a mobile control system to which the technology according to the present disclosure may be applied.

A vehicle control system 12000 includes a plurality of electronic control units connected through a communication network 12001. In the example illustrated in FIG. 86, the vehicle control system 12000 includes a driving system control unit 12010, a body system control unit 12020, an outside-vehicle information detection unit 12030, an in-vehicle information detection unit 12040, and an integrated control unit 12050. As a functional configuration of the integrated control unit 12050, a microcomputer 12051, a voice and image output unit 12052, and an on-vehicle network interface (I/F) 12053 are illustrated.

The driving system control unit 12010 controls the operation of devices related to a driving system of a vehicle in accordance with various kinds of computer programs. For example, the driving system control unit 12010 functions as a control device such as a drive power generation device configured to generate drive power for a vehicle, such as an internal combustion engine and a drive motor, a drive power transmission mechanism configured to transmit drive power to a wheel, a steering mechanism configured to adjust a steering angle of a vehicle, and a braking device configured to generate braking force for a vehicle.

The body system control unit 12020 controls the operation of various kinds of device mounted to the vehicle body in accordance with various kinds of computer programs. For example, the body system control unit 12020 functions as a control device for a keyless entry system, a smart key system, a power window device, or various kinds of lamps such as a head lamp, a back lamp, a brake lamp, a blinker, and a fog lamp. In this case, radio waves transmitted from a mobile terminal substituting for a key or signals from various kinds of switches may be input to the body system control unit 12020. The body system control unit 12020 receives input of the radio waves or the signals to control a door lock device, a power window device, and a lamp of the vehicle.

The outside-vehicle information detection unit 12030 detects information outside a vehicle having the vehicle control system 12000 mounted thereon. For example, an imaging unit 12031 is connected to the outside-vehicle information detection unit 12030. The outside-vehicle information detection unit 12030 causes the imaging unit 12031 to take an image outside the vehicle, and receives the taken image. Based on the received image, the outside-vehicle information detection unit 12030 may perform object detection processing for persons, cars, obstacles, signs, or characters on a road surface or perform distance detection processing.

The imaging unit 12031 is an optical sensor configured to receive light and outputting an electric signal corresponding to the received light amount. The imaging unit 12031 may output the electric signal as an image, and may output the electric signal as ranging information. Light received by the imaging unit 12031 may be visible light or invisible light such as infrared rays.

The in-vehicle information detection unit 12040 detects information inside the vehicle. For example, a driver state detection unit 12041 configured to detect the state of a driver is connected to the in-vehicle information detection unit 12040. For example, the driver state detection unit 12041 includes a camera configured to taking an image of a driver, and the in-vehicle information detection unit 12040 may calculate the degree of fatigue or degree of concentration of the driver or determine whether the driver is asleep based on detection information input from the driver state detection unit 12041.

The microcomputer 12051 can calculate a control target value for a drive power generation device, a steering mechanism, or a braking device based on information inside or outside the vehicle acquired by the outside-vehicle information detection unit 12030 or the in-vehicle information detection unit 12040, and output a control instruction to the driving system control unit 12010. For example, the microcomputer 12051 can perform collaborative control for the purpose of implementing functions of an advanced driver assistance system (ADAS) including vehicle collision avoidance or impact alleviation, tracking traveling, vehicle speed keeping traveling, and vehicle collision warning based on inter-vehicular distance, or vehicle lane deviation warning.

The microcomputer 12051 can perform collaborative control for the purpose of automatic driving to autonomously drive independently of driver's operation by controlling the drive power generation device, the steering mechanism, or the braking device based on information around the vehicle acquired by the outside-vehicle information detection unit 12030 or the in-vehicle information detection unit 12040.

The microcomputer 12051 can output a control instruction to the body system control unit 12020 based on information outside the vehicle acquired by the outside-vehicle information detection unit 12030. For example, the microcomputer 12051 can perform collaborative control for the purpose of antiglare to control a head lamp in accordance with the position of a preceding vehicle or an oncoming vehicle detected by the outside-vehicle information detection unit 12030 and switch from high beams to low beams.

The voice and image output unit 12052 transmits an output signal of at least one of voice and images to an output device capable of notifying a vehicle occupant or the outside of the vehicle of information visually or aurally. FIG. 86 exemplifies an audio speaker 12061, a display unit 12062, and an instrument panel 12063 as output devices. For example, the display unit 12062 may include at least one of an onboard display and a head-up display.

Figure 87:
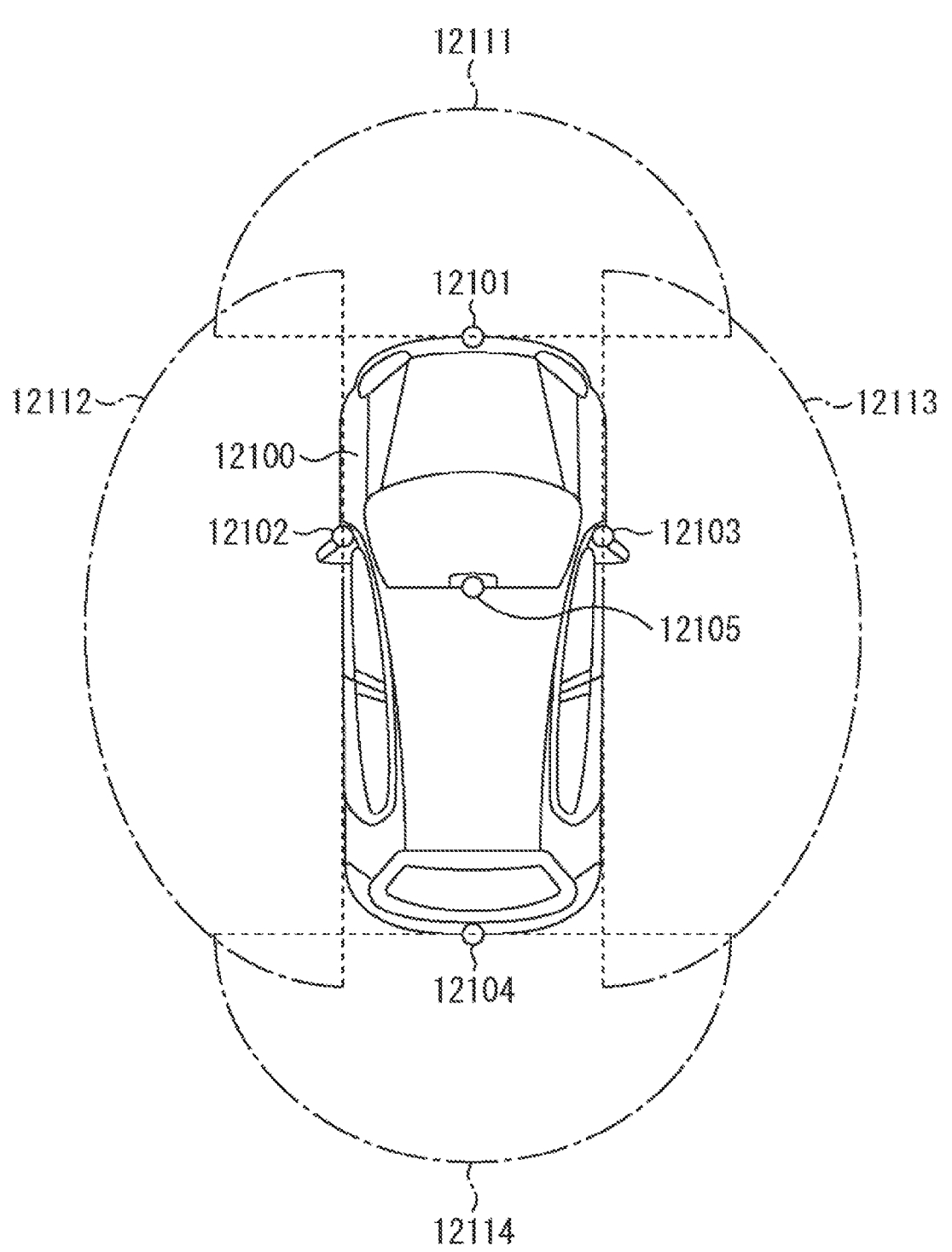
FIG. 87 is an explanatory diagram illustrating an example of installation positions of an outside-vehicle information detection unit and imaging units.

FIG. 87 is a diagram illustrating an example of an installation position of the imaging unit 12031.

In FIG. 87, as the imaging unit 12031, imaging units 12101, 12102, 12103, 12104, and 12105 are provided.

For example, the imaging units 12101, 12102, 12103, 12104, and 12105 are provided at positions of a front nose, side mirrors, a rear bumper, and a back door of a vehicle 12100 and an upper part of a front window in the vehicle interior. The imaging unit 12101 provided to the front nose and the imaging unit 12105 provided at the upper part of the front window in the vehicle interior mainly acquire images in front of the vehicle 12100. The imaging units 12102 and 12103 provided to the side mirrors mainly acquire images on the sides of the vehicle 12100. The imaging unit 12104 provided to the rear bumper or the back door mainly acquires images behind the vehicle 12100. The imaging unit 12105 provided at the upper part of the front window in the vehicle interior is mainly used for detection of preceding vehicles, pedestrians, obstacles, traffic lights, road signs, or lanes.

FIG. 87 illustrates an example of photographing ranges of the imaging units 12101 to 12104. An imaging range 12111 indicates an imaging range of the imaging unit 12101 provided to the front nose. Imaging ranges 12112 and 12113 indicate imaging ranges of the imaging units 12102 and 12103 provided to the side mirrors, respectively. An imaging range 12114 indicates an imaging range of the imaging unit 12104 provided to the rear bumper or the back door. For example, pieces of image data taken by the imaging units 12101 to 12104 are superimposed to obtain an overhead image seen from above the vehicle 12100.

At least one of the imaging units 12101 to 12104 may have a function for acquiring distance information. For example, at least one of the imaging units 12101 to 12104 may be a stereo camera including a plurality of imaging elements, or may be an imaging element having pixels for phase difference detection.

For example, the microcomputer 12051 can determine a distance to each three-dimensional object in the imaging ranges 12111 to 12114 and a temporal change of the distance (relative speed to vehicle 12100) based on the distance information obtained from the imaging units 12101 to 12104, thereby particularly extracting, as a preceding vehicle, a three-dimensional object that is closest on a traveling road of the vehicle 12100 and is traveling at a predetermined speed (for example, 0 km/h or more) in substantially the same direction as the vehicle 12100. Furthermore, the microcomputer 12051 can set an inter-vehicular distance to be secured behind a preceding vehicle in advance to perform automatic braking control (including following stop control) and automatic acceleration control (including following start control). In this manner, the collaborative control for the purpose of automatic driving to autonomously travel independently of driver's operation can be performed.

For example, the microcomputer 12051 can classify three-dimensional object data on three-dimensional objects in to two-wheeled vehicles, standard-sized vehicles, large vehicles, pedestrians, and other three-dimensional objects such as telephone poles on the basis of distance information obtained from the imaging units 12101 to 12104 and extract the three-dimensional object data, and use the three-dimensional object data for automatic obstacle avoidance. For example, the microcomputer 12051 distinguishes obstacles around the vehicle 12100 to obstacles that can be visually recognized by a driver of the vehicle 12100 and obstacles that are difficult to be visually recognized. The microcomputer 12051 determines a collision risk indicating the degree of danger of collision with each obstacle, and in a situation where a collision risk is equal to or higher than a set value and the vehicle can possibly collide, the microcomputer 12051 can assist the driving for collision avoidance by outputting warning to the driver through the audio speaker 12061 or the display unit 12062 and performing forced deceleration and avoidance steering through the driving system control unit 12010.

At least one of the imaging units 12101 to 12104 may be an infrared camera configured to detect infrared rays. For example, the microcomputer 12051 can determine whether a pedestrian is present in images taken by the imaging units 12101 to 12104 to recognize the pedestrian. For example, the pedestrian is recognized by a procedure for extracting feature points in images taken by the imaging units 12101 to 12104 as infrared cameras and a procedure for determining whether an object is a pedestrian by performing pattern matching on a series of feature points indicating the contour of the object. When the microcomputer 12051 determines that a pedestrian is present in the images taken by the imaging units 12101 to 12104 and recognizes the pedestrian, the voice and image output unit 12052 controls the display unit 12062 to display the rectangular contour line for emphasizing the recognized pedestrian in a superimposed manner. The voice and image output unit 12052 may control the display unit 12062 to display an icon indicating a pedestrian at a desired position.

While the embodiments of the present disclosure have been described, the technical scope of the present disclosure is not limited to the above-mentioned embodiments as they are, and can be variously changed within the range not departing from the gist of the present disclosure. The components in different embodiments and modifications may be combined as appropriate.

The effects in each embodiment described herein are merely demonstrative and are not limited, and other effects may be obtained. The present technology can also employ the following configurations.

(1) A solid-state imaging device, comprising:
a semiconductor substrate including a photoelectric conversion element;
a lens disposed above a first light incident surface of the photoelectric conversion element; and
a plurality of columnar structures disposed on a surface parallel to the first light incident surface that is located between a second light incident surface of the lens and the first light incident surface of the photoelectric conversion element, wherein
the columnar structure includes at least one of silicon, germanium, gallium phosphide, aluminum oxide, cerium oxide, hafnium oxide, indium oxide, tin oxide, niobium pentoxide, magnesium oxide, tantalum pentoxide, titanium pentoxide, titanium oxide, tungsten oxide, yttrium oxide, zinc oxide, zirconia, cerium fluoride, gadolinium fluoride, lanthanum fluoride, and neodymium fluoride.

(2) The solid-state imaging device according to the (1), wherein a crystal state of the columnar structure is a single crystal, a polycrystal, or amorphous.

(3) The solid-state imaging device according to the (1) or (2), wherein a refractive index of the columnar structure is 1.5 or more.

(4) The solid-state imaging device according to any one of the (1) to (3), wherein the columnar structures are arranged on the surface parallel to the first light incident surface in accordance with square arrangement, hexagonal close-packed arrangement, or random arrangement.

(5) The solid-state imaging device according to any one of the (1) to (4), wherein
a diameter of the columnar structure is 30 nanometers (nm) or more and 200 nm or less, and
a pitch between the columnar structures is 200 nanometers (nm) or more and 1,000 nm or less.

(6) The solid-state imaging device according to any one of the (1) to (5), wherein the columnar structure includes a tapered shape a diameter of which decreases or increases from the surface parallel to the first light incident surface toward the second light incident surface of the lens.

(7) The solid-state imaging device according to the (6), wherein an elevation angle of a side surface of the columnar structure with respect to the surface parallel to the first light incident surface is 45 degrees or more and less than 90 degrees or more than 90 degrees and 135 degrees or less.

(8) The solid-state imaging device according to any one of the (1) to (5), wherein a diameter of the columnar structure changes step by step from the surface parallel to the first light incident surface toward the second light incident surface of the lens.

(9) The solid-state imaging device according to any one of the (1) to (8), wherein the columnar structures include two or more kinds of columnar structures having different diameters.

(10) The solid-state imaging device according to the (1), further comprising a color filter that selectively transmits light having a particular wavelength, the color filter being disposed between the second light incident surface of the lens and the first light incident surface of the photoelectric conversion element.

(11) The solid-state imaging device according to the (10), wherein the columnar structure is disposed inside the color filter.

(12) The solid-state imaging device according to any one of the (1) to (10), wherein at least a part of each of the columnar structures is disposed in a trench extending from a surface of the semiconductor substrate on a side opposed to the lens toward the photoelectric conversion element in the semiconductor substrate.

(13) The solid-state imaging device according to the (10), further comprising a planarization film disposed between the color filter and the semiconductor substrate, a surface of the planarization film opposed to the color filter being planarized, wherein the columnar structures are disposed inside the planarization film.

(14) The solid-state imaging device according to the (10), wherein
the semiconductor substrate includes a first photoelectric conversion element and a second photoelectric conversion element,
the lens includes a first lens disposed above a first light incident surface of the first photoelectric conversion element and a second lens disposed above a first light incident surface of the second photoelectric conversion element,
the color filter is disposed between the first photoelectric conversion element and the first lens, and is not disposed between the second photoelectric conversion element and the second lens, and
among the columnar structures,
a plurality of first columnar structures disposed between the first light incident surface of the first photoelectric conversion element and the second light incident surface of the first lens have spectroscopic characteristics that absorb infrared light, and
a plurality of second columnar structures disposed between the first light incident surface of the second photoelectric conversion element and the second light incident surface of the second lens have spectroscopic characteristics that transmit infrared light.

(15) The solid-state imaging device according to any one of the (1) to (13), wherein
the semiconductor substrate includes a first photoelectric conversion element and a second photoelectric conversion element, the lens includes a first lens disposed above the first light incident surface of the first photoelectric conversion element and a second lens disposed above the first light incident surface of the second photoelectric conversion element, and of the columnar structures, a diameter of each of a plurality of first columnar structures disposed between the first light incident surface of the first photoelectric conversion element and the second light incident surface of the first lens and a diameter of each of a plurality of second columnar structures disposed between the first light incident surface of the second photoelectric conversion element and the second light incident surface of the second lens are different from each other.

(16) The solid-state imaging device according to the (10) or (11), wherein the color filter includes a first color filter that selectively transmits light having a first particular wavelength and a second color filter that selectively transmits light having the first particular wavelength, the semiconductor substrate includes a first photoelectric conversion element and a second photoelectric conversion element, the lens includes a first lens disposed above the first light incident surface of the first photoelectric conversion element and a second lens disposed above the first light incident surface of the second photoelectric conversion element, the first color filter is disposed between the first photoelectric conversion element and the first lens, the second color filter is disposed between the second photoelectric conversion element and the second lens, and of the columnar structures, a diameter of each of a plurality of first columnar structures disposed between the first light incident surface of the first photoelectric conversion element and the second light incident surface of the first lens and a diameter of each of a plurality of second columnar structures disposed between the first light incident surface of the second photoelectric conversion element and the second light incident surface of the second lens are different from each other.

(17) The solid-state imaging device according to any one of the (1) to (16), wherein the columnar structures have spectroscopic characteristics that selectively transmit any one of light having a wavelength component of red, light having a wavelength component of green, light having a wavelength component of blue, and infrared light.

(18) An electronic device, comprising:

a solid-state imaging device, an optical system that forms an image of incident light on a light receiving surface of the solid-state imaging device; and a control unit that controls the solid-state imaging device, wherein the solid-state imaging device includes:

a semiconductor substrate including a photoelectric conversion element;

a lens disposed above a first light incident surface of the photoelectric conversion element; and a plurality of columnar structures disposed on a surface parallel to the first light incident surface that is located between a second light incident surface of the lens and the first light incident surface of the photoelectric conversion element, and the columnar structure includes at least one of silicon, germanium, gallium phosphide, aluminum oxide, cerium oxide, hafnium oxide, indium oxide, tin oxide, niobium pentoxide, magnesium oxide, tantalum pentoxide, titanium pentoxide, titanium oxide, tungsten oxide, yttrium oxide, zinc oxide, zirconia, cerium fluoride, gadolinium fluoride, lanthanum fluoride, and neodymium fluoride.

(19) A solid-state imaging device, including:

a semiconductor substrate including a plurality of photoelectric conversion elements;

a lens disposed above a first light incident surface of each of the photoelectric conversion elements;

a plurality of color filters, each disposed between the semiconductor substrate and the lens to each of the photoelectric conversion elements, that transmit light having a particular wavelength; and a plurality of columnar structures disposed on a surface parallel to the first light incident surface that is located between a second light incident surface of the lens and the first light incident surface of the photoelectric conversion element, in which the color filters include a first color filter that selectively transmits light in a first wavelength region and a second color filter that selectively transmits light in a second wavelength region different from the first wavelength region, and among the columnar structures, a plurality of columnar structures located between a photoelectric conversion element and a lens and disposed at positions opposed to each other across the first color filter have spectroscopic characteristics that absorb at least light in a wavelength region between the first wavelength region and the second wavelength region.

(20) A solid-state imaging device, including:

a semiconductor substrate including a plurality of photoelectric conversion elements arranged in a two-dimensional grid pattern;

a lens disposed above a first light incident surface of each of the photoelectric conversion elements; and a plurality of columnar structures disposed on a surface parallel to the first light incident surface that is located between a second light incident surface of the lens and the first light incident surface of the photoelectric conversion element, in which the columnar structures are provided for the photoelectric conversion element located at a peripheral position in the two-dimensional grid pattern arrangement.

(21) A solid-state imaging device, including:

a semiconductor substrate including a photoelectric conversion element;

a lens disposed above a first light incident surface of the photoelectric conversion element; and a plurality of columnar structures disposed on a surface parallel to the first light incident surface that is located between a second light incident surface of the lens and the first light incident surface of the photoelectric conversion element, in which the columnar structures are arranged in two or more rows at positions corresponding to a peripheral part of the photoelectric conversion element.

(22) A solid-state imaging device, including:

a semiconductor substrate including an effective pixel region, in which a plurality of photoelectric conversion elements are arranged in a two-dimensional grid pattern, and a shielding region located around the effective pixel region; and

a plurality of columnar structures located in the shielding region and arranged with a pitch shorter than a pitch of the photoelectric conversion elements.

(23) A solid-state imaging device, including:

a semiconductor substrate including a plurality of photo-electric conversion elements arranged in a two-dimensional grid pattern; and a plurality of columnar structures arranged on a light incident surface side of the semiconductor substrate and in two or more rows between the photoelectric conversion elements.

(24) A solid-state imaging device, including:

a semiconductor substrate including a photoelectric conversion element;

a lens disposed above a light incident surface of the photoelectric conversion element; and a plurality of columnar structures disposed inside the lens and on a surface parallel to the light incident surface of the photoelectric conversion element.

REFERENCE SIGNS LIST 1 electronic device
10, 10-2 to 10-28 solid-state imaging device (CMOS image sensor)
11 pixel array
12 row driver
13 column processing circuit
14 column driver
15 system controller
18 signal processor
19 data storage
20 imaging lens
30 storage
40 processor
50, 50B, 50B11 to 50B14, 50B21 to 50B24, 50B31 to 50B34, 50G, 50G1, 50G2, 50G11 to 50G18, 50G21 to 50G28, 50G31 to 50G38, 50IR, 50R, 50R11 to 50R14, 50R21 to 50R24, 50R31 to 50R34 unit pixel
51 transfer transistor
52 reset transistor
53 amplifier transistor
54 selection transistor
60, 860 color filter array
61, 861, 1261, 1262 unit pattern
71 photoreceiver chip
72 circuitry chip
100 semiconductor substrate
101 N-type semiconductor region
102 P-type semiconductor region
103, 105 insulator film
104 anti-reflection film
106 shielding film
107, 107B, 107G, 107IR, 107R color filter
108, 1918, 2108, 2118, 2508B, 2508G, 2508R, 2608, 2708 on-chip lens
109, 2109 passivation film
110, 110B, 110G, 110R, 211, 212, 310, 410, 610, 810B, 810G, 810R, 910B, 910R, 1010G, 1010GB, 1010GR, 1210B, 1210R, 1310B, 1310R, 1410B, 1410G, 1410R, 1510, 1610B, 1610G, 1610R, 1910, 2010G, 2010R, 2110, 2510A, 2510B 2510G, 2510R, 2610 pillar
110A, 2508A material film
501 planarization film
700B, 700G, 700R, 800B, 800G, 800R, 900B, 900R, 1000G, 1400B, 1400G, 1400R, 1500, 1900, 2100 pillar array

58

1201, 1901, 2101 effective pixel region
1202 center region
1203 peripheral region
1304 intermediate region
1902, 2102 shielding region
1916, 2116 OPB solid film
2126 anti-flare film
L10, L11, L12 light
LD pixel driving line
LD51 transfer transistor driving line
LD52 reset transistor driving line
LD54 selection transistor driving line
PD photodiode
R1, R25 resist film
VSL vertical signal line

The invention claimed is:

1. A light detecting device, comprising:

a semiconductor substrate including a plurality of photo-electric conversion elements;

a plurality of columnar structures above a light incident surface of the semiconductor substrate; and a plurality of color filters above the light incident surface of the semiconductor substrate, wherein a height of the plurality of columnar structures is greater than a height of the plurality of color filters, the plurality of columnar structures includes titanium oxide, each columnar structure of the plurality of columnar structures comprises vertically stacked pillars in a cross-sectional view, the vertically stacked pillars comprise a first pillar on a second pillar, and at least a part of each columnar structure of the plurality of columnar structures is above the plurality of color filters.

2. The light detecting device according to claim 1, wherein a crystal state of each of the plurality of columnar structures is one of a single crystal, a polycrystal, or amorphous.

3. The light detecting device according to claim 1, wherein a refractive index of the plurality of columnar structures is 1.5 or more.

4. The light detecting device according to claim 1, wherein each of the plurality of columnar structures is on a surface parallel to a first light incident surface, and the plurality of columnar structures has one of a square arrangement, a hexagonal close-packed arrangement, or a random arrangement.

5. The light detecting device according to claim 1, wherein a diameter of each of the plurality of columnar structures ranges from 30 nanometers (nm) to 200 nm.

6. The light detecting device according to claim 1, wherein at least a part of the plurality of columnar structures is in a trench that extends from a surface of the semiconductor substrate towards a photoelectric conversion element of the plurality of photoelectric conversion elements in the semiconductor substrate, and the surface of the semiconductor substrate is on a side opposite to a lens.

7. The light detecting device according to claim 1, wherein each of the plurality of columnar structures corresponding to a first pixel of a plurality of pixels has a first diameter and each of the plurality of columnar structures corresponding to a second pixel of the plurality of pixels has a second diameter.

8. The light detecting device according to claim 1, wherein the plurality of columnar structures has spectroscopic characteristics to selectively transmit one of light having a wavelength component of red, light having a wavelength component of green, light having a wavelength component of blue, or infrared light.

\* \* \* \* \*